United States Patent
Glick et al.

(10) Patent No.: US 11,143,218 B1
(45) Date of Patent: Oct. 12, 2021

(54) COMPLEMENTARY FLUIDIC VALVES AND LOGIC GATES

(71) Applicant: Facebook Technologies, LLC, Menlo Park, CA (US)

(72) Inventors: Casey Glick, Redmond, WA (US); Andrew Arthur Stanley, Seattle, WA (US); Erik Roby, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 131 days.

(21) Appl. No.: 16/408,412

(22) Filed: May 9, 2019

(51) Int. Cl.
| | |
|---|---|
| *F15C 1/10* | (2006.01) |
| *F16K 99/00* | (2006.01) |
| *H03K 19/21* | (2006.01) |
| *F16K 31/122* | (2006.01) |

(Continued)

(52) U.S. Cl.
CPC ............ *F15C 1/10* (2013.01); *F16K 99/0055* (2013.01); *H03K 19/21* (2013.01); *F16K 1/126* (2013.01); *F16K 31/1223* (2013.01); *F16K 31/363* (2013.01)

(58) Field of Classification Search
CPC .. F16K 31/1223; F16K 31/363; F16K 31/383; F16K 11/07; F16K 99/0055; F16K 99/0059; F16K 2099/0069; F16K 2099/009; F16K 1/126; F15C 3/00; G05D 7/0193; G05D 7/00; H03K 19/21
USPC .... 137/837, 488, 538, 625.2, 625.6, 625.26, 137/625.49, 627.5, 596.14, 885, 489.5, 137/565.19, 596.18, 115.07, 602, 599.03
See application file for complete search history.

(56) References Cited

U.S. PATENT DOCUMENTS

| | | |
|---|---|---|
| 3,070,295 A | 12/1962 | Glattli |
| 3,122,313 A | 2/1964 | Glattli |

(Continued)

FOREIGN PATENT DOCUMENTS

| | | | |
|---|---|---|---|
| CH | 376688 A | 4/1964 | |
| DE | 102012013594 A1 * | 1/2014 | .............. F16K 11/07 |

(Continued)

OTHER PUBLICATIONS

Non-Final Office Action received for U.S. Appl. No. 16/451,964 dated Nov. 16, 2020, 17 pages.

(Continued)

*Primary Examiner* — Minh Q Le
(74) *Attorney, Agent, or Firm* — FisherBroyles, LLP

(57) ABSTRACT

A fluidic logic-gate device may include inlet ports, input ports, an output port, fluid channels each configured to route fluid from one of the inlet ports to the output port, and pistons that each include (1) a restricting gate transmission element configured to block, when the piston is in a first blocking position and unblock, when the piston is in a second blocking position, one of fluid channels, (2) a first controlling gate transmission element configured to interface with a first control pressure that, when applied to the first controlling gate transmission element, forces the piston towards the first blocking position, and (3) a second controlling gate transmission element configured to interface with a second control pressure that, when applied to the second controlling gate transmission element, forces the piston towards the second blocking position. Various other related devices and systems are also disclosed.

20 Claims, 34 Drawing Sheets

(51) Int. Cl.
*F16K 31/363* (2006.01)
*F16K 1/12* (2006.01)

(56) References Cited

U.S. PATENT DOCUMENTS

| | | | | |
|---|---|---|---|---|
| 3,319,654 | A | * | 5/1967 | Faldi .................. F01B 25/02 |
| | | | | 137/624.13 |
| 3,402,737 | A | * | 9/1968 | Goldstein .............. F15B 9/16 |
| | | | | 137/596.14 |
| 3,447,566 | A | | 6/1969 | Hayner et al. |
| 3,596,560 | A | | 8/1971 | Butterworth |
| 3,605,811 | A | | 9/1971 | Lovell |
| 3,805,840 | A | * | 4/1974 | Byers, Jr. ............. F16K 11/14 |
| | | | | 137/627.5 |
| 4,026,193 | A | | 5/1977 | Olmsted |
| 4,204,458 | A | | 5/1980 | Kononov et al. |
| 4,226,543 | A | | 10/1980 | Schluter |
| 4,630,645 | A | | 12/1986 | Spa |
| 5,492,149 | A | * | 2/1996 | Loschelder ........ F16K 11/0716 |
| | | | | 137/625.4 |
| 6,237,635 | B1 | | 5/2001 | Nambu |
| 9,611,943 | B2 | * | 4/2017 | Chen ..................... F16K 11/02 |
| 2005/0012058 | A1 | | 1/2005 | Medina |
| 2007/0075286 | A1 | | 4/2007 | Tanner |
| 2019/0145542 | A1 | | 5/2019 | Rehhoff et al. |
| 2019/0249789 | A1 | | 8/2019 | John et al. |
| 2021/0010495 | A1 | | 1/2021 | Stanley et al. |

FOREIGN PATENT DOCUMENTS

| | | |
|---|---|---|
| GB | 878697 A | 10/1961 |
| GB | 1 217 496 A | 12/1970 |
| WO | 2021/007220 A1 | 1/2021 |

OTHER PUBLICATIONS

International Search Report and Written Opinion received for PCT Application Serial No. PCT/US2020/041027 dated Oct. 26, 2020, 12 pages.
Telepneumatic, "Pneumatic Logic & Controls", URL: https://www.parker.com/literature/Literature%20Files/pneumatic/Literature/Telepneumatic/PCC-4.pdf, Jun. 30, 2017, 104 pages.
Stanley et al., "Complementary Fluidic Logic and Memory Devices", U.S. Appl. No. 16/507,788, filed Jul. 10, 2019, 187 pages.
Glick et al., "Complementary Fluidic Valves and Systems", U.S. Appl. No. 16/451,964, filed Jun. 25, 2019, 139 pages.
Stanley et al., "Complementary Fluidic Valves, Logic Gates, and Latches", U.S. Appl. No. 16/408,413, filed May 9, 2019, 146 pages.
Non-Final Office Action received for U.S. Appl. No. 16/507,788 dated Jan. 15, 2021, 42 pages.
Non-Final Office Action received for U.S. Appl. No. 16/408,413 dated Jan. 7, 2021, 40 pages.

* cited by examiner

| XOR TRUTH TABLE 900 | | |
|---|---|---|
| INPUTS | | OUTPUT |
| A | B | |
| 0 | 0 | 0 |
| 0 | 1 | 1 |
| 1 | 0 | 1 |
| 1 | 1 | 0 |

*FIG. 9*

XNOR TRUTH TABLE 1300

| INPUTS | | OUTPUT |
|---|---|---|
| A | B | |
| 0 | 0 | 1 |
| 0 | 1 | 0 |
| 1 | 0 | 0 |
| 1 | 1 | 1 |

*FIG. 13*

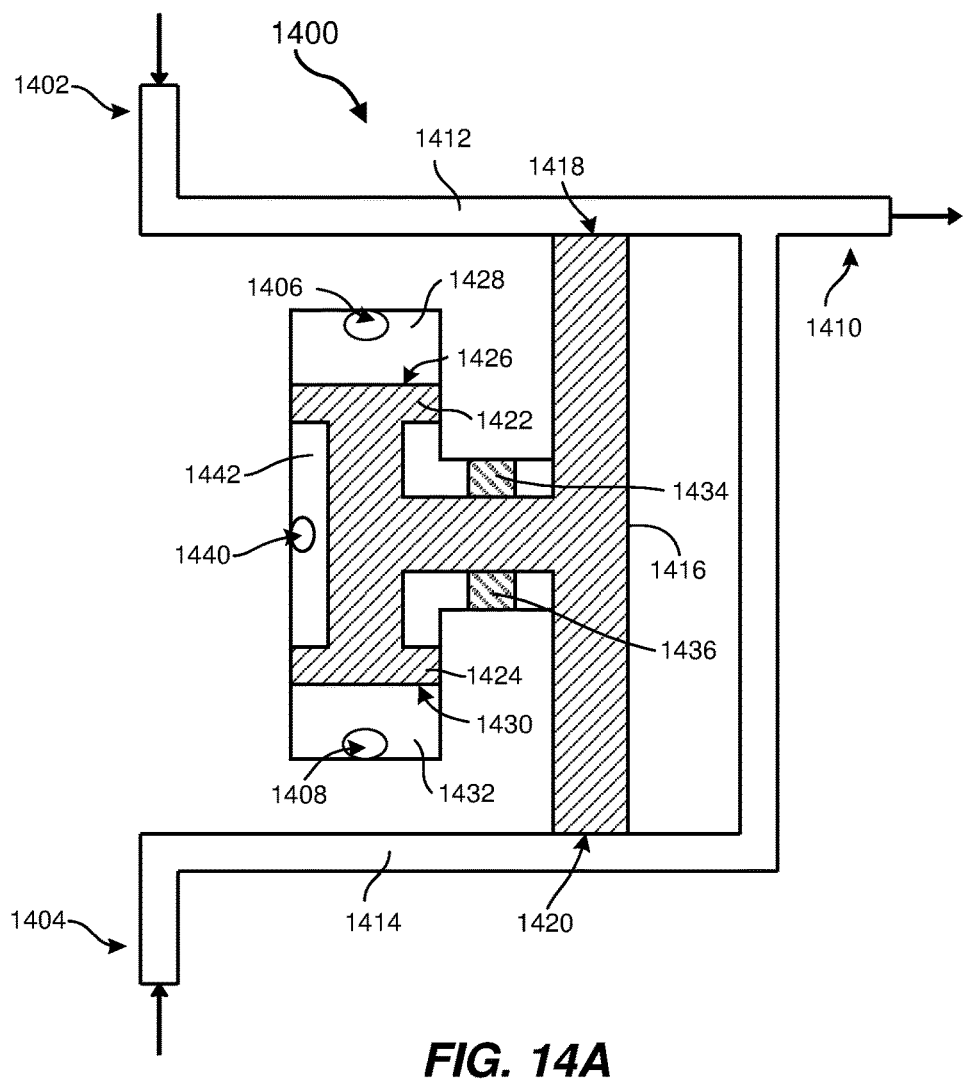
*FIG. 14A*
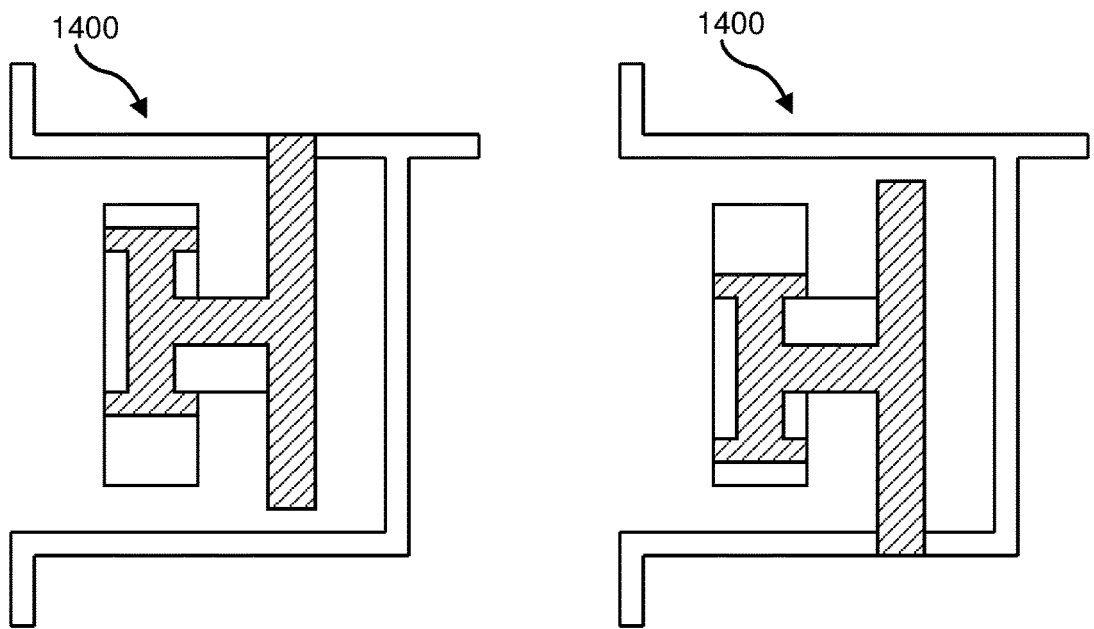
*FIG. 14B*          *FIG. 14C*

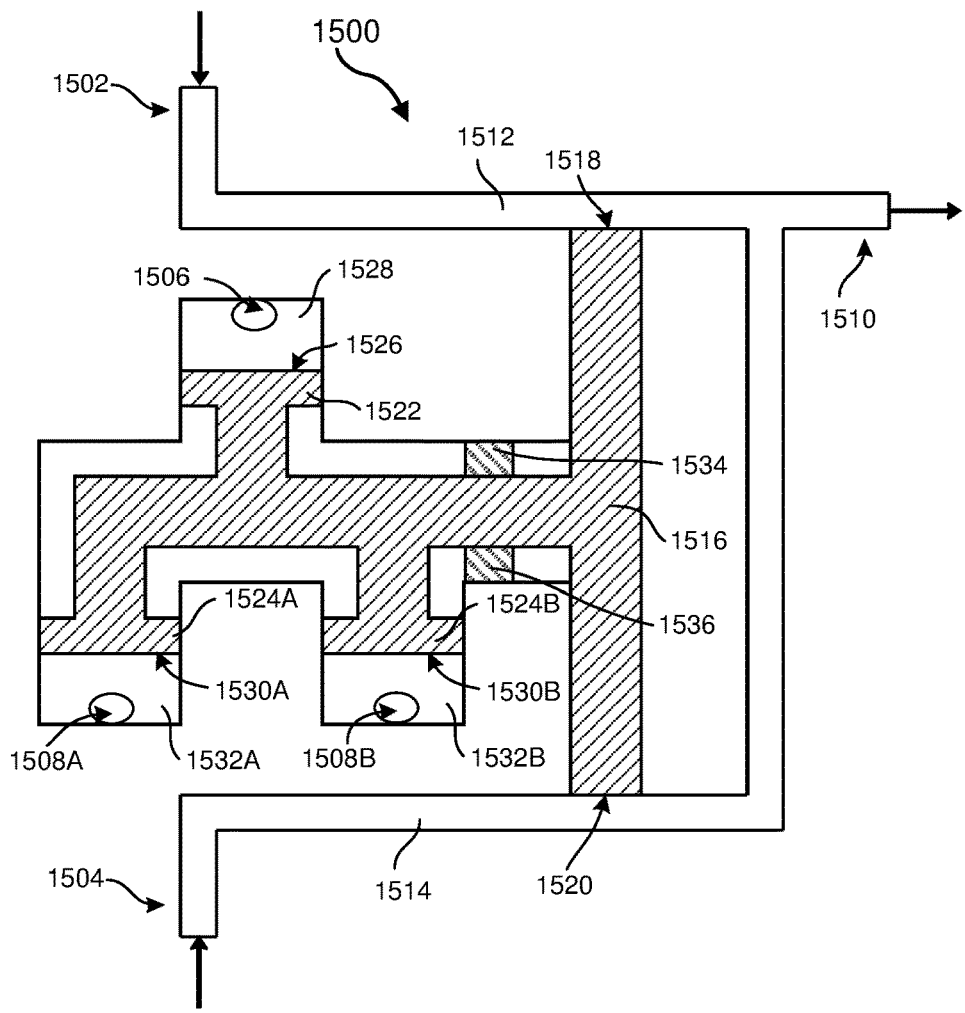
FIG. 15A
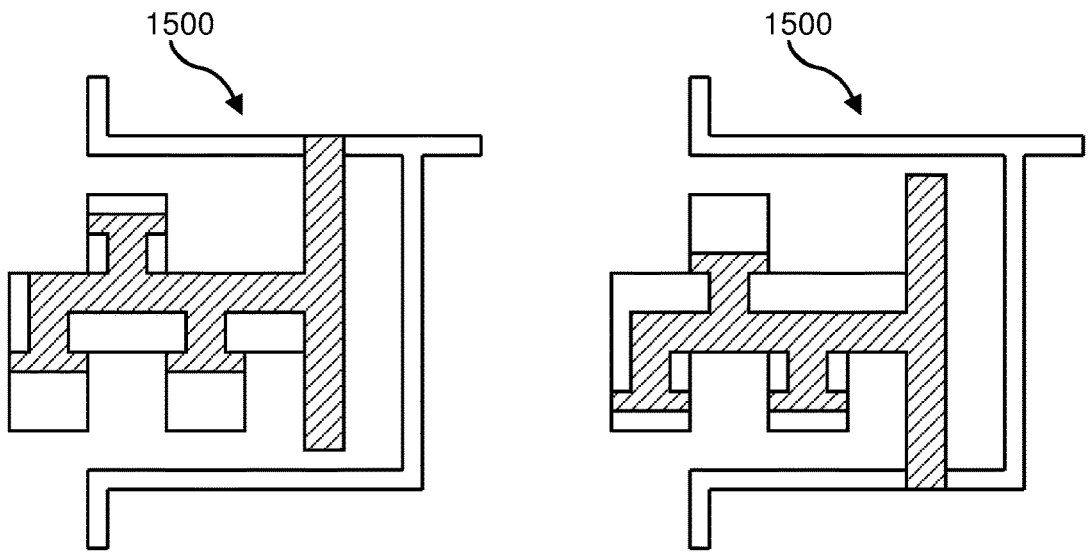
FIG. 15B          FIG. 15C

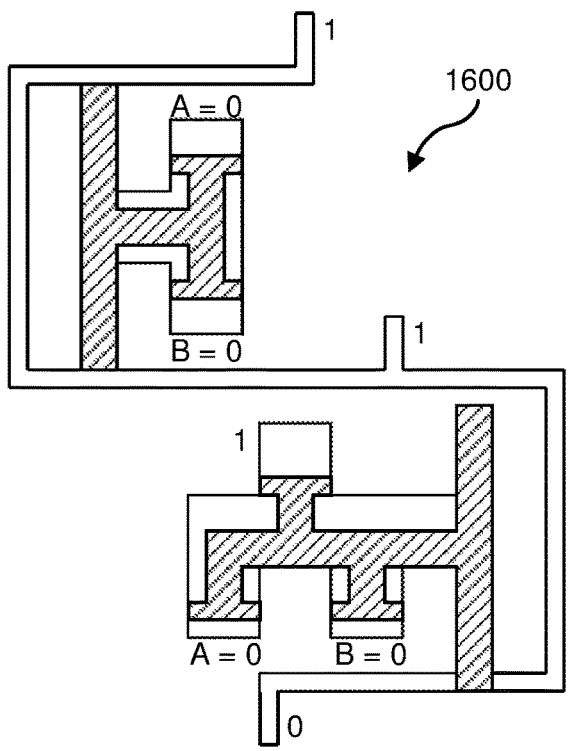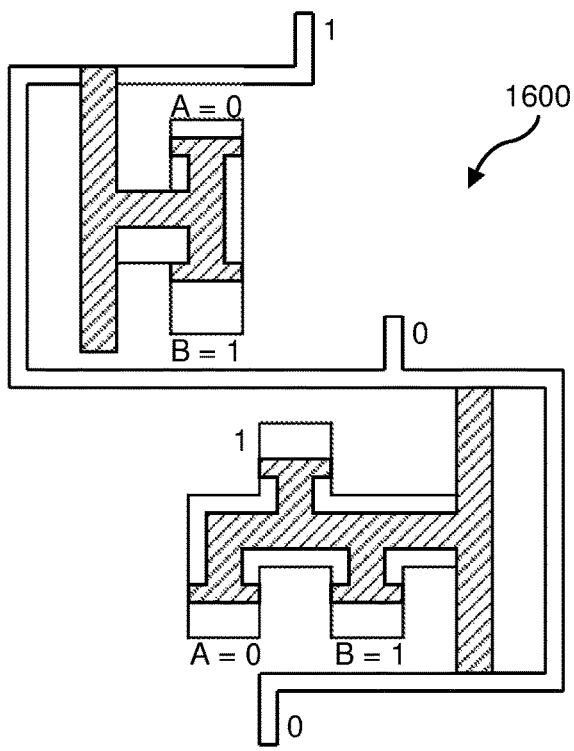
FIG. 20A  FIG. 20B
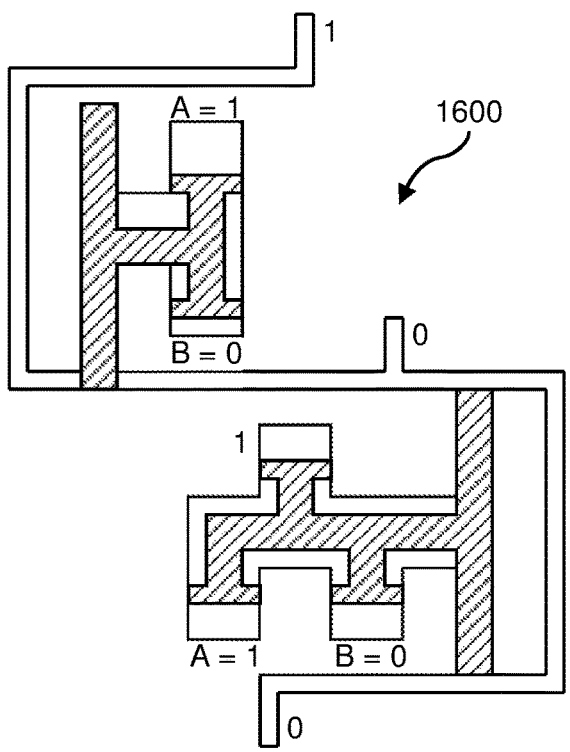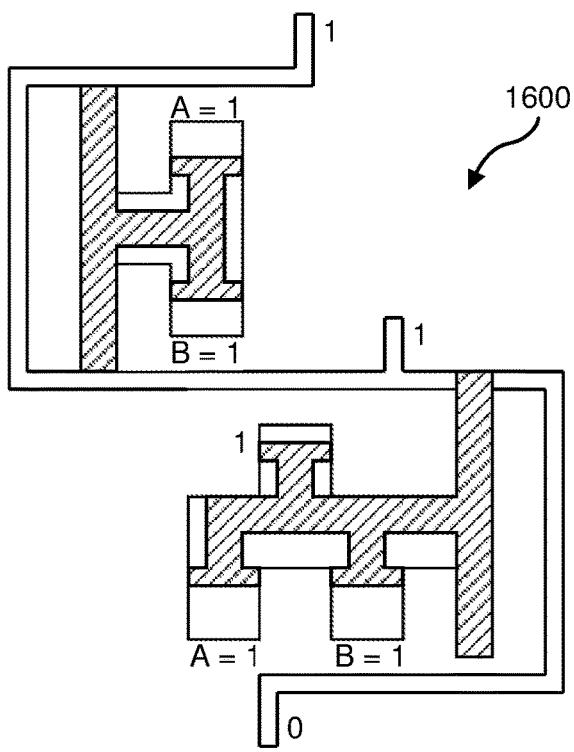
FIG. 20C  FIG. 20D

COMPLEMENTARY FLUIDIC VALVES AND LOGIC GATES

BACKGROUND

Fluidic systems are small mechanical systems that involve the flow of fluids. Fluidic systems can be used in many different fields, such as biomedical, chemical, genetic, biochemical, pharmaceutical, haptics, and other fields. Fluidic systems may be made up of various composable fluidic devices that may be coupled together to form a composite fluidic system. A fluidic valve is a basic component of fluidic systems and may be used for stopping, starting, or otherwise controlling flow of a fluid in a fluidic system. Conventional fluidic valves may be actuated via fluid pressure, with a piezoelectric material, or a spring-loaded mechanism, for example.

Fluidic devices are fluid handling devices that function analogous to electronic devices. Fluidic circuits and systems are often used to perform tasks and operations typically performed by conventional electronic circuits and systems. In some fields, fluidic systems may be replacing these electronic circuits and systems. Conventional fluidic valves may be used to perform tasks and operations similar to conventional electrical transistors such as performing control functions, performing logic operations (e.g., binary logical operations), and storing or transmitting information. Accordingly, the present disclosure recognizes a need and provides solutions for improved fluidic valves and systems and methods used for controlling fluid flows and pressures in fluidic systems.

SUMMARY

As will be described in greater detail below, the instant disclosure describes complementary fluidic valves and systems that may perform a wide range of functions and logical operations. In some examples, a fluidic logic-gate device may include inlet ports, input ports, output ports, fluid channels each configured to route fluid from one of the inlet ports to one of the output ports, and pistons that each include (1) a restricting gate transmission element configured to block, when the piston is in a first blocking position and unblock, when the piston is in a second blocking position, one of fluid channels, (2) a first controlling gate transmission element configured to interface with a first control pressure that, when applied to the first controlling gate transmission element, forces the piston towards the first blocking position, and (3) a second controlling gate transmission element configured to interface with a second control pressure that, when applied to the second controlling gate transmission element, forces the piston towards the second blocking position.

In some examples, the pistons may include a first piston, a second piston, a third piston, and a fourth piston. Additionally, the inlet ports may include a first one or more inlet ports and a second one or more inlet ports, the input ports may include a first input port and a second input port, and the fluid channels may include a first fluid channel configured to route fluid from the first one or more inlet ports to the output port, a second fluid channel configured to route fluid from the first one or more inlet ports to the output port, a third fluid channel configured to route fluid from the second one or more inlet ports to the output port, and a fourth fluid channel configured to route fluid from the second one or more inlet ports to the output port. In some examples, the first piston may include (1) a first restricting gate transmission element configured to block, when the first piston is in a first position, the first fluid channel, (2) a second restricting gate transmission element configured to block, when the first piston is in a second position, the third fluid channel, (3) a first controlling gate transmission element configured to interface with a first pressure that places the first piston in the first position, and (4) a second controlling gate transmission element configured to interface with a second pressure that places the first piston in the second position. The second piston may include (1) a third restricting gate transmission element configured to block, when the second piston is in a third position, the first fluid channel, (2) a fourth restricting gate transmission element configured to block, when the second piston is in a fourth position, the fourth fluid channel, (3) a third controlling gate transmission element configured to interface with a third pressure that places the second piston in the third position, and (4) a fourth controlling gate transmission element configured to interface with a fourth pressure that places the second piston in the fourth position.

In some examples, the third piston may include (1) a fifth restricting gate transmission element configured to block, when the third piston is in a fifth position, the second fluid channel, (2) a sixth restricting gate transmission element configured to block, when the third piston is in a sixth position, the fourth fluid channel, (3) a fifth controlling gate transmission element configured to interface with a fifth pressure that places the third piston in the fifth position, and (4) a sixth controlling gate transmission element configured to interface with a sixth pressure that places the third piston in the sixth position. In addition, the fourth piston may include (1) a seventh restricting gate transmission element configured to block, when the fourth piston is in a seventh position, the second fluid channel, (2) an eighth restricting gate transmission element configured to block, when the fourth piston is in an eighth position, the third fluid channel, (3) a seventh controlling gate transmission element configured to interface with a seventh pressure that places the fourth piston in the seventh position, and (4) an eighth controlling gate transmission element configured to interface with an eighth pressure that places the fourth piston in the eighth position.

In at least one example, a surface area of the second controlling gate transmission element may be less than a surface area of the first controlling gate transmission element, a surface area of the third controlling gate transmission element may be less than a surface area of the fourth controlling gate transmission element, a surface area of the fifth controlling gate transmission element may be less than a surface area of the sixth controlling gate transmission element, and a surface area of the eighth controlling gate transmission element may be less than a surface area of the seventh controlling gate transmission element. In some examples, the fluidic logic-gate device may perform an XOR operation on a first input source connected to the first input port and a second input source connected to the second input port. In such examples, the first one or more inlet ports may be one or more source ports configured to connect to a high-pressure source, the second one or more inlet ports may be one or more drain ports configured to connect to a low-pressure source, the first input source may apply the first pressure to the first controlling gate transmission element and the sixth pressure to the sixth controlling gate transmission element, and the second input source may apply the forth pressure to the fourth controlling gate transmission element and the seventh pressure to the seventh controlling gate transmission element. The high-pressure source may also apply the second pressure to the second controlling gate transmission element, the third pressure to the third controlling gate transmission element, the fifth pressure to the fifth controlling gate transmission element, and the eighth pressure to the eighth controlling gate transmission element.

In some examples, the fluidic logic-gate device may perform an XNOR operation on a first input source connected to the first input port and a second input source connected to the second input port. In these examples, the first one or more inlet ports may be one or more drain ports configured to connect to a low-pressure source, the second one or more inlet ports may be one or more source ports configured to connect to a high-pressure source, the first input source may apply the first pressure to the first controlling gate transmission element and the sixth pressure to the sixth controlling gate transmission element, and the second input source may apply the forth pressure to the fourth controlling gate transmission element and the seventh pressure to the seventh controlling gate transmission element. The high-pressure source may also apply the second pressure to the second controlling gate transmission element, the third pressure to the third controlling gate transmission element, the fifth pressure to the fifth controlling gate transmission element, and the eighth pressure to the eighth controlling gate transmission element.

In some examples, the inlet ports may include a first inlet port and a second inlet port, the input ports may include a first input port and a second input port, and the fluid channels may include a first fluid channel configured to route fluid from the first inlet port to the output port and a second fluid channel configured to route fluid from the second inlet port to the output port. Additionally, the pistons may include a first piston and a second piston. In some examples, the first piston may include (1) a first restricting gate transmission element configured to block, when the first piston is in a first blocking position, the first fluid channel and unblock, when the first piston is in a second blocking position or a first unblocking position, the first fluid channel, (2) a second restricting gate transmission element configured to block, when the first piston is in the second blocking position, the first fluid channel and unblock, when the first piston is in the first blocking position or the first unblocking position, the first fluid channel, (3) a first controlling gate transmission element configured to interface with a first pressure from the first input port that, when applied to the first controlling gate transmission element, forces the first piston towards the first blocking position, and (4) a second controlling gate transmission element configured to interface with a second pressure from the second input port that, when applied to the second controlling gate transmission element, forces the first piston towards the second blocking position. Similarly, the second piston may include (1) a third restricting gate transmission element configured to block, when the second piston is in a third blocking position, the second fluid channel and unblock, when the second piston is in a fourth blocking position or a second unblocking position, the second fluid channel, (2) a fourth restricting gate transmission element configured to block, when the second piston is in the fourth blocking position, the second fluid channel and unblock, when the second piston is in the third blocking position or the second unblocking position, the second fluid channel, (3) a third controlling gate transmission element configured to interface with a preload pressure, wherein the preload pressure, when applied to the third controlling gate transmission element, forces the second piston towards the third blocking position, (4) a fourth controlling gate transmission element configured to interface with the first pressure from the first input port, wherein the first pressure, when applied to the fourth controlling gate transmission element, forces the second piston towards the fourth blocking position, and (5) a fifth controlling gate transmission element configured to interface with the second pressure from the second input port, wherein the second pressure, when applied to the fifth controlling gate transmission element, forces the second piston towards the fourth blocking position.

In some examples, the fluidic logic-gate device may perform an XOR operation on a first input source connected to the first input port and a second input source connected to the second input port. In other examples, the fluidic logic-gate device may perform an XNOR operation on a first input source connected to the first input port and a second input source connected to the second input port.

In some examples, the plurality of input ports may include a first input port and a second input port, and the fluidic logic-gate device may perform an XOR operation on a first input source connected to the first input port and a second input source connected to the second input port. In these examples, the plurality of inlet ports may include a first inlet port configured to connect to a low-pressure source and a second inlet port configured to connect to a high-pressure source, and the plurality of fluid channels may include a first fluid channel configured to route fluid from the first inlet port to the output port, a second fluid channel configured to route fluid from the second inlet port to the output port, and a third fluid channel configured to route fluid from the second input port to the output port. Furthermore, the plurality of pistons may include a first piston and a second piston. The first piston may include (1) a first restricting gate transmission element configured to (a) block, when the first piston is in a first blocking position, the first fluid channel and (b) unblock, when the first piston is in a second blocking position, the first fluid channel, (2) a second restricting gate transmission element configured to (a) block, when the first piston is in the second blocking position, the second fluid channel and (b) unblock, when the first piston is in the first blocking position, the second fluid channel, (3) a first controlling gate transmission element configured to interface with a first preload pressure, wherein the first preload pressure forces, when applied to the first controlling gate transmission element, the first piston towards the first blocking position, and (4) a second controlling gate transmission element configured to interface with a pressure from the second input port, wherein the pressure from the second input port, when applied to the second controlling gate transmission element, forces the first piston towards the second blocking position. The second piston may include (1) a third restricting gate transmission element configured to (a) block, when the second piston is in a third blocking position, the first and second fluid channels and (b) unblock, when the second piston is in a fourth blocking position, the first and second fluid channels, (2) a fourth restricting gate transmission element configured to (a) block, when the second piston is in the fourth blocking position, the third fluid channel and (b) unblock, when the second piston is in the third blocking position, the third fluid channel, (3) a third controlling gate transmission element configured to interface with a second preload pressure, wherein the second preload pressure, when applied to the third controlling gate transmission element, forces the second piston towards the third blocking position, and (4) a fourth controlling gate transmission element configured to interface with a pressure from the first input port, wherein the pressure from the first input port, when applied to the fourth controlling gate transmission element, forces the second piston towards the fourth blocking position.

In other examples, the plurality of input ports may include a first input port and a second input port, and the fluidic logic-gate device may perform an XNOR operation on a first input source connected to the first input port and a second input source connected to the second input port. In these examples, the plurality of inlet ports may include a first inlet port configured to connect to a low-pressure source and a second inlet port configured to connect to a high-pressure source, and the plurality of fluid channels may include a first fluid channel configured to route fluid from the first inlet port to the output port, a second fluid channel configured to route fluid from the second inlet port to the output port, and a third fluid channel configured to route fluid from the second input port to the output port. Additionally, the plurality of pistons may include a first piston and a second piston. The first piston may include (1) a first restricting gate transmission element configured to (a) block, when the first piston is in a first blocking position, the first fluid channel and (b) unblock, when the first piston is in a second blocking position, the first fluid channel, (2) a second restricting gate transmission element configured to (a) block, when the first piston is in the second blocking position, the second fluid channel and (b) unblock, when the first piston is in the first blocking position, the second fluid channel, (3) a first controlling gate transmission element configured to interface with a first preload pressure, wherein the first preload pressure forces, when applied to the first controlling gate transmission element, the first piston towards the first blocking position, and (4) a second controlling gate transmission element configured to interface with a pressure from the second input port, wherein the pressure from the second input port, when applied to the second controlling gate transmission element, forces the first piston towards the second blocking position. The second piston may include (1) a third restricting gate transmission element configured to (a) block, when the second piston is in a third blocking position, the third fluid channel and (b) unblock, when the second piston is in a fourth blocking position, the third fluid channel, (2) a fourth restricting gate transmission element configured to (a) block, when the second piston is in the fourth blocking position, the first and second fluid channels and (b) unblock, when the second piston is in the third blocking position, the first and second fluid channels, (3) a third controlling gate transmission element configured to interface with a second preload pressure, wherein the second preload pressure, when applied to the third controlling gate transmission element, forces the second piston towards the third blocking position, and (4) a fourth controlling gate transmission element configured to interface with a pressure from the first input port, wherein the pressure from the first input port, when applied to the fourth controlling gate transmission element, forces the second piston towards the fourth blocking position.

A corresponding fluidic logic-gate system may include inlet ports, a first input port and a second input port, an output port, a high-pressure source, a low-pressure source, a first input source connected to the first input port, a second input source connected to the second input port, fluid channels each configured to route fluid from one of the inlet ports to the output port, and two or more pistons. In some examples, the two or more pistons may each include (1) opposing restricting gate transmission elements each configured to block a different one of the fluid channels, (2) a first controlling gate transmission element configured to interface with a first control pressure that, when applied to the first controlling gate transmission element, forces the piston towards a first position, and (3) a second controlling gate transmission element configured to interface with a second control pressure that, when applied to the second controlling gate transmission element, forces the piston towards a second position.

In some examples, the fluidic logic-gate system may perform an XOR operation and/or an XNOR operation using two or fewer pistons. In some examples, the two or more pistons, the high-pressure source, and the low-pressure source may be configured to perform an XNOR operation and/or a XOR operation.

A corresponding fluidic valve may include an inlet port, a control port, an additional control port, an outlet port, a fluid channel configured to convey fluid from the inlet port to the outlet port, and a piston. In some examples, the piston may include (1) a restricting gate transmission element configured to block, when the piston is in a blocking position, the fluid channel and unblock, when the piston is in an additional blocking position or an unblocking position, the fluid channel, (2) a controlling gate transmission element configured to interface with a control pressure from the control port that, when applied to the controlling gate transmission element, forces the piston towards the blocking position, and (3) an additional controlling gate transmission element configured to interface with an additional control pressure from the additional control port that, when applied to the additional controlling gate transmission element, forces the piston towards the additional blocking position.

In some examples, the fluidic valve may further include an additional inlet port and an additional fluid channel configured to convey fluid from the additional inlet port to the outlet port, and the piston may further include an additional restricting gate transmission element configured to block, when the piston is in the additional blocking position, the additional fluid channel and unblock, when the piston is in the blocking position or the unblocking position, the additional fluid channel. In some examples, the fluidic valve may further include a third control port, and the piston further may include a third controlling gate transmission element configured to interface with a third control pressure from the third control port that, when applied to the third controlling gate transmission element, forces the piston towards the additional blocking position. In at least one example, the fluidic valve may further include at least one positioning element configured to provide a restoring force to the piston that forces the piston towards the unblocking position.

Features from any of the embodiments described herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 9 is a diagram of a truth table of the exemplary fluidic logic gate of FIG. 6, according to some embodiments.

FIG. 13 is a diagram of a truth table of the exemplary fluidic logic gate of FIG. 10, according to some embodiments.

FIGS. 14A-14C are schematic diagrams of an exemplary complementary fluidic valve, according to at least one embodiment of the present disclosure.

FIGS. 15A-15C are schematic diagrams of another exemplary complementary fluidic valve, according to at least one embodiment of the present disclosure.

FIGS. 20A-20D are state diagrams of the exemplary fluidic logic gate of FIG. 19, according to at least one embodiment of the present disclosure.

Figure 1:
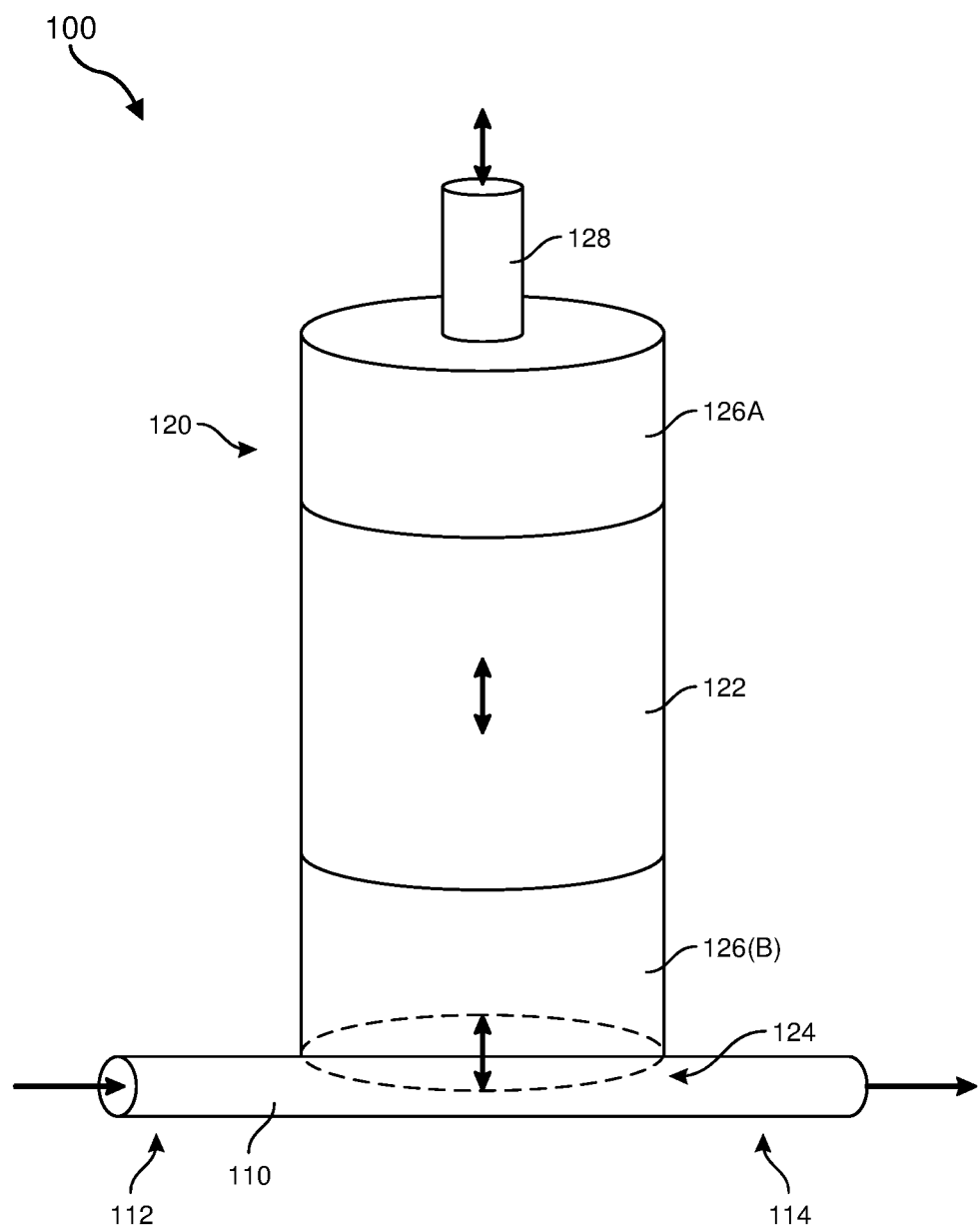
FIG. 1 is an illustration of an exemplary fluidic control system that may be used in connection with embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to complementary fluidic valves and systems that may be used in various fluidic circuits or systems to perform a wide range of functions and logical operations. For example, as will be explained in greater detail below, embodiments of the instant disclosure may be configured as logic gates capable of performing XOR or XNOR Boolean operations. Embodiments of the instant disclosure may use two or four rigid or mostly rigid pistons. Each of the pistons may include at least two upper gate transmission elements (an upper restricting gate transmission element and an upper controlling gate transmission element) and at least two lower gate transmission elements (a lower restricting gate transmission element and a lower controlling gate transmission element). The upper restricting gate transmission element may be configured to restrict fluid flow in an upper fluid channel when the rigid piston is in an upward position and allow fluid flow in the upper fluid channel when the rigid piston is in a downward position. Similarly, the lower restricting gate transmission element may be configured to restrict fluid flow in a lower fluid channel when the rigid piston is in the downward position and allow fluid flow in the lower fluid channel when the rigid piston is in the upward position. Embodiments of the instant disclosure may provide various features and advantages over traditional fluidic valves and systems. For example, embodiments of the instant disclosure may provide various logic functions with low-leakage control of outlet pressures and with fewer overall mechanical components.

The present disclosure may include fluidic systems that involve the control (e.g., stopping, starting, restricting, increasing, etc.) of fluid flows through fluid channels. The control of fluid flow may be accomplished with a fluidic valve. FIG. 1 shows a schematic diagram of a fluidic valve 100 for controlling flow through a fluid channel 110, according to at least one embodiment of the present disclosure. Fluid from a fluid source (e.g., a pressurized fluid source, a fluid pump, etc.) may flow through the fluid channel 110 from an inlet port 112 to an outlet port 114, which may be operably coupled to, for example, a fluid-driven mechanism, another fluid channel, or a fluid reservoir.

Fluidic valve 100 may include a gate 120 for controlling the fluid flow through fluid channel 110. Gate 120 may include a gate transmission element 122, which may be a movable component that is configured to transmit an input force, pressure, or displacement to a restricting region 124 to restrict or stop flow through the fluid channel 110. Conversely, in some examples, application of a force, pressure, or displacement to gate transmission element 122 may result in opening restricting region 124 to allow or increase flow through the fluid channel 110. The force, pressure, or displacement applied to gate transmission element 122 may be referred to as a gate force, gate pressure, or gate displacement. Gate transmission element 122 may be a flexible element (e.g., an elastomeric membrane, a diaphragm, etc.), a rigid element (e.g., a movable piston, a lever, etc.), or a combination thereof (e.g., a movable piston or a lever coupled to an elastomeric membrane or diaphragm).

As illustrated in FIG. 1, gate 120 of fluidic valve 100 may include one or more gate terminals, such as an input gate terminal 126A and an output gate terminal 126B (collectively referred to herein as "gate terminals 126") on opposing sides of gate transmission element 122. Gate terminals 126 may be elements for applying a force (e.g., pressure) to gate transmission element 122. By way of example, gate terminals 126 may each be or include a fluid chamber adjacent to gate transmission element 122. Alternatively or additionally, one or more of gate terminals 126 may include a solid component, such as a spring, a lever, screw, or piston, that is configured to apply a force to gate transmission element 122.

In some examples, a gate port 128 may be in fluid communication with input gate terminal 126A for applying a positive or negative fluid pressure within the input gate terminal 126A. A control fluid source (e.g., a pressurized fluid source, a fluid pump, etc.) may be in fluid communication with gate port 128 to selectively pressurize and/or depressurize input gate terminal 126A. In additional embodiments, a force or pressure may be applied at the input gate terminal 126A in other ways, such as with a piezoelectric element or an electromechanical actuator, etc.

In the embodiment illustrated in FIG. 1, pressurization of the input gate terminal 126A may cause the gate transmission element 122 to be displaced toward restricting region 124, resulting in a corresponding pressurization of output gate terminal 126B. Pressurization of output gate terminal 126B may, in turn, cause restricting region 124 to partially or fully restrict to reduce or stop fluid flow through the fluid channel 110. Depressurization of input gate terminal 126A may cause gate transmission element 122 to be displaced away from restricting region 124, resulting in a corresponding depressurization of the output gate terminal 126B. Depressurization of output gate terminal 126B may, in turn, cause restricting region 124 to partially or fully expand to allow or increase fluid flow through fluid channel 110. Thus, gate 120 of fluidic valve 100 may be used to control fluid flow from inlet port 112 to outlet port 114 of fluid channel 110.

Figure 2:
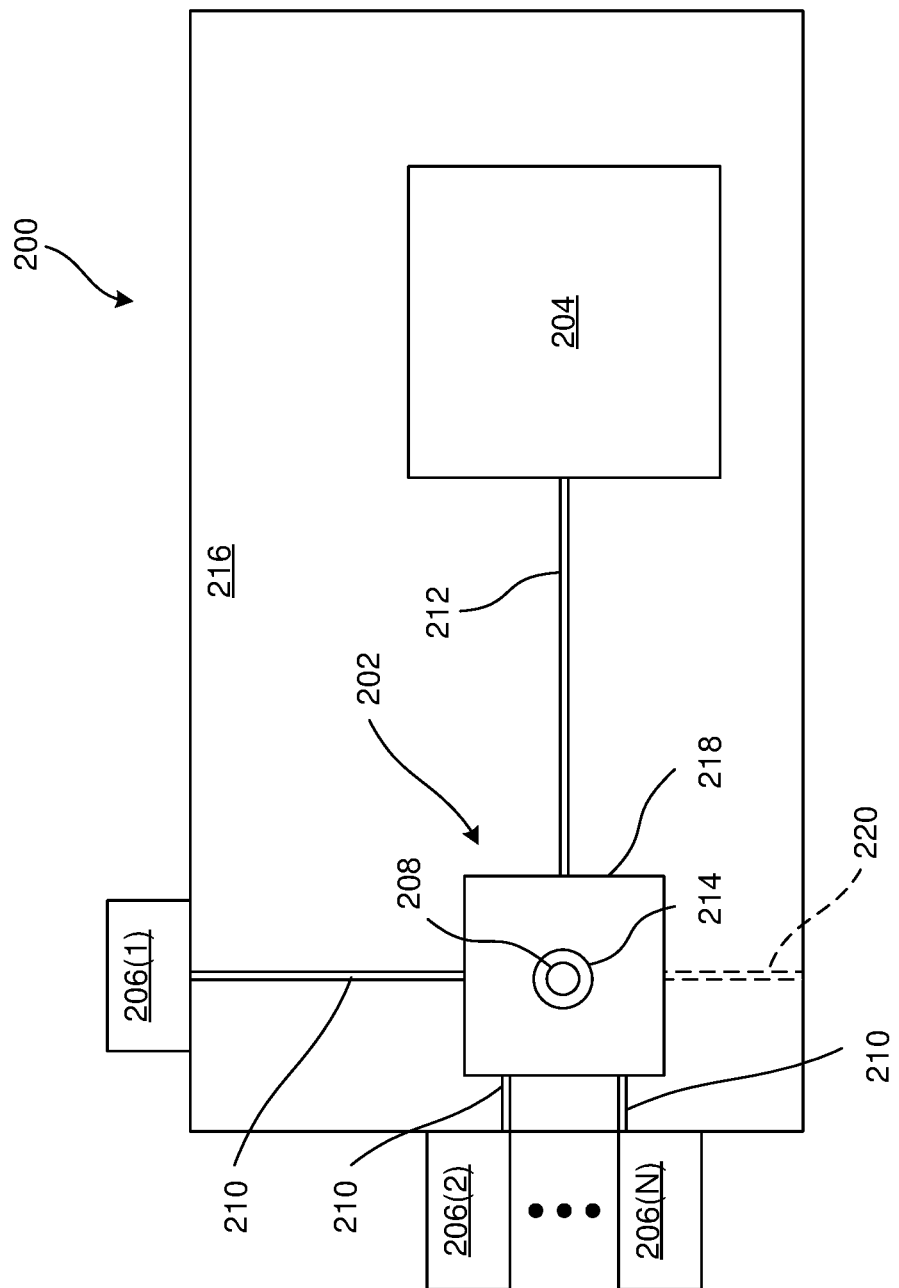
FIG. 2 is a block diagram of an exemplary fluidic system, according to at least one embodiment of the present disclosure.

FIG. 2 is a schematic view of a fluidic system 200 that includes a fluidic valve 202, a fluid-driven mechanism 204 configured to be activated, controlled, or fed by fluidic valve 202, and one or more fluid sources 206(1)-(N) for controlling and/or being controlled by fluidic valve 202. In some examples, the flow of a fluid from one of fluid sources 206(1)-(N) may be controlled by a piston 208 of fluidic valve 202. A port 210 (e.g., an inlet port or a control port) may provide fluid communication between each of fluid sources 206(1)-(N) and fluidic valve 202. An outlet port 212 may provide fluid communication between fluidic valve 202 and fluid-driven mechanism 204. As shown, fluidic valve 202 may include piston 208 that may be movable within a cavity 214 to open and close fluidic valve 202 for controlling flow of the fluid.

Fluidic system 200 may include a substrate 216, within which or on which at least some of the components of fluidic system 200 are disposed. For example, at least a portion of substrate 216 may define one or more of a valve body 218 of fluidic valve 202, fluid sources 206, ports 210, outlet port 212, cavity 214, and/or fluid-driven mechanism 204. In some embodiments, substrate 216 may include a stack of materials, such as a drive body portion, at least one flexible material (e.g., an elastic material), a gate body portion, and/or a fluid channel body portion. In some examples, the term "flexible" may mean capable of flexing and/or returning to an original state without permanent damage. A flexible material may also be stretchable. In some examples, substrate 216 may include at least one of silicon, silicon dioxide, a glass, and/or a rigid polymer (e.g., a polycarbonate material, an acrylic material, a urethane material, a fluorinated elastomer material, a polysiloxane material, etc.).

Fluid-driven mechanism 204 may be any fluid load or mechanism that may be driven or controlled by flowing and/or pressurization of fluid. By way of example and not limitation, fluid-driven mechanism 204 may include at least one of a microelectromechanical device (e.g., a so-called "MEMS" device), an expansible cavity, a piston system, and/or a haptic feedback device. Each of fluid sources 206 may be any source or mechanism that can provide a pressurized fluid (e.g., gas (e.g., air, nitrogen, etc.) or liquid (e.g., water, oil, etc.)) to fluidic valve 202. By way of example and not limitation, fluid sources 206 may each be or include a pressurized reservoir, a fan, a pump, or a piston system, etc. In some examples, one or more of fluid sources 206 may be capable of providing a pressurized fluid at a high pressure and/or a low pressure. In general, a "high pressure" may be any pressure of a fluid that falls within a high or maximum pressure range, and a "low pressure" may be any pressure of a fluid that falls within a low or minimum pressure range. In some situations, a pressure falling within a high pressure range may be considered to represent one state (e.g., "1") of a bit or binary digit, and a pressure falling within a low pressure range may be considered to represent the other state (e.g., "0") of a bit or binary digit. In some examples, one or more fluid sources 206 may be a source of fluid pressures or a drain of fluid pressures.

Optionally, in some embodiments, an interstitial-pressure outlet 220 (shown in FIG. 2 in dashed lines) may be in fluid communication with fluidic valve 202. Interstitial-pressure outlet 220 may enable one or more chambers within fluidic valve 202 to expand and/or contract as piston 208 is moved back and forth to open or close fluidic valve 202, as will be explained in further detail below.

In some embodiments, fluidic system 200 may be incorporated in a pneumatic control system and/or may be used for industrial pneumatic controls. Additionally or alternatively, fluidic system 200 may be incorporated in a haptic feedback device, such as for use with an artificial reality (e.g., virtual reality, augmented reality, mixed reality, or hybrid reality) system. Fluidic system 200 may be positioned on or in a wearable device (e.g., a headband, a head-mounted display, a glove, an armband, etc.) that is configured to provide haptic feedback (e.g., vibration, pressure, etc.) to a user. For example, fluid-driven mechanism 204 of fluidic system 200 may be an expansible cavity configured to fill and expand with the fluid upon opening of fluidic valve 202. The expanding cavity may press against the user, and the user may sense the pressure from the expanding cavity, such as resulting from an action taken by the user in the artificial reality. By way of example, fluidic system 200 may be incorporated in a finger of a glove, and the user may use his or her finger in space to make a selection in an artificial reality environment. The expansible cavity of fluidic system 200 may be filled and expanded with the fluid to provide a pressure point on the user's finger to confirm the selection made by the user. The pressure point may provide a sensation that the user is touching a real object. Alternatively, fluid-driven mechanism 204 may include an eccentric rotating element that may be rotated by the flowing fluid when fluidic valve 202 is in an open state, resulting in a vibrating sensation as haptic feedback for the user.

Figure 3A:
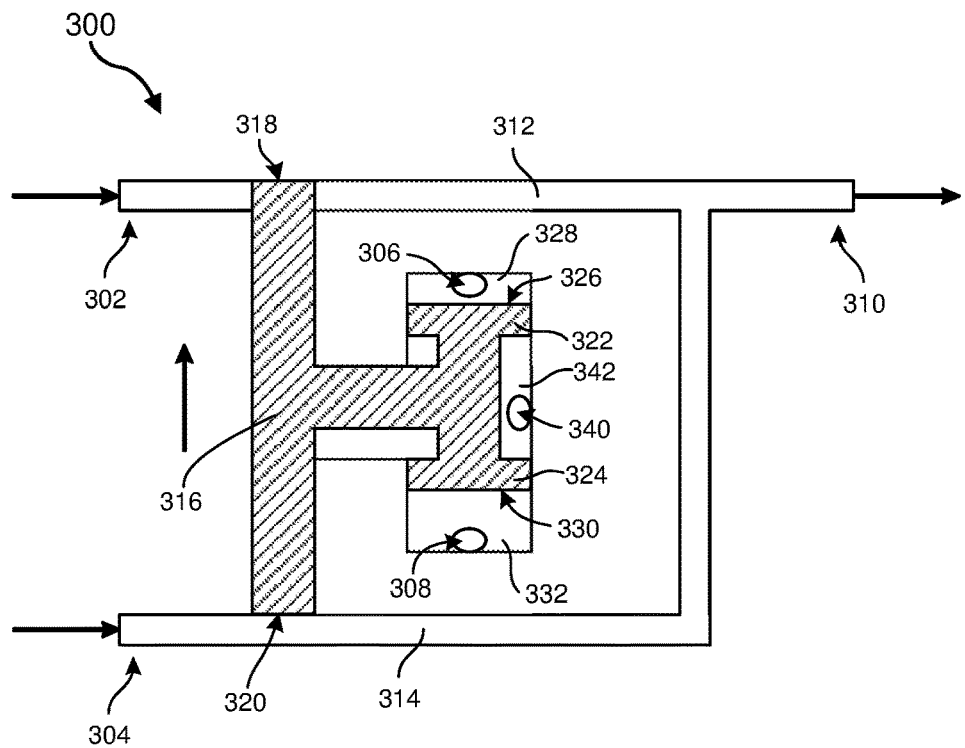
FIGS. 3A and 3B are schematic diagrams of an exemplary complementary fluidic valve, according to at least one embodiment of the present disclosure.
Figure 3B:
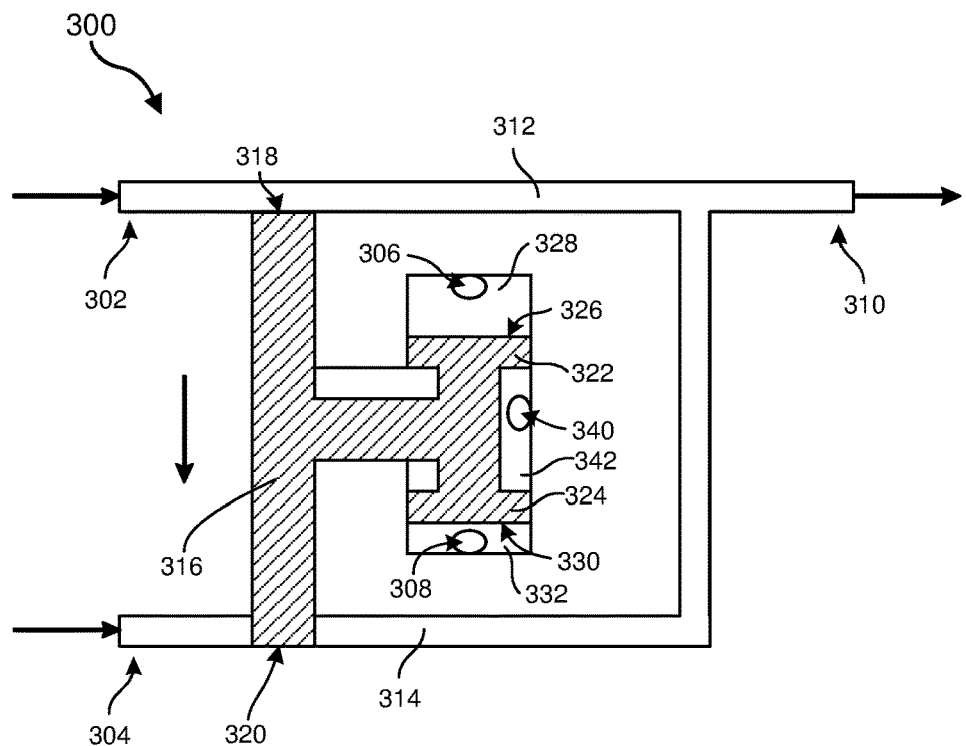

Fluidic valve 202 in FIG. 2 may have various forms and configurations and may be incorporated into various fluidic systems. FIGS. 3A and 3B are schematic diagrams illustrating two positions of an exemplary fluidic valve 300. As shown, fluidic valve 300 may include an inlet port 302, an inlet port 304, a control port 306, a control port 308, an outlet port 310, a fluid channel 312 configured to convey fluid from inlet port 302 to outlet port 310, a fluid channel 314 configured to convey fluid from inlet port 304 to outlet port 310, and a piston 316. In some examples, piston 316 may be formed from a single piece of a substantially rigid material (e.g., a rigid plastic, metal, or glass). Alternatively, piston 316 may be formed from a substantially rigid composite part. Piston 316 may include a restricting gate transmission element 318 configured to block or restrict fluid channel 312 when piston 316 is in the position illustrated in FIG. 3A and unblock fluid channel 312 when piston 316 is in the position illustrated in FIG. 3B. Piston 316 may also include a restricting gate transmission element 320 configured to block or restrict fluid channel 314 when piston 316 is in the position illustrated in FIG. 3B and unblock fluid channel 314 when piston 316 is in the position illustrated in FIG. 3A. Because of the complementary positions of restricting gate transmission elements 318 and 320, fluid flow may not tend to flow directly from inlet port 302 to inlet port 304. Piston 316 may include complementary or opposing piston heads 322 and 324. Piston head 322 may have a controlling gate transmission element 326 configured to interface with a control pressure 328 from control port 306 that, when applied to controlling gate transmission element 326 forces piston 316 towards the position illustrated in FIG. 3B. Similarly, piston head 324 may have a controlling gate transmission element 330 configured to interface with a control pressure 332 from control port 308 that, when applied to controlling gate transmission element 330 forces piston 316 towards the position illustrated in FIG. 3A. In at least one example, control port 306 or control port 308 may be permanently closed or absent and control pressure 328 or control pressure 332 may be generated by a mechanical preload force.

In some embodiments, fluidic valve 300 may include an interstitial-pressure outlet/inlet 340 that may direct fluid pressures from/to interstitial region 342. In some examples, interstitial-pressure outlet/inlet 340 may connect interstitial region 342 to an outside atmosphere or an additional control fluid source. In some embodiments, the additional control fluid source may modulate fluid pressures within interstitial region 342 to actuate piston 316 or modulate the level of control pressures 328 and/or 332 at which piston 316 actuates.

As shown in FIGS. 3A and 3B, controlling gate transmission elements 326 and 330 may have substantially the same surface areas. As such, movement of piston 316 from the position illustrated in FIG. 3A to the position illustrated in FIG. 3B may require a greater fluid pressure at control port 306 than at control port 308. Similarly, movement of piston 316 from the position illustrated in FIG. 3B to the position illustrated in FIG. 3A may require a greater fluid pressure at control port 308 than at control port 306. In some examples, restricting gate transmission elements 318 and 320 may have substantially the same surface areas, which may be substantially less than the surface areas of controlling gate transmission elements 326 and 330. As such, movement of piston 316 may be mostly caused by the fluid pressures applied to control port 306 and 308 rather than any fluid pressures applied to inlet ports 302 and 304.

Figure 4A:
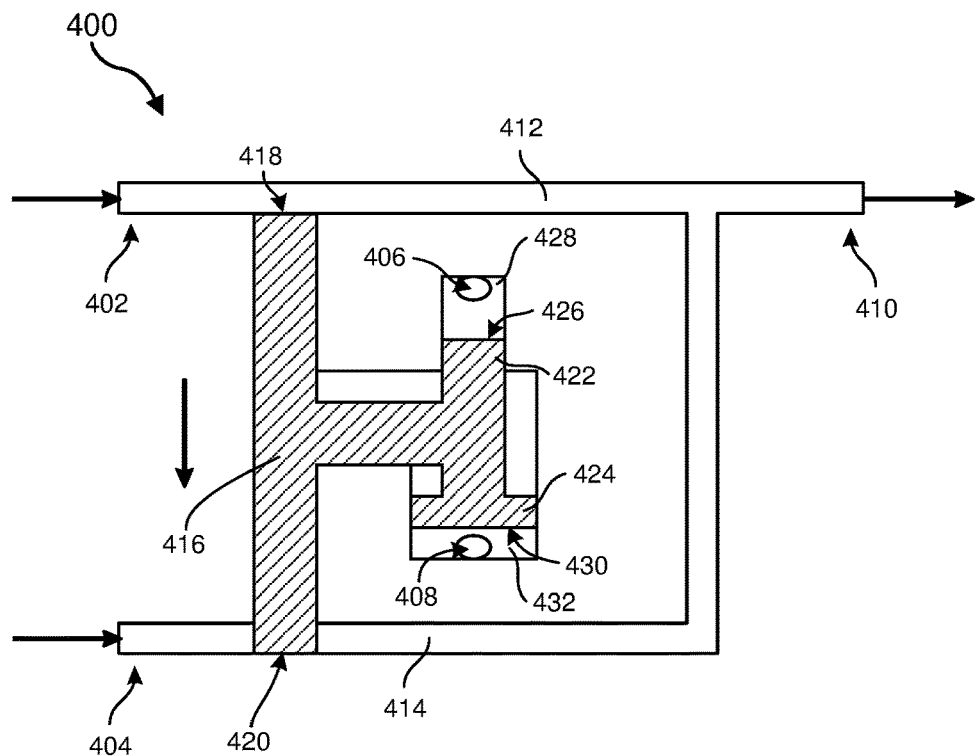
FIGS. 4A and 4B are schematic diagrams of another exemplary complementary fluidic valve, according to at least one embodiment of the present disclosure.
Figure 4B:
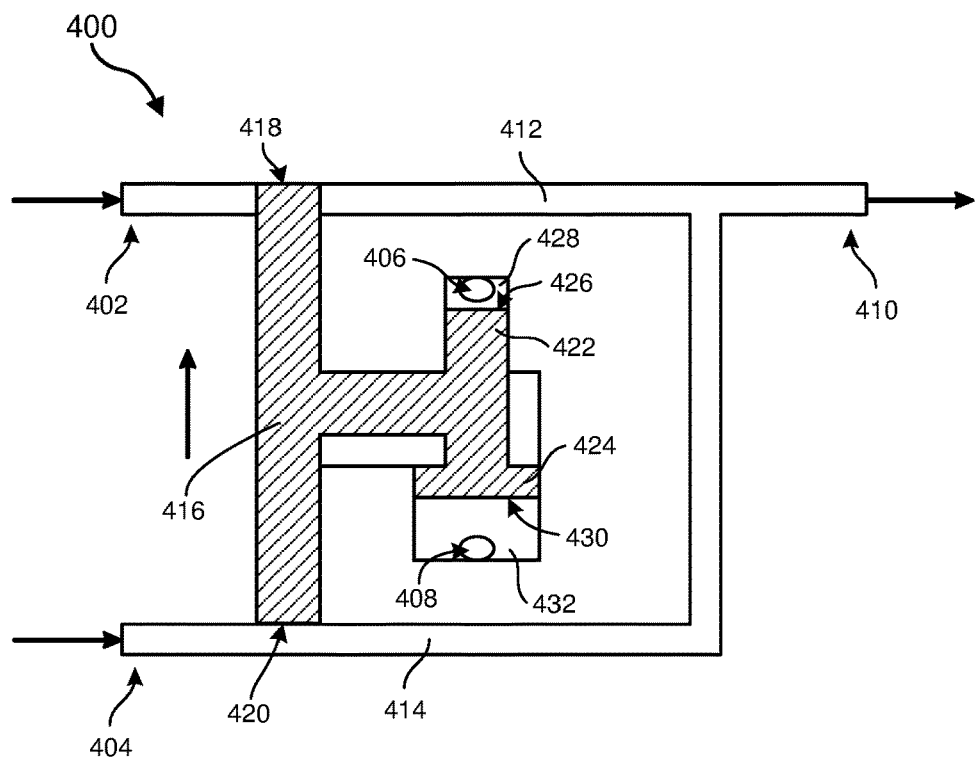

In some examples, the fluidic valves described herein may have controlling gate transmission elements with different surface areas. FIGS. 4A and 4B are schematic diagrams illustrating two positions of an exemplary fluidic valve 400 having controlling gate transmission elements with different surface areas. As shown, fluidic valve 400 may include an inlet port 402, an inlet port 404, a control port 406, a control port 408, an outlet port 410, a fluid channel 412 configured to convey fluid from inlet port 402 to outlet port 410, a fluid channel 414 configured to convey fluid from inlet port 404 to outlet port 410, and a piston 416. Although not shown, in some embodiments, control port 406 may be absent, and another source of force (e.g., a spring or another element providing a mechanical preload force) may be used to apply a force to controlling gate transmission element 426. In some examples, piston 416 may be formed from a single piece of a substantially rigid material (e.g., a rigid plastic, metal, or glass). Alternatively, piston 416 may be formed from a substantially rigid composite part. Piston 416 may include a restricting gate transmission element 418 configured to block or restrict fluid channel 412 when piston 416 is in the position illustrated in FIG. 4B and unblock fluid channel 412 when piston 416 is in the position illustrated in FIG. 4A. Piston 416 may also include a restricting gate transmission element 420 configured to block or restrict fluid channel 414 when piston 416 is in the position illustrated in FIG. 4A and unblock fluid channel 414 when piston 416 is in the position illustrated in FIG. 4B. Piston 416 may include complementary or opposing piston heads 422 and 424. Piston head 422 may have a controlling gate transmission element 426 configured to interface with a control pressure 428 from control port 406 that, when applied to controlling gate transmission element 426 forces piston 416 towards the position illustrated in FIG. 4A. Similarly, piston head 424 may have a controlling gate transmission element 430 configured to interface with a control pressure 432 from control port 408 that, when applied to controlling gate transmission element 430 forces piston 416 towards the position illustrated in FIG. 4B.

As shown in FIGS. 4A and 4B, controlling gate transmission elements 426 and 430 may have different surface areas (e.g., the surface area of controlling gate transmission element 430 may be substantially larger than the surface area of controlling gate transmission element 426). As such, movement of piston 416 from the position illustrated in FIG. 4A to the position illustrated in FIG. 4B may require a fluid pressure at control port 408 that is less than that at control port 406. In some examples, the relative surface areas of controlling gate transmission elements 426 and 430 may be configured such that specific pressure differences between the pressures applied to control ports 406 and 408 trigger movement of piston 416 between the positions illustrated in FIGS. 4A and 4B. For example, the surface area of controlling gate transmission element 430 may be configured to have a surface area that is two times greater than the surface area of controlling gate transmission element 426 in order to trigger movement of piston 416 from the position illustrated in FIG. 4A to the position illustrated in FIG. 4B when the pressure applied to control port 408 is greater than one half the pressure applied to control port 406. In some examples, restricting gate transmission elements 418 and 420 may have substantially the same surface areas, which may be substantially less than the surface areas of controlling gate transmission elements 426 and 430. As such, movements of piston 416 may be mostly caused by the fluid pressures applied to control port 406 and 408 rather than any fluid pressures applied to inlet ports 402 and 404.

Figure 5:
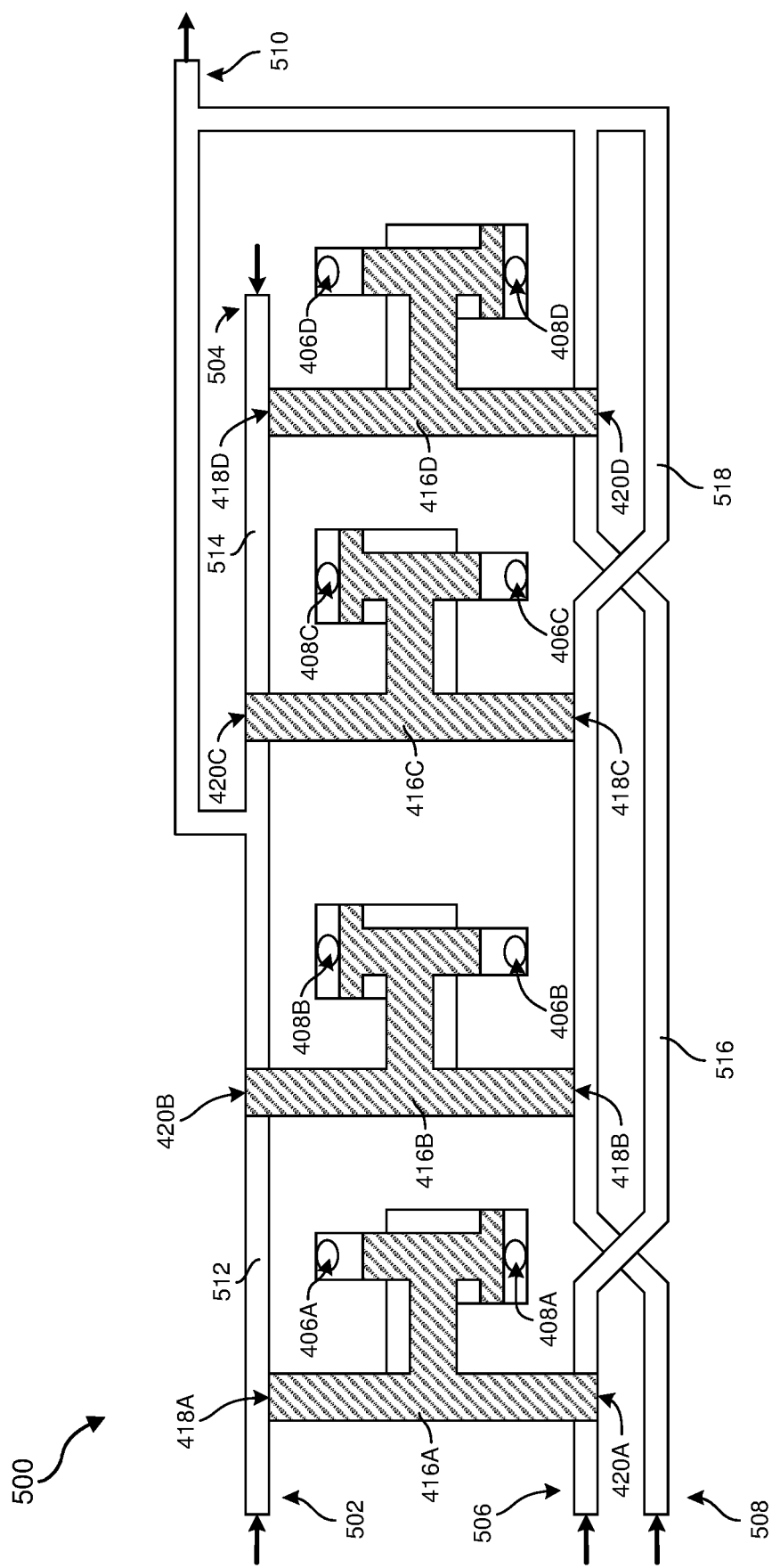
FIG. 5 is a schematic diagram of an exemplary fluidic logic gate, according to at least one embodiment of the present disclosure.

Some or all of the components of fluidic valve 300 in FIGS. 3A and 3B or fluidic valve 400 in FIGS. 4A and 4B may be configured or modified to perform various functions and/or operations as part of a larger composite fluidic system. For example, as shown in FIG. 5, a fluidic logic gate 500 may be configured using pistons 416A, 416B, 416C, and 416D. As shown, fluidic logic gate 500 may include an inlet port 502, an inlet port 504, an inlet port 506, an inlet port 508, and an outlet port 510. Fluidic logic gate 500 may also include a fluid channel 512 configured to convey fluid from inlet port 502 to outlet port 510, a fluid channel 514 configured to convey fluid from inlet port 504 to outlet port 510, a fluid channel 516 configured to convey fluid from inlet port 506 to outlet port 510, a fluid channel 518 configured to convey fluid from inlet port 508 to outlet port 510, and pistons 416A-D.

As shown, piston 416A may include a restricting gate transmission element 418A configured to unblock fluid channel 512 when piston 416A is in the position illustrated in FIG. 5 and block or restrict fluid channel 512 when a sufficient pressure is applied to control port 408A to overcome any pressure applied to control port 406A and force piston 416A upward. Similarly, piston 416B may include a restricting gate transmission element 418B configured to unblock fluid channel 518 when piston 416B is in the position illustrated in FIG. 5 and block or restrict fluid channel 518 when enough pressure is applied to control port 408B to overcome any pressure applied to control port 406B and force piston 416B downward. Likewise, piston 416C may include a restricting gate transmission element 418C configured to unblock fluid channel 518 when piston 416C is in the position illustrated in FIG. 5 and block or restrict fluid channel 518 when enough pressure is applied to control port 408C to overcome any pressure applied to control port 406C and force piston 416C downward. Piston 416D may include a restricting gate transmission element 418D configured to unblock fluid channel 514 when piston 416D is in the position illustrated in FIG. 5 and block or restrict fluid channel 514 when a sufficient pressure is applied to control port 408D to overcome any pressure applied to control port 406D and force piston 416D upward.

Piston 416A may also include a restricting gate transmission element 420A configured to block or restrict fluid channel 516 when piston 416A is in the position illustrated in FIG. 5 and unblock fluid channel 516 when enough pressure is applied to control port 408A to overcome any pressure applied to control port 406A and force piston 416A upward. Similarly, piston 416B may include a restricting gate transmission element 420B configured to block or restrict fluid channel 512 when piston 416B is in the position illustrated in FIG. 5 and unblock fluid channel 512 when enough pressure is applied to control port 408B to overcome any pressure applied to control port 406B and force piston 416B downward. Piston 416C may include a restricting gate transmission element 420C configured to block or restrict fluid channel 514 when piston 416C is in the position illustrated in FIG. 5 and unblock fluid channel 514 when enough pressure is applied to control port 408C to overcome any pressure applied to control port 406C and force piston 416C downward. Piston 416D may also include a restricting gate transmission element 420D configured to block or restrict fluid channel 516 when piston 416D is in the position illustrated in FIG. 5 and unblock fluid channel 516 when enough pressure is applied to control port 408D to overcome any pressure applied to control port 406D and force piston 416D upward.

In some examples, pistons 416A-D may be part of a single fluidic device within which fluid channels 512, 514, 516, and/or 518 are integrated. Alternatively, pistons 416A-D may be part of separate fluidic devices, and portions of fluid channels 512, 514, 516, and/or 518 may be external fluid connections between the separate fluidic devices.

Figure 6:
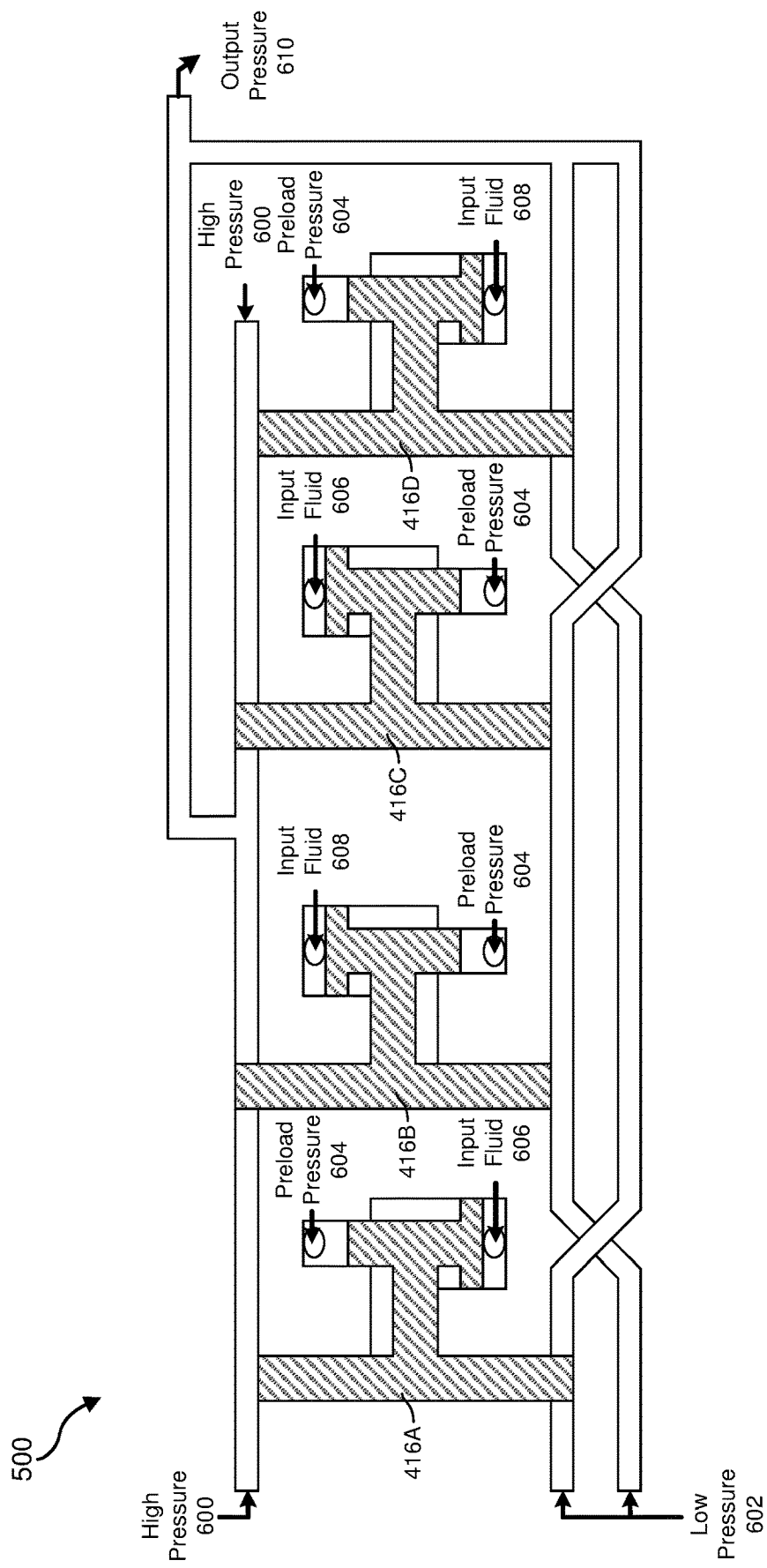
FIG. 6 is a schematic diagram of the exemplary fluidic logic gate of FIG. 5 configured to perform a XOR operation, according to at least one embodiment of the present disclosure.
Figure 7A:
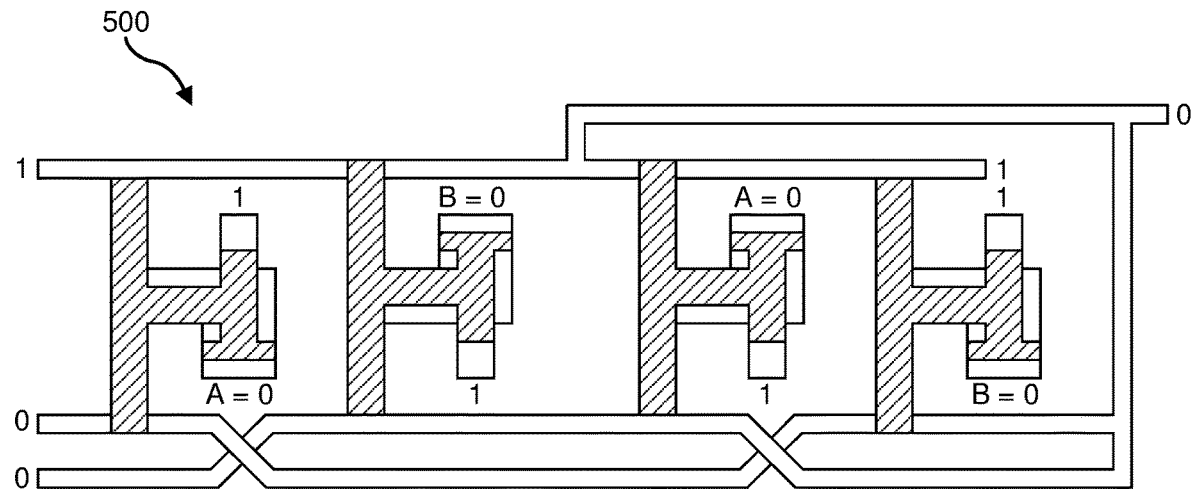
FIGS. 7A-8B are state diagrams of the exemplary fluidic logic gate of FIG. 6, according to at least one embodiment of the present disclosure.
Figure 7B:
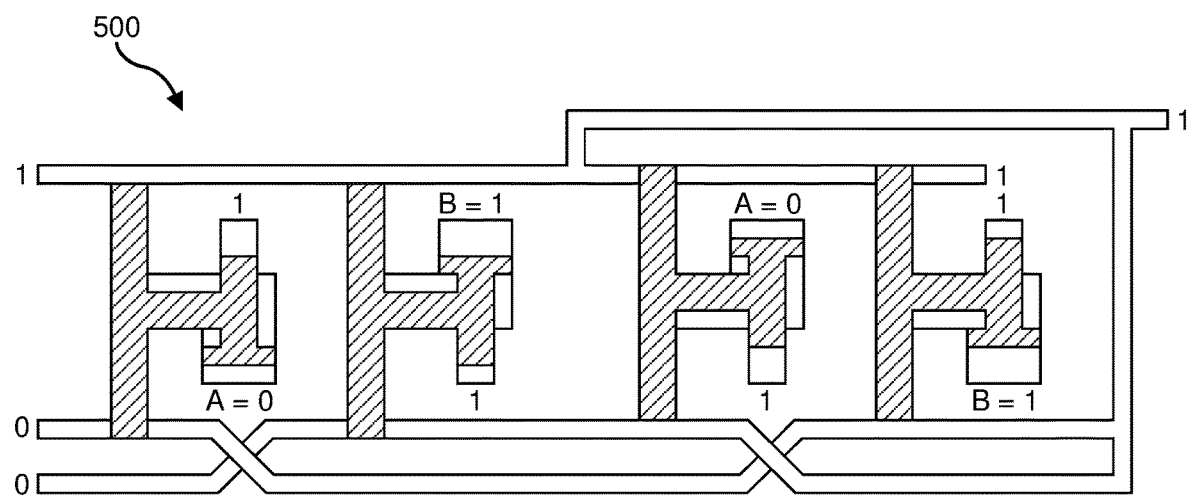
Figure 8A:
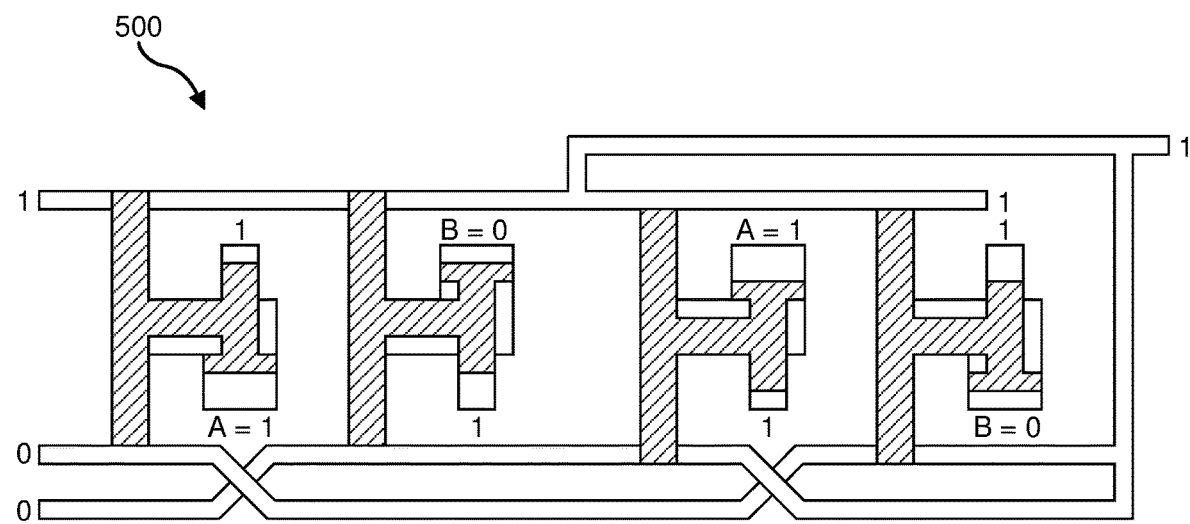
Figure 8B:
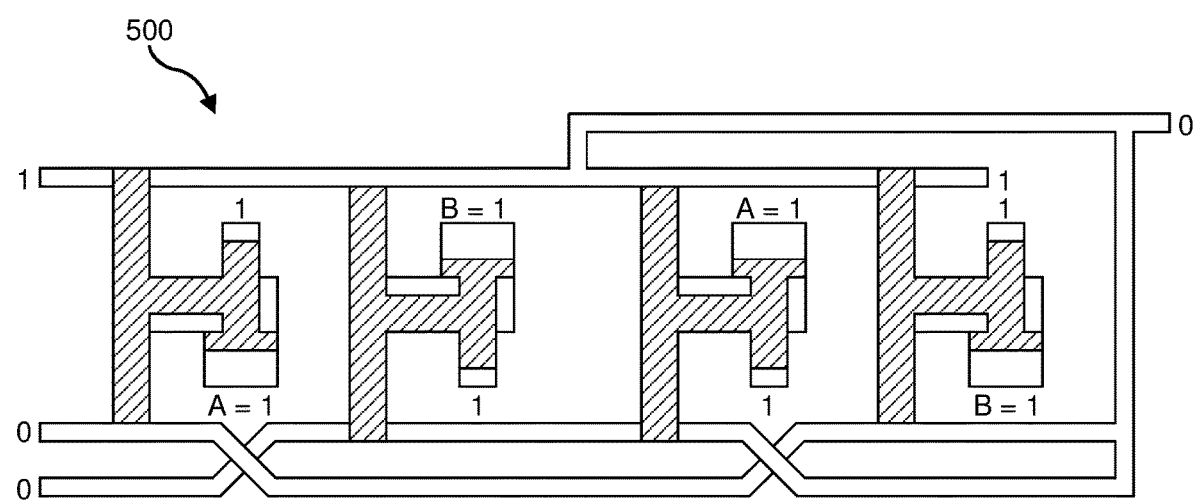

As shown in FIG. 6, in some examples, fluidic logic gate 500 may be configured to perform a XOR operation by applying (1) a high pressure 600 to inlet ports 502 and 504, (2) a low pressure 602 to inlet ports 506 and 508, (3) a preload pressure 604 (e.g., high pressure 600) to control ports 406A-D, (4) an input fluid 606 (e.g., an input A) to control ports 408A and 408C, and (5) an input fluid 608 (e.g., an input B) to control ports 408B and 408D. In this example, a result of the XOR operation may be seen as output pressure 610 at outlet port 510. As shown in FIG. 7A, if input fluid 606 and input fluid 608 both have a low pressure (e.g., a pressure lower than that of preload pressure 604), then pistons 416A-D may be in the positions shown and low pressure 602 may be routed from inlet port 508 through fluid channel 518 to outlet port 510. As shown in FIG. 7B, if input fluid 606 has a low pressure (e.g., a pressure lower than that of preload pressure 604) and input fluid 608 has a sufficiently high pressure (e.g., a pressure equal to preload pressure 604), then pistons 416A-D may be in the positions shown and high pressure 600 may be routed from inlet port 502 through fluid channel 512 to outlet port 510. As shown in FIG. 8A, if input fluid 606 has a sufficiently high pressure (e.g., a pressure equal to preload pressure 604) and input fluid 608 has a low pressure (e.g., a pressure lower than that of preload pressure 604), then pistons 416A-D may be in the positions shown and high pressure 600 may be routed from inlet port 504 through fluid channel 514 to outlet port 510. As shown in FIG. 8B, if input fluid 606 and input fluid 608 both have a sufficiently high pressure (e.g., a pressure equal to preload pressure 604), then pistons 416A-D may be in the positions shown and low pressure 602 may be routed from inlet port 506 through fluid channel 516 to outlet port 510. FIG. 9 illustrates an XOR truth table 900 that may represent the functionality of fluidic logic gate 500 when configured as shown in FIG. 6.

Figure 10:
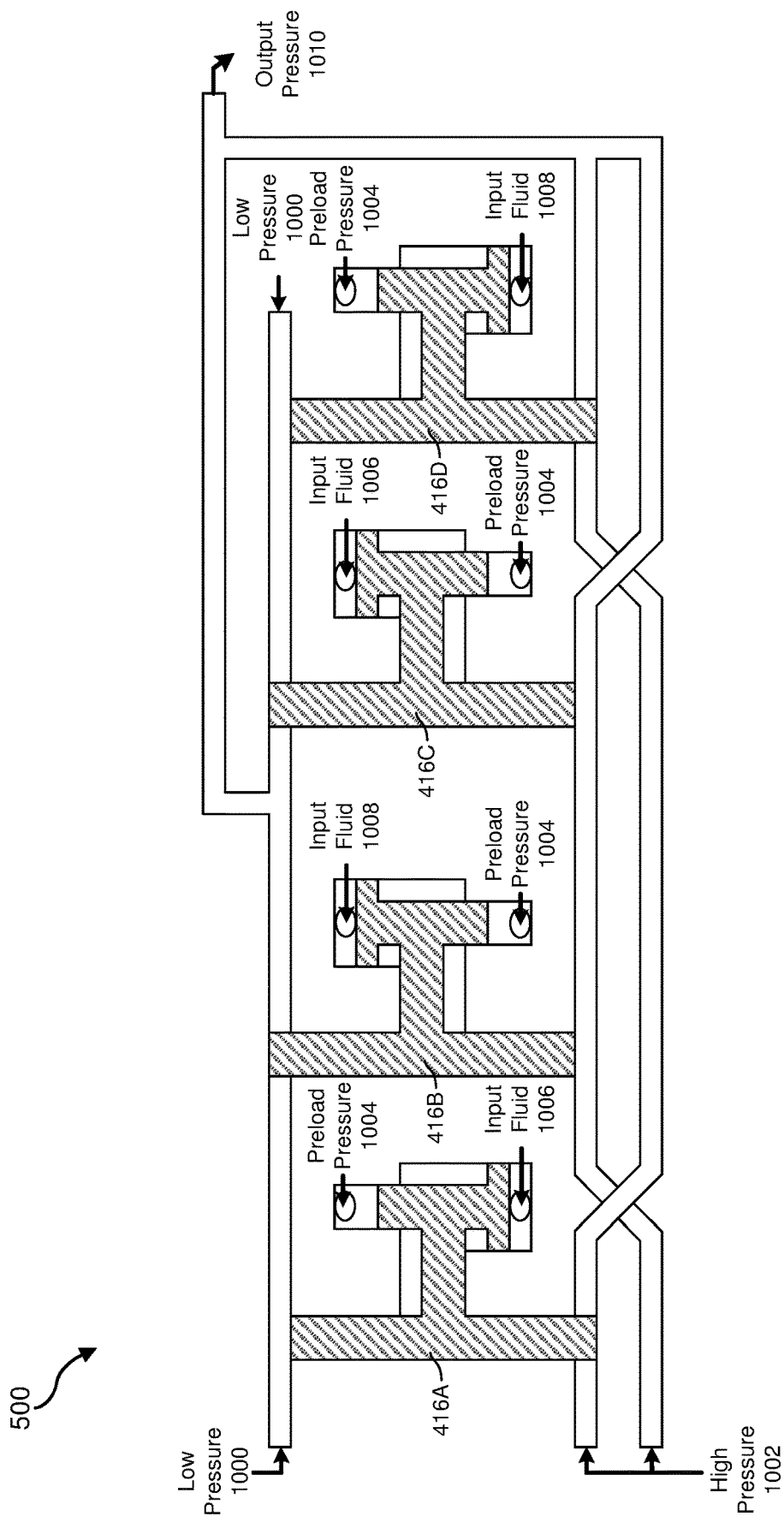
FIG. 10 is a schematic diagram of the exemplary fluidic logic gate of FIG. 5 configured to perform an XNOR operation, according to at least one embodiment of the present disclosure.
Figure 11A:
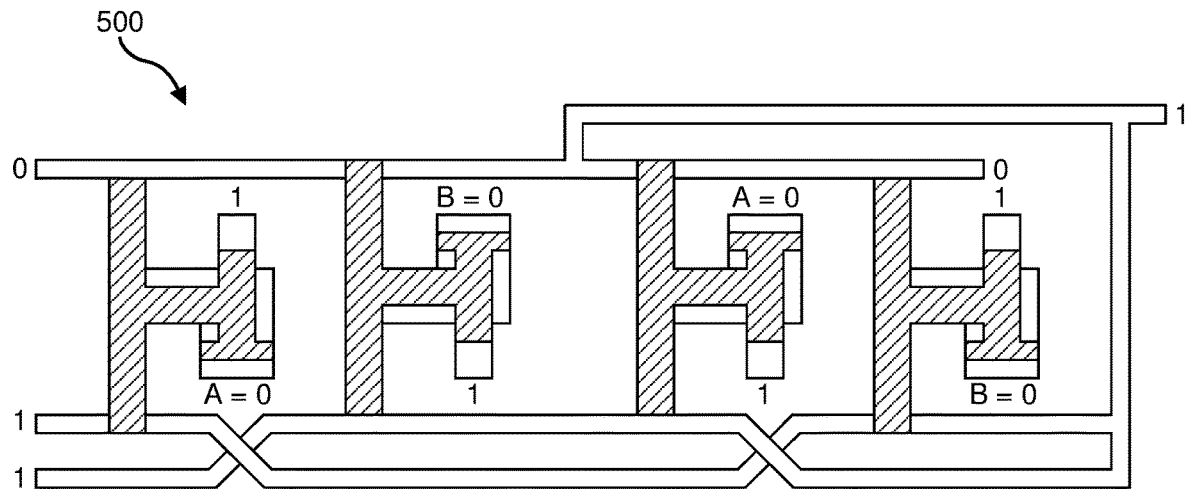
FIGS. 11A-12B are state diagrams of the exemplary fluidic logic gate of FIG. 10, according to at least one embodiment of the present disclosure.
Figure 11B:
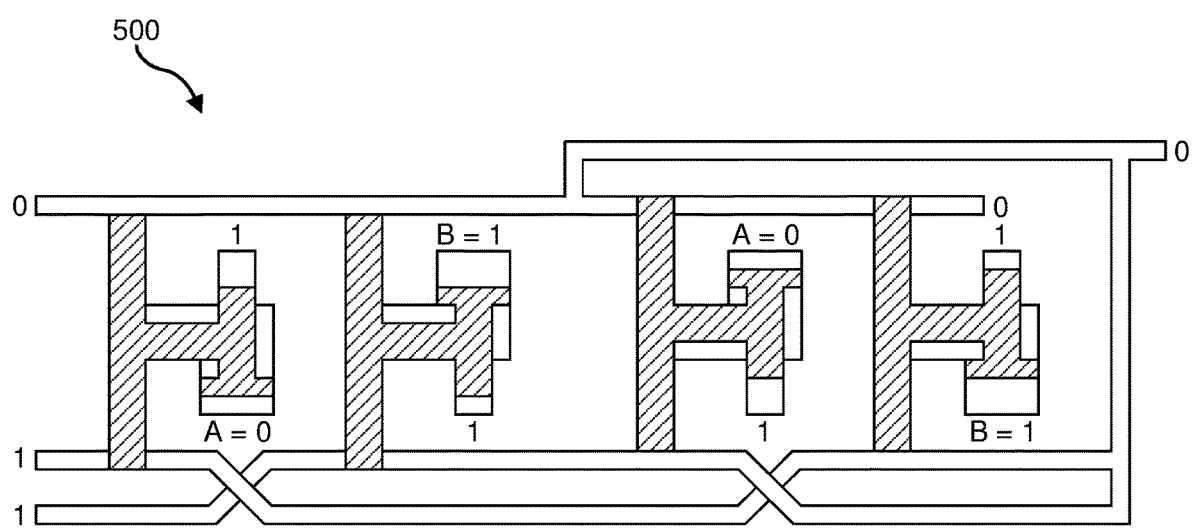
Figure 12A:
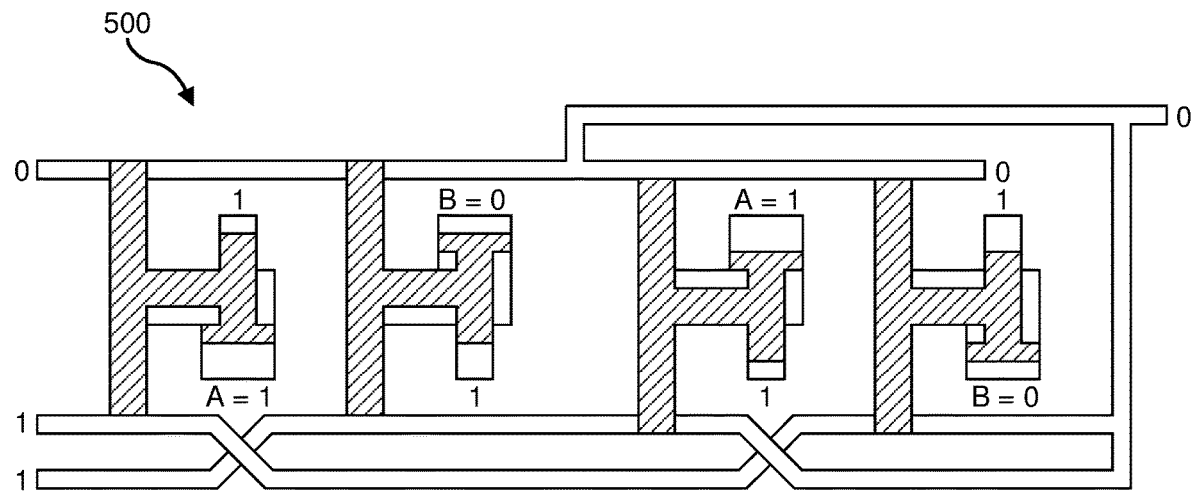
Figure 12B:
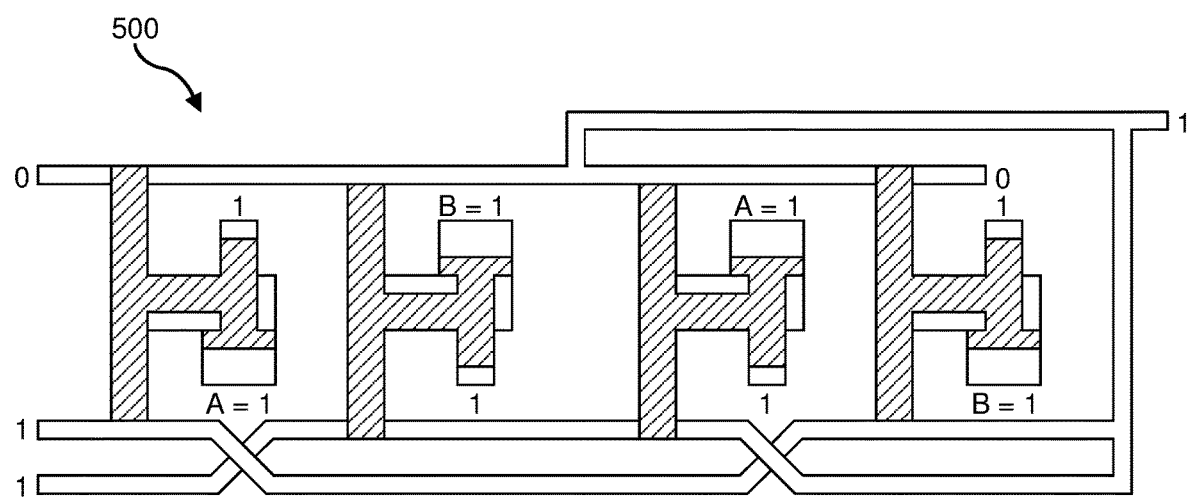

As shown in FIG. 10, in some examples, fluidic logic gate 500 may be configured to perform a XNOR operation by applying (1) a low pressure 1000 to inlet ports 502 and 504, (2) a high pressure 1002 to inlet ports 506 and 508, (3) a preload pressure 1004 (e.g., high pressure 1002) to control ports 406A-D, (4) an input fluid 1006 (e.g., an input A) to control ports 408A and 408C, and (5) an input fluid 1008 (e.g., an input B) to control ports 408B and 408D. In this example, a result of the XNOR operation may be seen as output pressure 1010 at outlet port 510. As shown in FIG. 11A, if input fluid 1006 and input fluid 1008 both have a low pressure (e.g., a pressure lower than that of preload pressure 1004), then pistons 416A-D may be in the positions shown and high pressure 1002 may be routed from inlet port 508 through fluid channel 518 to outlet port 510. As shown in FIG. 11B, if input fluid 1006 has a low pressure (e.g., a pressure lower than that of preload pressure 1004) and input fluid 1008 has a sufficiently high pressure (e.g., a pressure equal to preload pressure 1004), then pistons 416A-D may be in the positions shown and low pressure 1000 may be routed from inlet port 502 through fluid channel 512 to outlet port 510. As shown in FIG. 12A, if input fluid 1006 has a sufficiently high pressure (e.g., a pressure equal to preload pressure 1004) and input fluid 1008 has a low pressure (e.g., a pressure lower than that of preload pressure 1004), then pistons 416A-D may be in the positions shown and low pressure 1000 may be routed from inlet port 504 through fluid channel 514 to outlet port 510. As shown in FIG. 12B, if input fluid 1006 and input fluid 1008 both have a sufficiently high pressure (e.g., a pressure equal to preload pressure 1004), then pistons 416A-D may be in the positions shown and high pressure 1002 may be routed from inlet port 506 through fluid channel 516 to outlet port 510. FIG. 13 illustrates an XNOR truth table 1300 that may represent the functionality of fluidic logic gate 500 when configured as shown in FIG. 10.

FIGS. 14A-14C are schematic diagrams illustrating three positions/orientations of an exemplary fluidic valve 1400. As shown, fluidic valve 1400 may include an inlet port 1402, an inlet port 1404, a control port 1406, a control port 1408, an outlet port 1410, a fluid channel 1412 configured to convey fluid from inlet port 1402 to outlet port 1410, a fluid channel 1414 configured to convey fluid from inlet port 1404 to outlet port 1410, and a piston 1416. In some examples, piston 1416 may be formed from a single piece of a substantially rigid material (e.g., a rigid plastic, metal, or glass). Alternatively, piston 1416 may be formed from a substantially rigid composite part. Piston 1416 may include a restricting gate transmission element 1418 configured to block or restrict fluid channel 1412 when piston 1416 is in the blocking position illustrated in FIG. 14B and unblock fluid channel 1412 when piston 1416 is in the intermediate position illustrated in FIG. 14A or the blocking position illustrated in 14C. Piston 1416 may also include a restricting gate transmission element 1420 configured to block or restrict fluid channel 1414 when piston 1416 is in the blocking position illustrated in FIG. 14C and unblock fluid channel 1414 when piston 1416 is in the intermediate position illustrated in FIG. 14A or the blocking position illustrated in FIG. 14B. Piston 1416 may include complementary or opposing piston heads 1422 and 1424. Piston head 1422 may have a controlling gate transmission element 1426 configured to interface with a control pressure 1428 from control port 1406 that, when applied to controlling gate transmission element 1426 forces piston 1416 towards the position illustrated in FIG. 14C. Similarly, piston head 1424 may have a controlling gate transmission element 1430 configured to interface with a control pressure 1432 from control port 1408 that, when applied to controlling gate transmission element 1430 forces piston 1416 towards the position illustrated in FIG. 14B. As shown, fluidic valve 1400 may also include position-retaining elements 1434 and 1436 (e.g., springs or another compressible or elastic material). In some examples, position-retaining elements 1434 and 1436 may retain piston 1416 in the position illustrated in FIG. 14A when equal pressures are applied to controlling gate transmission elements 1426 and 1430. In some examples, position-retaining elements 1434 and 1436 may apply a restoring force to piston 1416 whenever piston 1416 is in the positions illustrated in FIGS. 14B and 14C. In some examples (not illustrated in FIG. 14A), position-retaining elements 1434 and 1436 (or additional position-retaining elements) may respectively abut gate transmission element 1426 and gate transmission element 1430 and may respectively apply a restoring force to gate transmission element 1426 and gate transmission element 1430. In some examples, a flexible membrane separating restricting gate transmission element 1418 from fluid channel 1412 or a flexible membrane separating restricting gate transmission element 1420 from fluid channel 1414 may provide a restoring force to piston 1416.

In some embodiments, fluidic valve 1400 may include an interstitial-pressure outlet/inlet 1440 that may direct fluid pressures from/to interstitial region 1442. In some examples, interstitial-pressure outlet/inlet 1440 may connect interstitial region 1442 to an outside atmosphere or an additional control fluid source. In some embodiments, the additional control fluid source may modulate fluid pressures within interstitial region 1442 to actuate piston 1416 or modulate the level of control pressures 1428 and/or 1432 at which piston 1416 actuates.

As shown in FIGS. 14A-14C, controlling gate transmission elements 1426 and 1430 may have substantially the same surface areas. As such, movement of piston 1416 from the position illustrated in FIG. 14A to the position illustrated in FIG. 14B may require a greater fluid pressure at control port 1408 than at control port 1406. Similarly, movement of piston 1416 from the position illustrated in FIG. 14A to the position illustrated in FIG. 14C may require a greater fluid pressure at control port 1406 than at control port 1408. In some examples, restricting gate transmission elements 1418 and 1420 may have substantially the same surface areas, which may be substantially less than the surface areas of controlling gate transmission elements 1426 and 1430. As such, movement of piston 1416 may be mostly caused by the fluid pressures applied to control ports 1406 and 1408 rather than any fluid pressures applied to inlet ports 1402 and 1404.

FIGS. 15A-15C are schematic diagrams illustrating three positions/orientations of another exemplary fluidic valve 1500. As shown, fluidic valve 1500 may include an inlet port 1502, an inlet port 1504, a control port 1506, control ports 1508A-B, and an outlet port 1510. Fluidic valve 1500 may also include a fluid channel 1512 configured to convey fluid from inlet port 1502 to outlet port 1510, a fluid channel 1514 configured to convey fluid from inlet port 1504 to outlet port 1510, and a piston 1516. In some examples, piston 1516 may be formed from a single piece of a substantially rigid material (e.g., a rigid plastic, metal, or glass). Alternatively, piston 1516 may be formed from a substantially rigid composite part. Piston 1516 may include a restricting gate transmission element 1518 configured to block or restrict fluid channel 1512 when piston 1516 is in the blocking position illustrated in FIG. 15B and unblock fluid channel 1512 when piston 1516 is in the intermediate position illustrated in FIG. 15A or the blocking position illustrated in 15C. Piston 1516 may also include a restricting gate transmission element 1520 configured to block or restrict fluid channel 1514 when piston 1516 is in the blocking position illustrated in FIG. 15C and unblock fluid channel 1514 when piston 1516 is in the intermediate position illustrated in FIG. 15A or the blocking position illustrated in FIG. 15B. Piston 1516 may include complementary or opposing piston heads 1522, 1524A, and 1524B. Piston head 1522 may have a controlling gate transmission element 1526 configured to interface with a control pressure 1528 from control port 1506 that, when applied to controlling gate transmission element 1526 forces piston 1516 towards the position illustrated in FIG. 15C. Similarly, piston head 1524A may have a controlling gate transmission element 1530A configured to interface with a control pressure 1532A from control port 1508A that, when applied to controlling gate transmission element 1530A forces piston 1516 towards the position illustrated in FIG. 15B, and piston head 1524B may have a controlling gate transmission element 1530B configured to interface with a control pressure 1532B from control port 1508B that, when applied to controlling gate transmission element 1530B forces piston 1516 towards the position illustrated in FIG. 15B. As shown, fluidic valve 1500 may also include position-retaining elements 1534 and 1536 (e.g., springs or another compressible material). In some examples, position-retaining elements 1534 and 1536 may retain piston 1516 in the position illustrated in FIG. 15A when equal pressures are applied to controlling gate transmission element 1526 and controlling gate transmission elements 1530A-B. In some examples, position-retaining elements 1534 and 1536 may apply a restoring force to piston 1516 whenever piston 1516 is in the positions illustrated in FIGS. 15B and 15C. In some examples, a flexible membrane separating restricting gate transmission element 1518 from fluid channel 1512 or a flexible membrane separating restricting gate transmission element 1520 from fluid channel 1514 may provide a restoring force to piston 1516.

As shown in FIGS. 15A-15C, controlling gate transmission elements 1526 and 1530A-B may have substantially the same surface areas. As such, movement of piston 1516 from the position illustrated in FIG. 15A to the position illustrated in FIG. 15B may require a greater fluid pressure at either of control ports 1508A-B than at control port 1506. Similarly, movement of piston 1516 from the position illustrated in FIG. 15A to the position illustrated in FIG. 15C may require a greater fluid pressure at control port 1506 than at control ports 1508A-B. In some examples, restricting gate transmission elements 1518 and 1520 may have substantially the same surface areas, which may be substantially less than the surface areas of controlling gate transmission elements 1526 and 1530A-B. As such, movement of piston 1516 may be mostly caused by the fluid pressures applied to control ports 1506 and 1508A-B rather than any fluid pressures applied to inlet ports 1502 and 1504.

Figure 16:
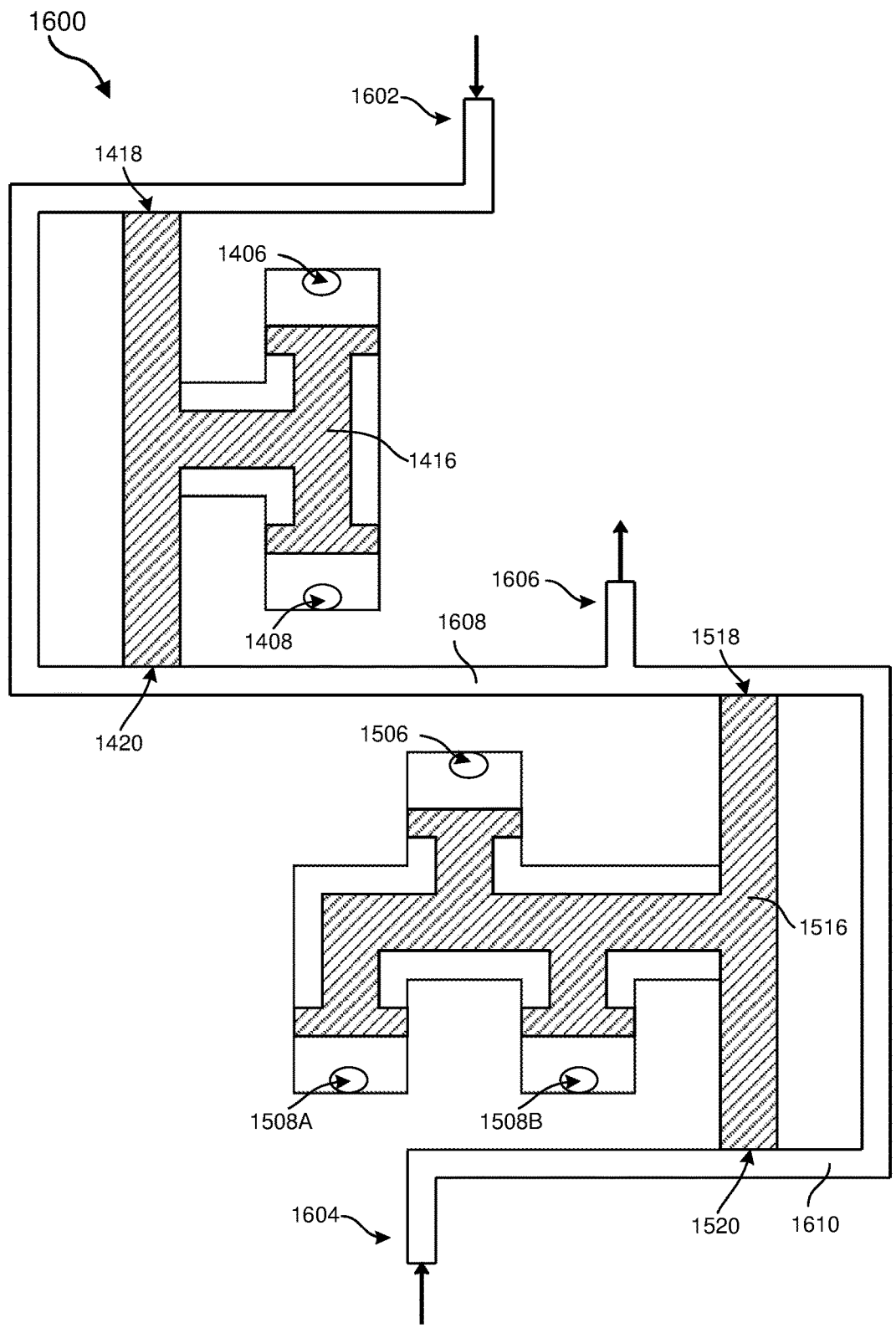
FIG. 16 is a schematic diagram of an exemplary fluidic logic gate, according to at least one embodiment of the present disclosure.

Some or all of the components of fluidic valve 1400 in FIGS. 14A-C or fluidic valve 1500 in FIGS. 15A-C may be configured or modified to perform various functions and/or operations as part of a larger composite fluidic system. For example, as shown in FIG. 16, a fluidic logic gate 1600 may be configured using pistons 1416 and 1516. As shown, fluidic logic gate 1600 may include an inlet port 1602, an inlet port 1604, and an outlet port 1606. Fluidic logic gate 1600 may also include a fluid channel 1608 configured to convey fluid from inlet port 1602 to outlet port 1606 and a fluid channel 1610 configured to convey fluid from inlet port 1604 to outlet port 1606.

As shown, restricting gate transmission element 1418 of piston 1416 may be configured to unblock fluid channel 1608 when piston 1416 is in the position illustrated in FIG. 16 and block or restrict fluid channel 1608 when a sufficient pressure is applied to control port 1408 to overcome any pressure applied to control port 1406 and force piston 1416 upward. Similarly, restricting gate transmission element 1420 of piston 1416 may be configured to unblock fluid channel 1608 when piston 1416 is in the position illustrated in FIG. 16 and block or restrict fluid channel 1608 when a sufficient pressure is applied to control port 1406 to overcome any pressure applied to control port 1408 and force piston 1416 downward. As shown, restricting gate transmission element 1518 of piston 1516 may be configured to unblock fluid channel 1610 when piston 1516 is in the position illustrated in FIG. 16 and block or restrict fluid channel 1610 when a sufficient pressure is applied to control port 1508A or control port 1508B to overcome any pressure applied to control port 1506 and force piston 1516 upward. Similarly, restricting gate transmission element 1520 of piston 1516 may be configured to unblock fluid channel 1610 when piston 1516 is in the position illustrated in FIG. 16 and block or restrict fluid channel 1610 when a sufficient pressure is applied to control port 1506 to overcome any pressure applied to control port 1508A or control port 1508B and force piston 1516 downward. In some examples, pistons 1416 and 1516 may be part of a single fluidic device within which fluid channels 1608 and 1610 are integrated. Alternatively, pistons 1416 and 1516 may be part of separate fluidic devices, and portions of fluid channels 1608 and/or 1610 may be external fluid connections between the separate fluidic devices.

Figure 17:
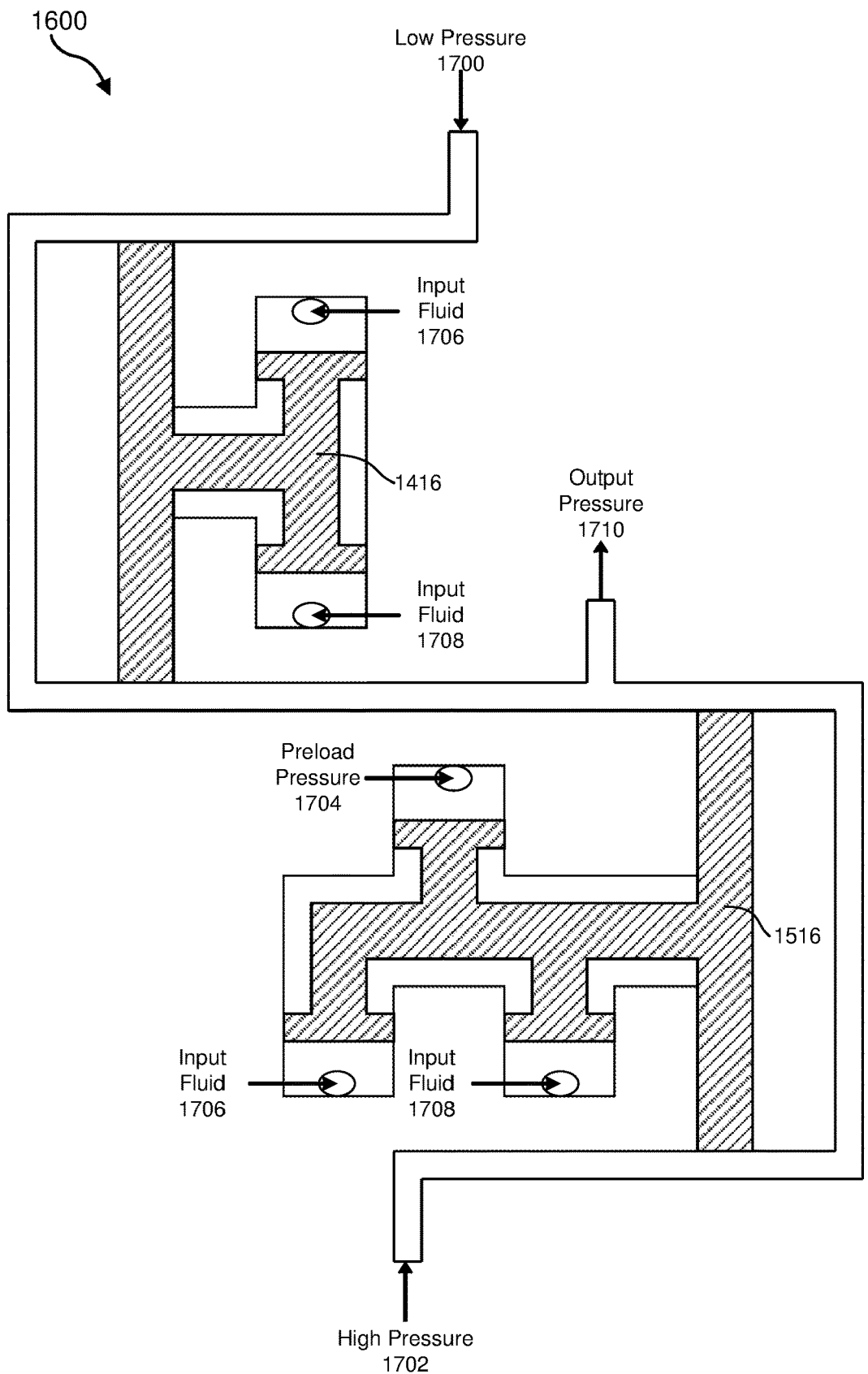
FIG. 17 is a schematic diagram of the exemplary fluidic logic gate of FIG. 16 configured to perform a XOR operation, according to at least one embodiment of the present disclosure.
Figure 18A:
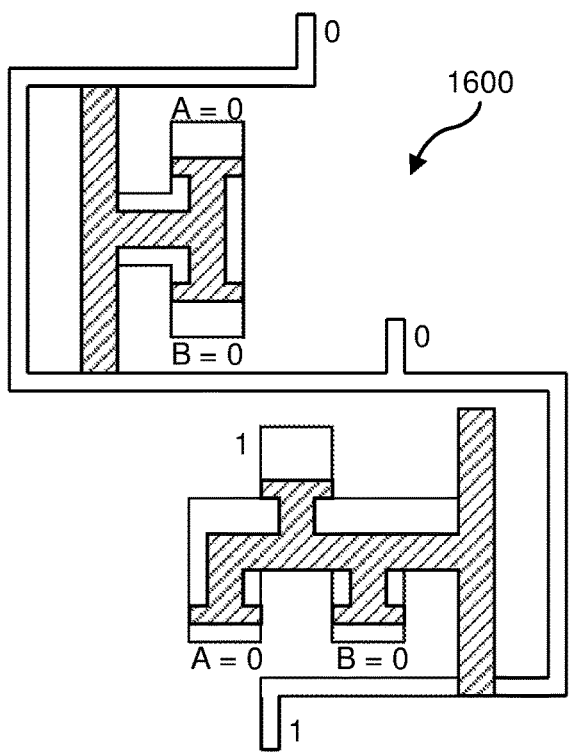
FIGS. 18A-18D are state diagrams of the exemplary fluidic logic gate of FIG. 17, according to at least one embodiment of the present disclosure.
Figure 18B:
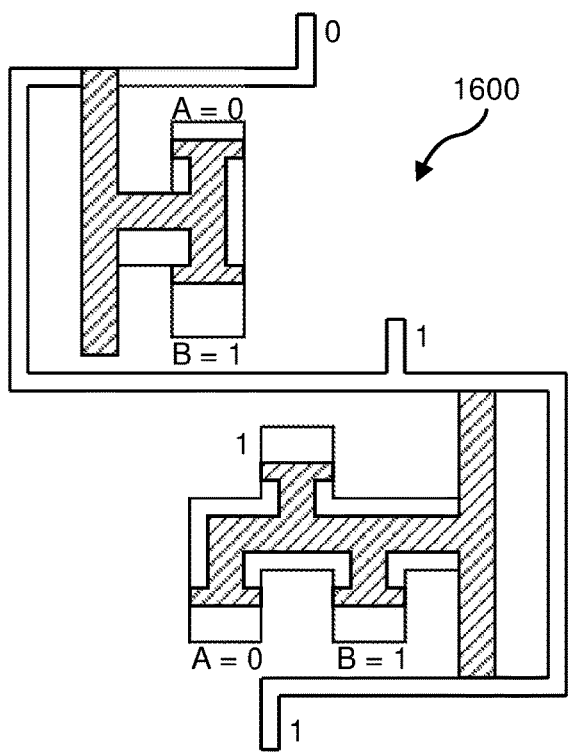
Figure 18C:
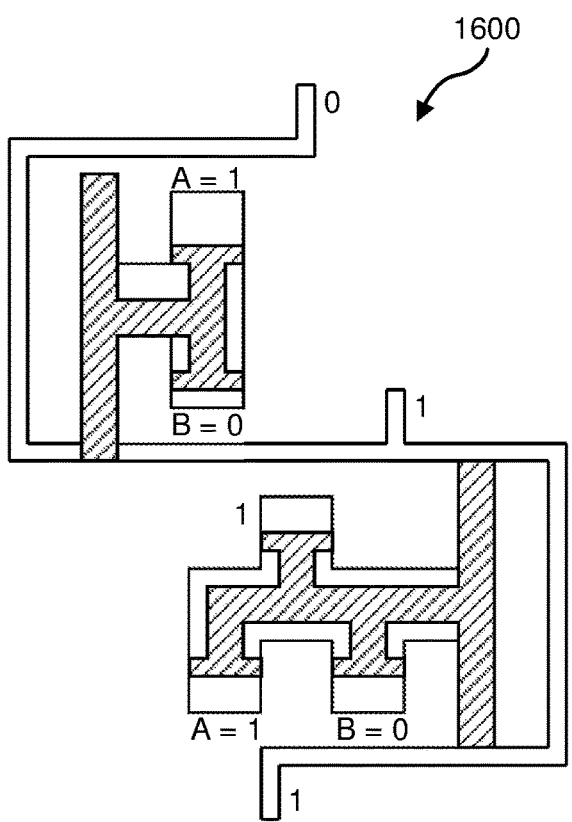
Figure 18D:
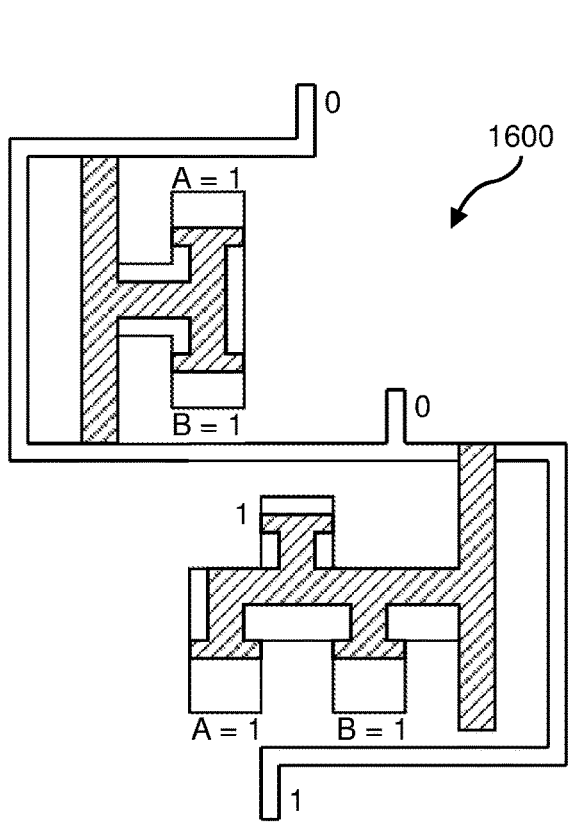

As shown in FIG. 17, in some examples, fluidic logic gate 1600 may be configured to perform a XOR operation by applying (1) a low pressure 1700 to inlet port 1602, (2) a high pressure 1702 to inlet port 1604, (3) a preload pressure 1704 (e.g., high pressure 1702) to control port 1506, (4) an input fluid 1706 (e.g., an input A) to control ports 1406 and 1508A, and (16) an input fluid 1708 (e.g., an input B) to control ports 1408 and 1508B. In this example, a result of the XOR operation may be seen as output pressure 1710 at outlet port 1606. As shown in FIG. 18A, if input fluid 1706 and input fluid 1708 both have a low pressure (e.g., a pressure lower than that of preload pressure 1704), then pistons 1416 and 1516 may be in the positions shown and low pressure 1700 may be routed from inlet port 1602 through fluid channel 1608 to outlet port 1606. As shown in FIG. 18B, if input fluid 1706 has a low pressure (e.g., a pressure lower than that of preload pressure 1704) and input fluid 1708 has a sufficiently high pressure (e.g., a pressure equal to preload pressure 1704), then pistons 1416 and 1516 may be in the positions shown and high pressure 1702 may be routed from inlet port 1604 through fluid channel 1610 to outlet port 1606. As shown in FIG. 18C, if input fluid 1706 has a sufficiently high pressure (e.g., a pressure equal to preload pressure 1704) and input fluid 1708 has a low pressure (e.g., a pressure lower than that of preload pressure 1704), then pistons 1416 and 1516 may be in the positions shown and high pressure 1702 may be routed from inlet port 1604 through fluid channel 1610 to outlet port 1606. As shown in FIG. 18D, if input fluid 1706 and input fluid 1708 both have a sufficiently high pressure (e.g., a pressure equal to preload pressure 1704), then pistons 1416 and 1516 may be in the positions shown and low pressure 1700 may be routed from inlet port 1602 through fluid channel 1608 to outlet port 1606. FIG. 9 illustrates an XOR truth table 900 that may represent the functionality of fluidic logic gate 1600 when configured as shown in FIG. 17.

Figure 19:
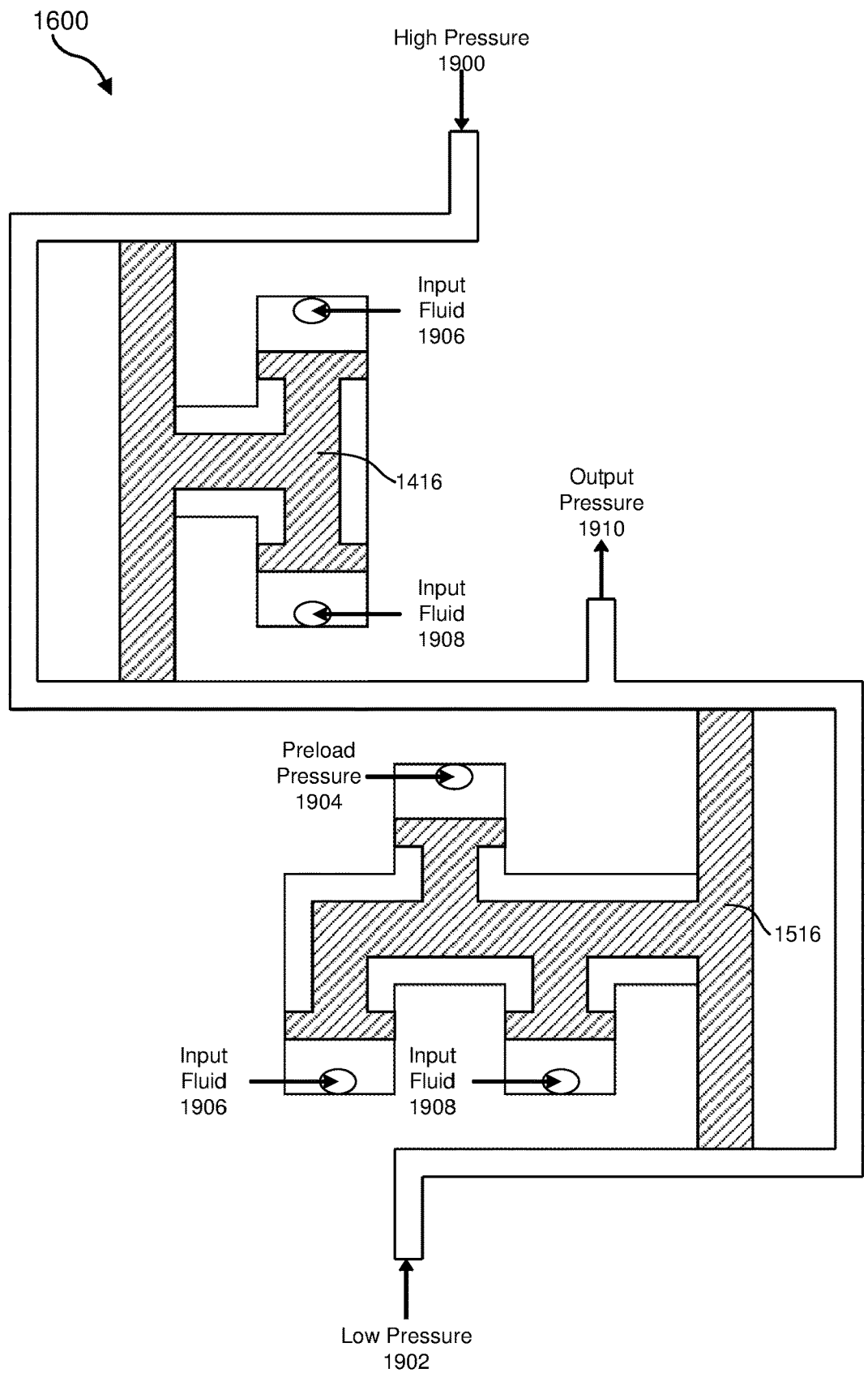
FIG. 19 is a schematic diagram of the exemplary fluidic logic gate of FIG. 16 configured to perform a XNOR operation, according to at least one embodiment of the present disclosure.

As shown in FIG. 19, in some examples, fluidic logic gate 1600 may be configured to perform a XNOR operation by applying (1) a high pressure 1900 to inlet port 1602, (2) a low pressure 1902 to inlet port 1604, (3) a preload pressure 1904 (e.g., high pressure 1900) to control port 1506, (4) an input fluid 1906 (e.g., an input A) to control ports 1406 and 1508A, and (16) an input fluid 1908 (e.g., an input B) to control ports 1408 and 1508B. In this example, a result of the XNOR operation may be seen as output pressure 1910 at outlet port 1606. As shown in FIG. 20A, if input fluid 1906 and input fluid 1908 both have a low pressure (e.g., a pressure lower than that of preload pressure 1904), then pistons 1416 and 1516 may be in the positions shown and high pressure 1900 may be routed from inlet port 1602 through fluid channel 1608 to outlet port 1606. As shown in FIG. 20B, if input fluid 1906 has a low pressure (e.g., a pressure lower than that of preload pressure 1904) and input fluid 1908 has a sufficiently high pressure (e.g., a pressure equal to preload pressure 1904), then pistons 1416 and 1516 may be in the positions shown and low pressure 1902 may be routed from inlet port 1604 through fluid channel 1610 to outlet port 1606. As shown in FIG. 20C, if input fluid 1906 has a sufficiently high pressure (e.g., a pressure equal to preload pressure 1904) and input fluid 1908 has a low pressure (e.g., a pressure lower than that of preload pressure 1904), then pistons 1416 and 1516 may be in the positions shown and low pressure 1902 may be routed from inlet port 1604 through fluid channel 1610 to outlet port 1606. As shown in FIG. 20D, if input fluid 1906 and input fluid 1908 both have a sufficiently high pressure (e.g., a pressure equal to preload pressure 1904), then pistons 1416 and 1516 may be in the positions shown and high pressure 1900 may be routed from inlet port 1602 through fluid channel 1608 to outlet port 1606. FIG. 13 illustrates an XNOR truth table 1300 that may represent the functionality of fluidic logic gate 1600 when configured as shown in FIG. 19.

Figure 21:
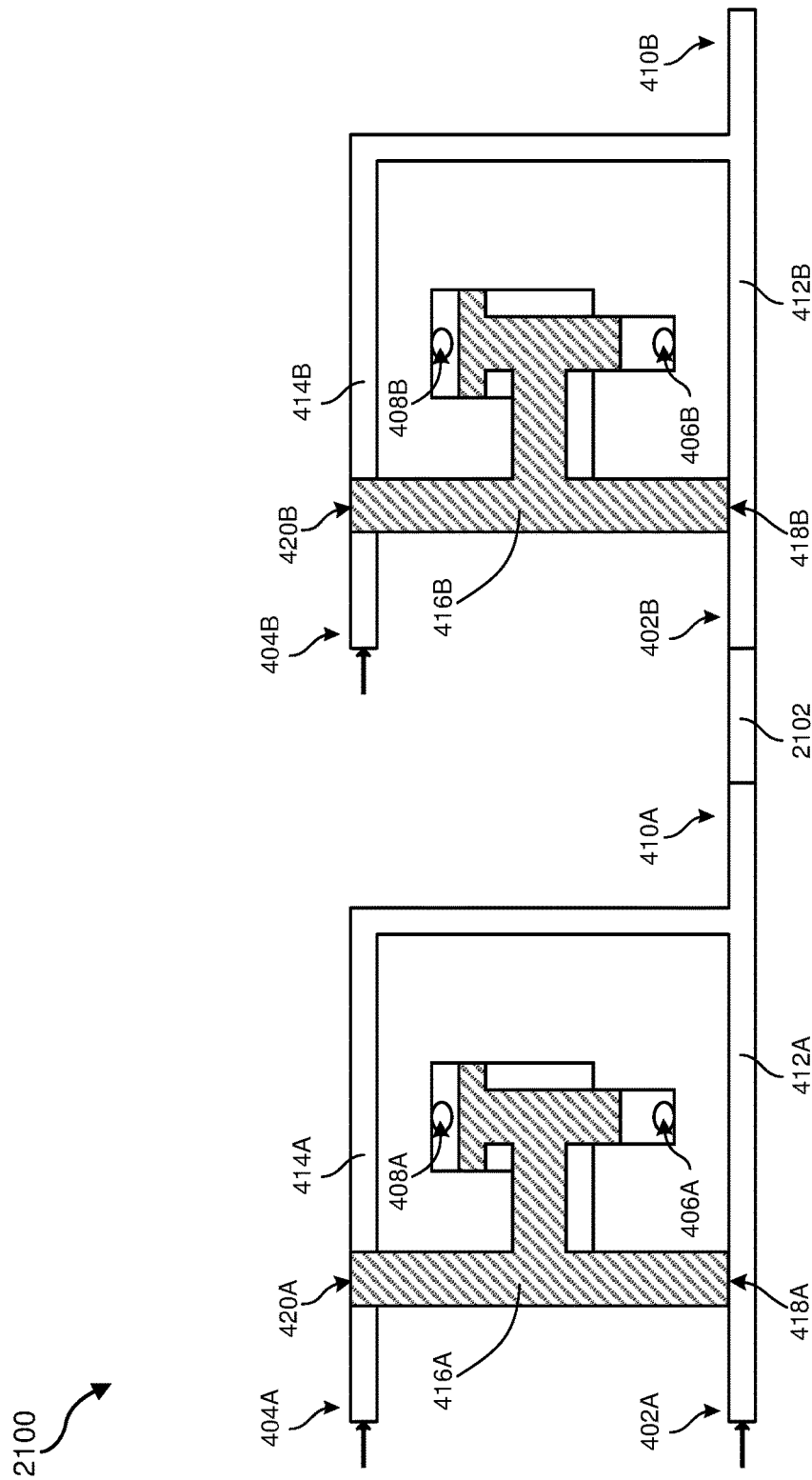
FIG. 21 is a schematic diagram of an exemplary fluidic logic gate, according to at least one embodiment of the present disclosure.

Some or all of the components of fluidic valve 400 in FIGS. 4A and 4B may be configured or modified to perform various functions and/or operations as part of a larger composite fluidic system. For example, as shown in FIG. 21, a fluidic logic gate 2100 may be configured using a fluidic valve 400A and a fluidic valve 400B in a pass-through configuration. As shown, outlet port 410A of fluidic valve 400A may be connected to inlet port 402B of fluidic valve 400B by a fluid channel 2102. In some examples, pistons 416A and 416B may be part of separate fluidic devices, and fluid channel 2102 may be an external fluid connection between the separate fluidic devices. Alternatively, the elements shown in FIG. 21 may be part of a single fluidic device within which fluid channels 412A, 414A, 412B, 414B, and 2102 are integrated. In the configurations shown, fluid channels 412A, 2102, and 412B may act as a single fluid channel connecting inlet port 402A to outlet port 410B. Likewise, fluid channels 414A, 2102, and 412B may act as another single fluid channel connecting inlet port 404A to outlet port 410B.

Figure 22:
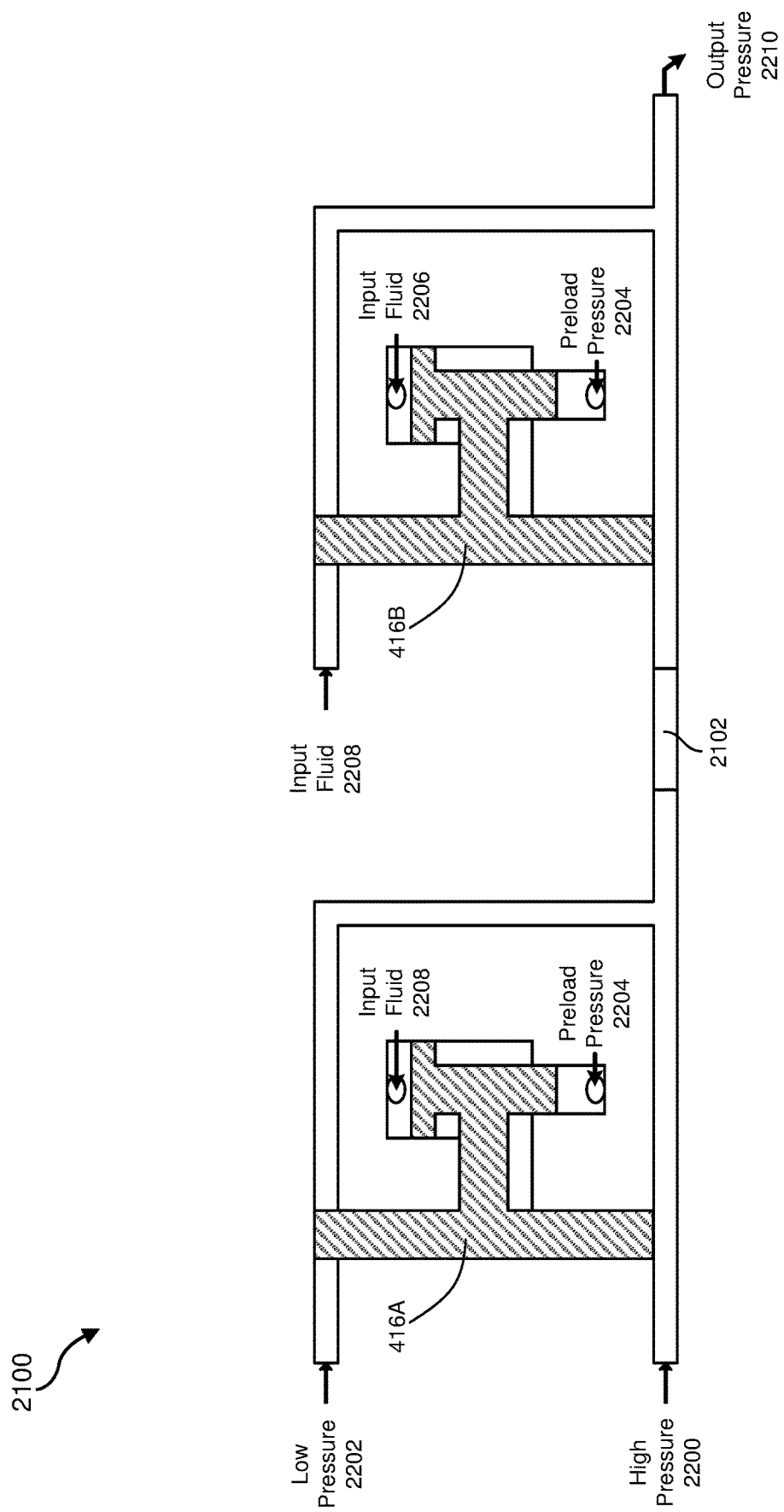
FIG. 22 is a schematic diagram of the exemplary fluidic logic gate of FIG. 21 configured to perform an XNOR operation, according to at least one embodiment of the present disclosure.
Figure 23A:
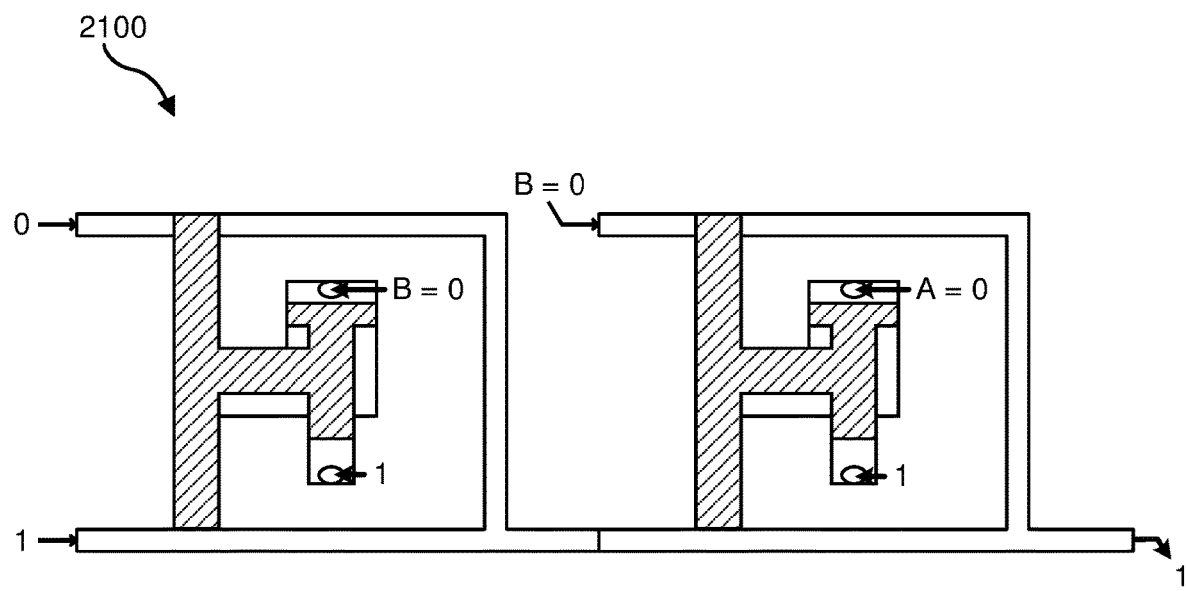
FIGS. 23A-24B are state diagrams of the exemplary fluidic logic gate of FIG. 22, according to at least one embodiment of the present disclosure.
Figure 23B:
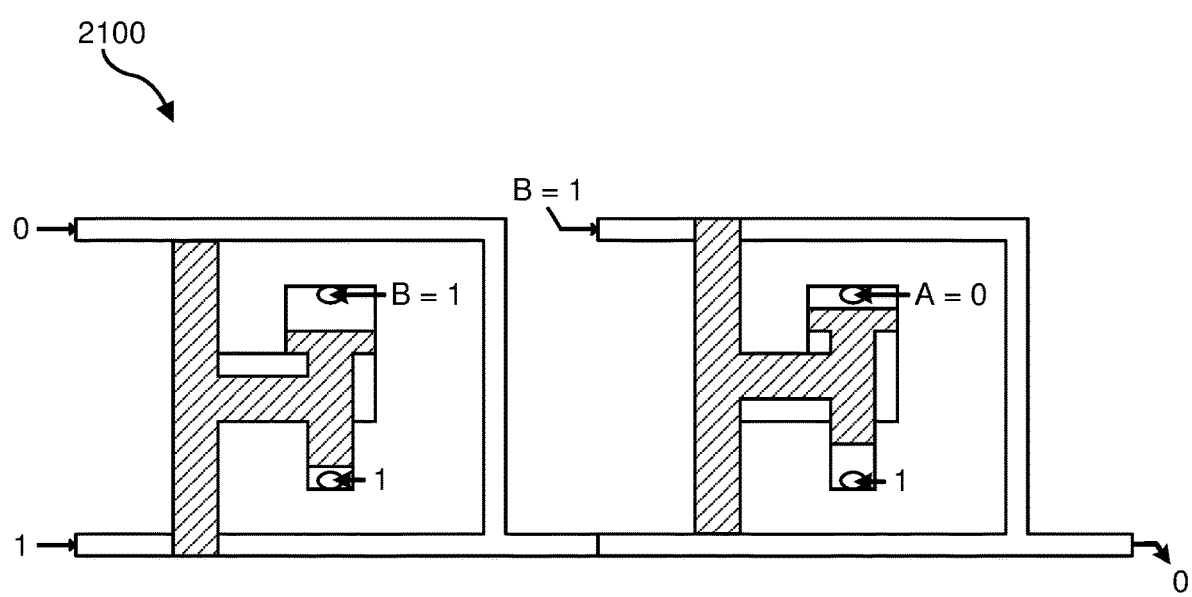
Figure 24A:
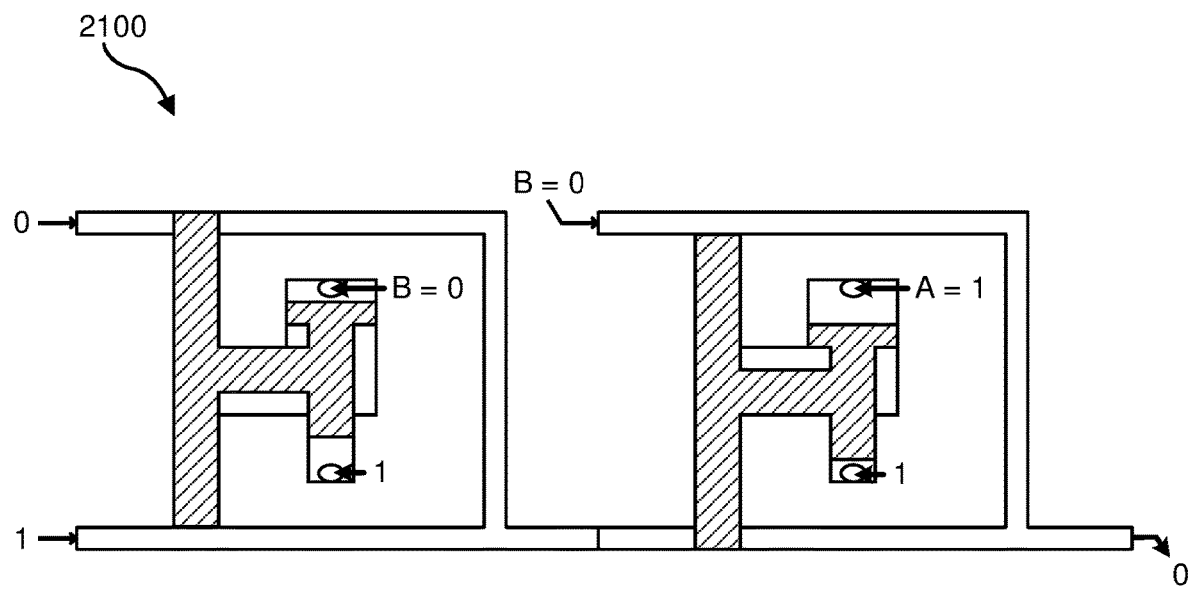
Figure 24B:
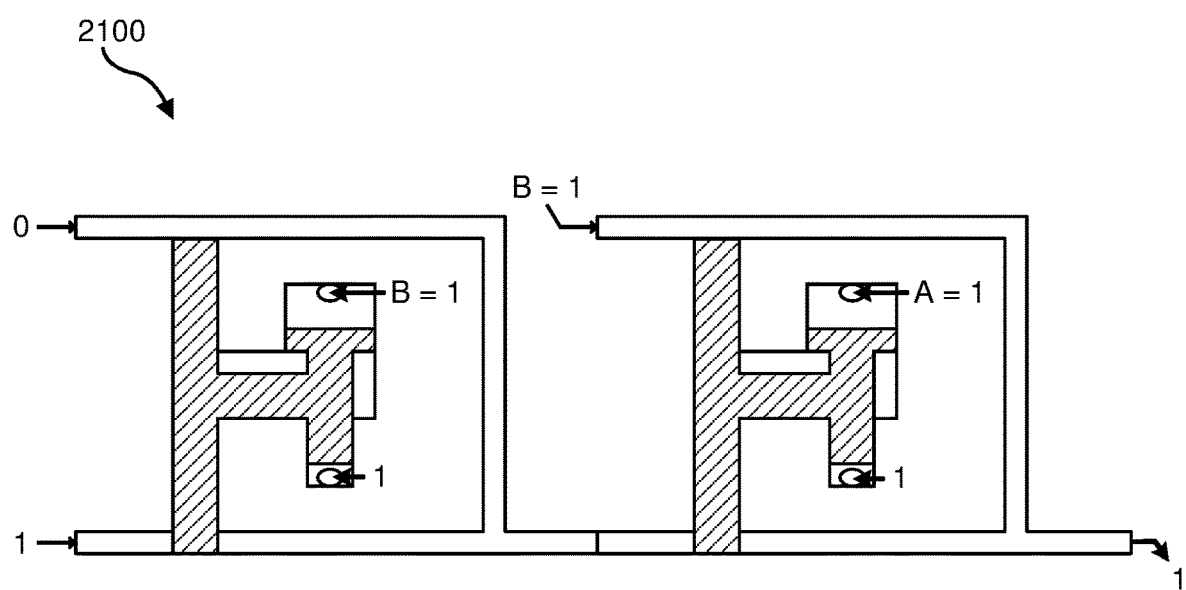

As shown in FIG. 22, in some examples, fluidic logic gate 2100 may be configured to perform a XNOR operation by applying (1) a high pressure 2200 to inlet port 402A, (2) a low pressure 2202 to inlet port 404A, (3) a preload pressure 2204 (e.g., high pressure 2200) to control ports 406A and 406B, (4) an input fluid 2206 (e.g., an input A) to control port 408B, and (5) an input fluid 2208 (e.g., an input B) to inlet port 404B and control port 408A. In this example, a result of the XNOR operation may be seen as output pressure 2210 at outlet port 410B. In this configuration, fluidic valve 400A may perform a NOT operation on input fluid 2208, which is then routed from outlet port 410A to inlet port 402B. As shown in FIG. 23A, if input fluid 2206 and input fluid 2208 both have a low pressure (e.g., a pressure lower than that of preload pressure 2204), then pistons 416A and 416B may be in the positions shown and high pressure 2200 may be routed from inlet port 402A through fluid channels 412A, 2102, and 412B to outlet port 410B. As shown in FIG. 23B, if input fluid 2206 has a low pressure (e.g., a pressure lower than that of preload pressure 2204) and input fluid 2208 has a sufficiently high pressure (e.g., a pressure equal to preload pressure 2204), then pistons 416A and 416B may be in the positions shown and low pressure 2202 may be routed from inlet port 404A through fluid channels 414A, 2101, and 412A to outlet port 410B. As shown in FIG. 24A, if input fluid 2206 has a sufficiently high pressure (e.g., a pressure equal to preload pressure 2204) and input fluid 2208 has a low pressure (e.g., a pressure lower than that of preload pressure 2204), then pistons 416A and 416B may be in the positions shown and the low pressure of input fluid 2208 may be routed from inlet port 404B through fluid channel 414B to outlet port 410B. As shown in FIG. 24B, if input fluid 2206 and input fluid 2208 both have a sufficiently high pressure (e.g., a pressure equal to preload pressure 2204), then pistons 416A and 416B may be in the positions shown and the high pressure of input fluid 2208 may be routed from inlet port 404B through fluid channel 414B to outlet port 410B. FIG. 13 illustrates an XNOR truth table 1300 that may represent the functionality of fluidic logic gate 2100 when configured as shown in FIG. 22.

Figure 25:
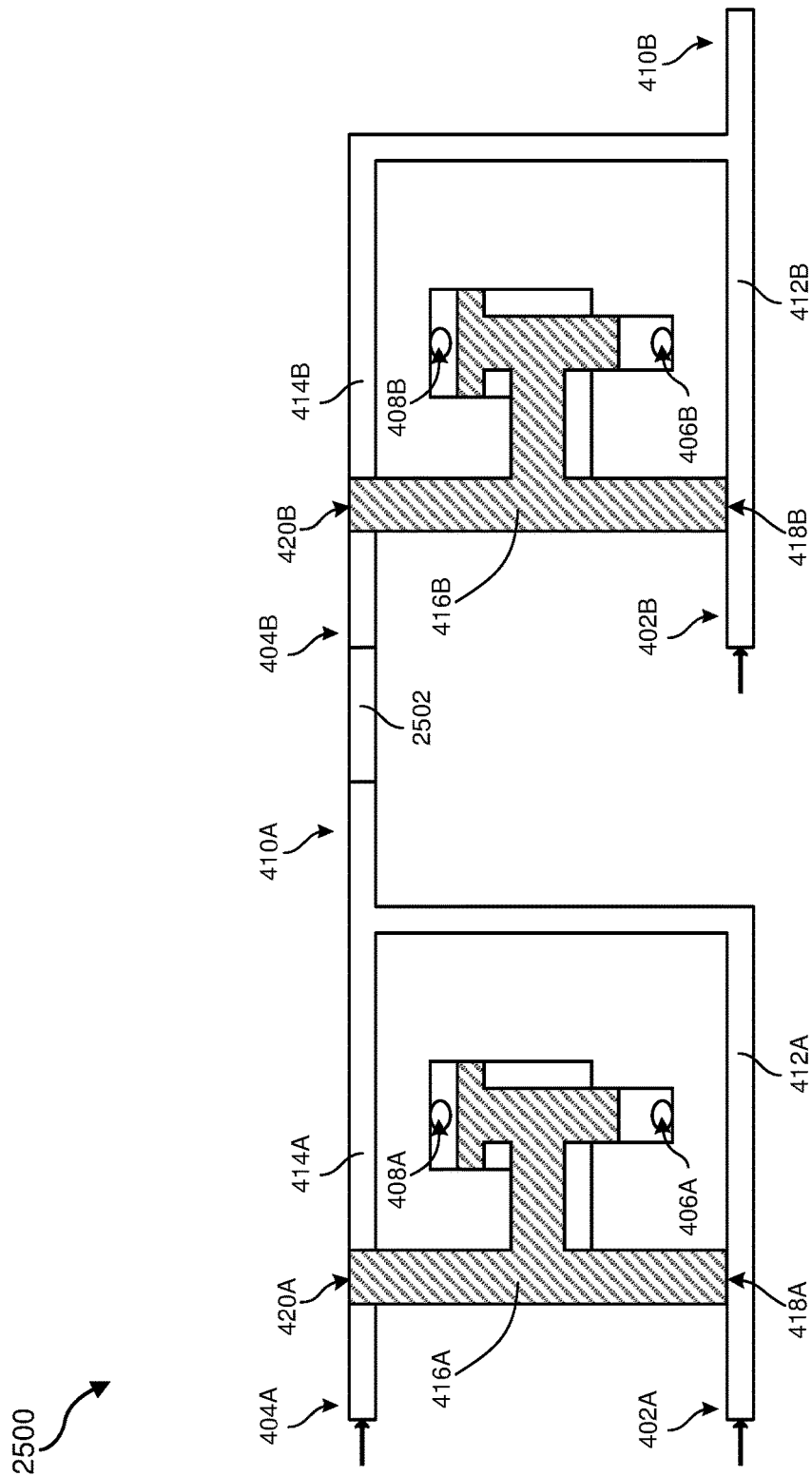
FIG. 25 is a schematic diagram of an exemplary fluidic logic gate, according to at least one embodiment of the present disclosure.

Other pass-through configurations of fluidic valve 400 may be configured or modified to perform various other functions and/or operations. For example, as shown in FIG. 25, a fluidic logic gate 2500 may be configured using a fluidic valve 400A and a fluidic valve 400B in another pass-through configuration. As shown, outlet port 410A of fluidic valve 400A may be connected to inlet port 404B of fluidic valve 400B by a fluid channel 2502. In some examples, pistons 416A and 416B may be part of separate fluidic devices, and fluid channel 2502 may be an external fluid connection between the separate fluidic devices. Alternatively, the elements shown in FIG. 25 may be part of a single fluidic device within which fluid channels 412A, 414A, 412B, 414B, and 2502 are integrated. In the configurations shown, fluid channels 412A, 2102, and 414B may act as a single fluid channel connecting inlet port 402A to outlet port 410B. Likewise, fluid channels 414A, 2102, and 414B may act as another single fluid channel connecting inlet port 404A to outlet port 410B.

Figure 26:
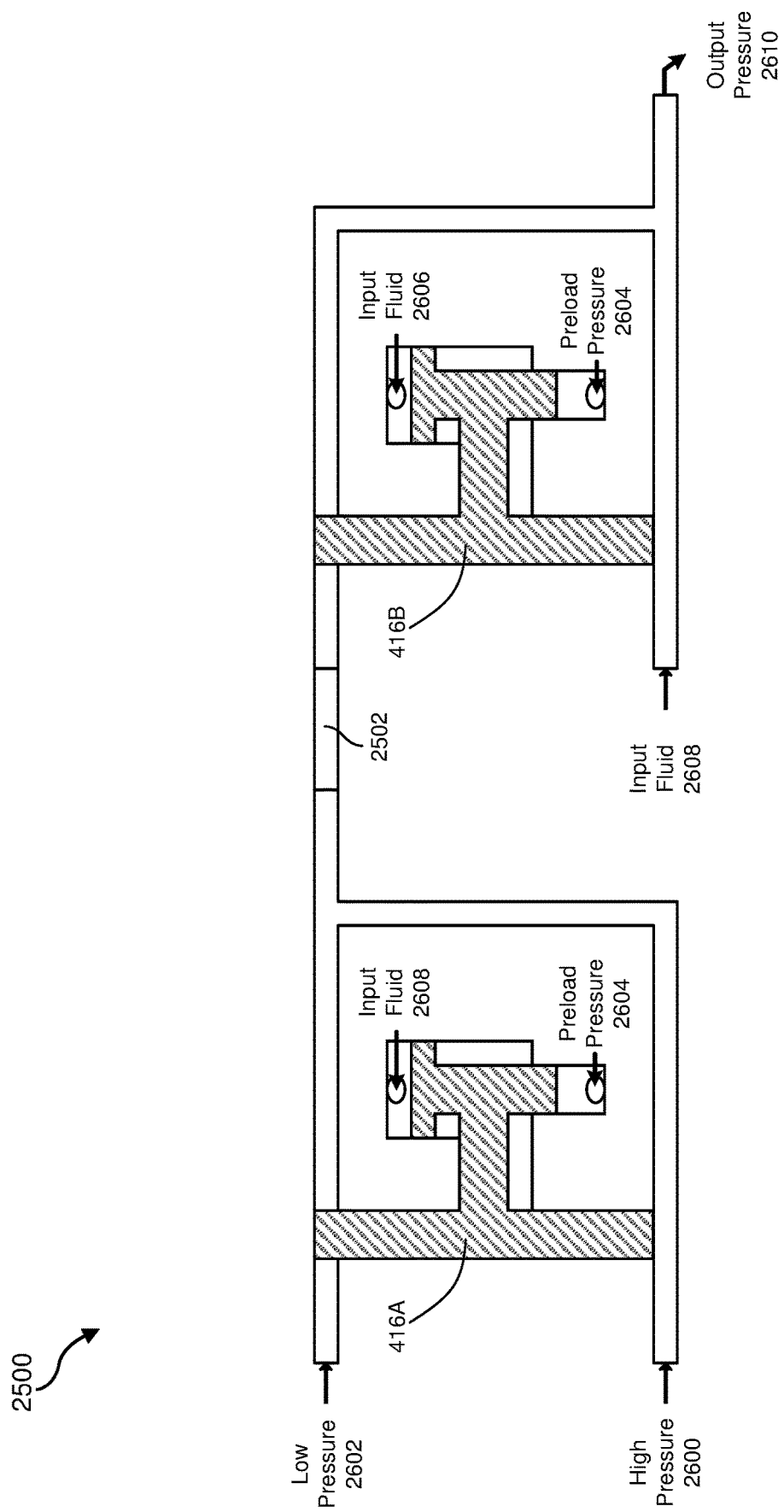
FIG. 26 is a schematic diagram of the exemplary fluidic logic gate of FIG. 25 configured to perform an XOR operation, according to at least one embodiment of the present disclosure.
Figure 27A:
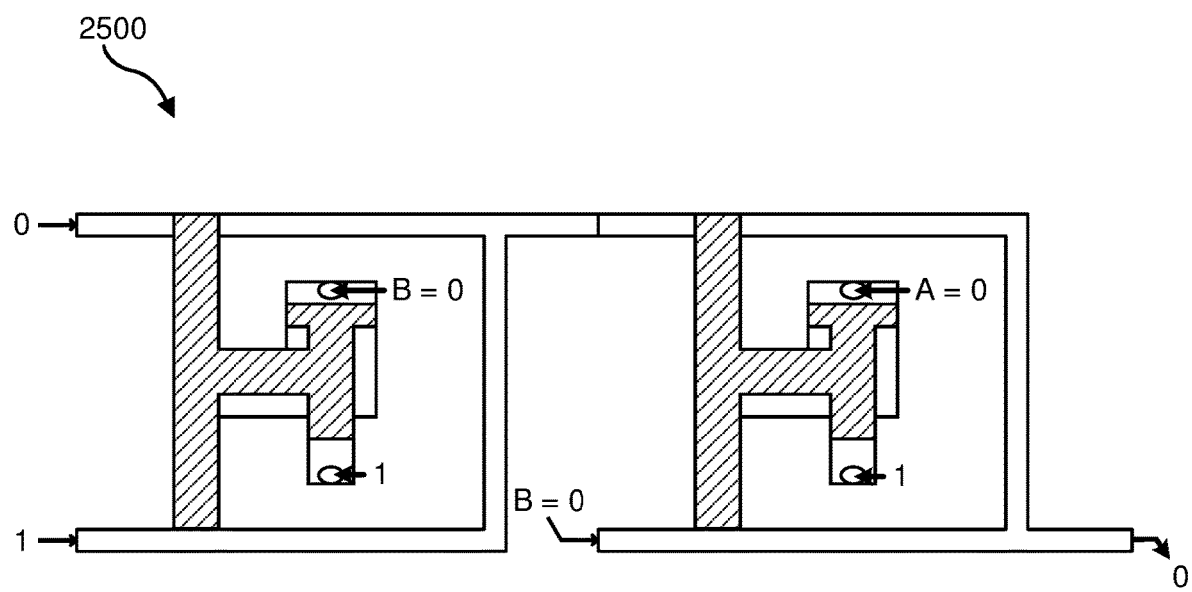
FIGS. 27A-28B are state diagrams of the exemplary fluidic logic gate of FIG. 26, according to at least one embodiment of the present disclosure.
Figure 27B:
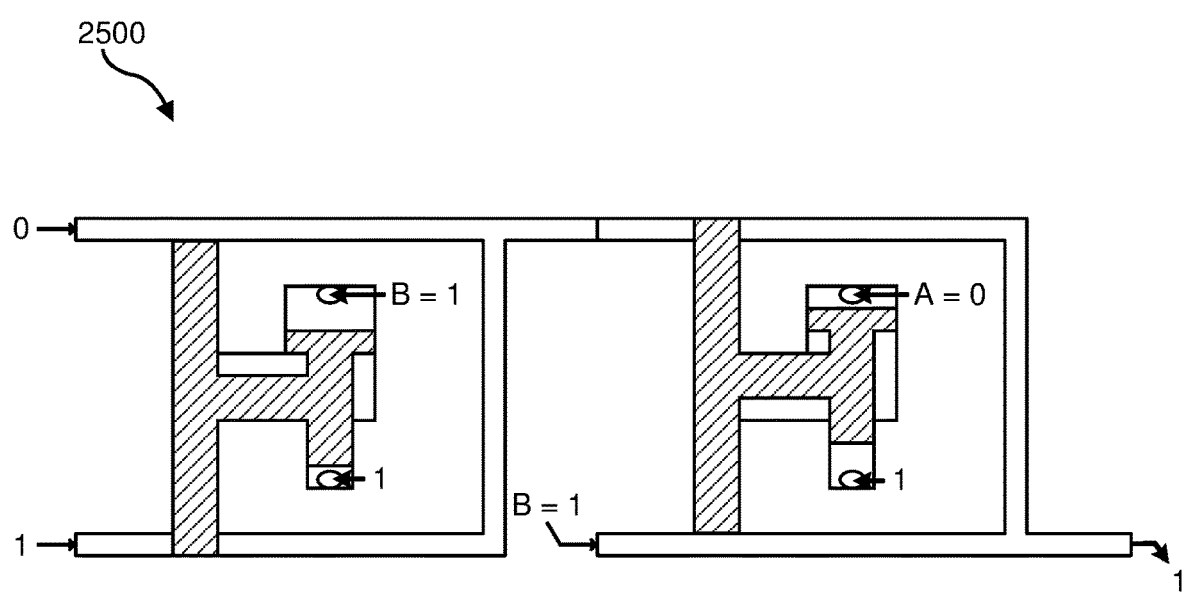
Figure 28A:
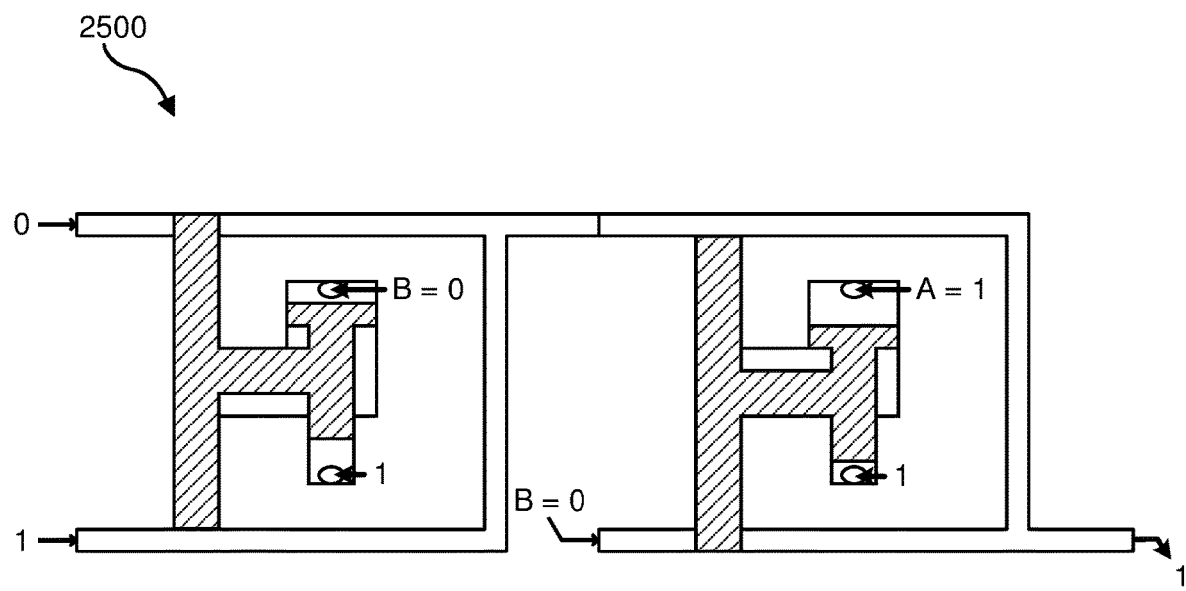
Figure 28B:
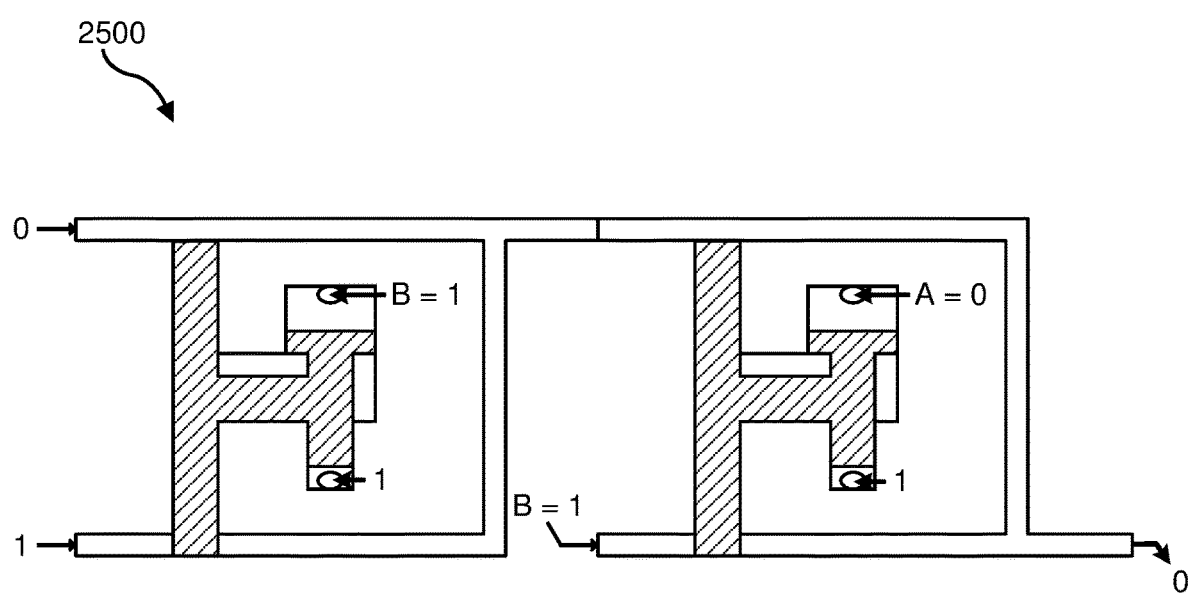

As shown in FIG. 26, in some examples, fluidic logic gate 2500 may be configured to perform a XOR operation by applying (1) a high pressure 2600 to inlet port 402A, (2) a low pressure 2602 to inlet port 404A, (3) a preload pressure 2604 (e.g., high pressure 2600) to control ports 406A and 406B, (4) an input fluid 2606 (e.g., an input A) to control port 408B, and (5) an input fluid 2608 (e.g., an input B) to inlet port 402B and control port 408A. In this example, a result of the XOR operation may be seen as output pressure 2610 at outlet port 410B. In this configuration, fluidic valve 400A may perform a NOT operation on input fluid 2208, which is then routed from outlet port 410A to inlet port 402B. As shown in FIG. 27A, if input fluid 2606 and input fluid 2608 both have a low pressure (e.g., a pressure lower than that of preload pressure 2604), then pistons 416A and 416B may be in the positions shown and the low pressure of input fluid 2608 may be routed from inlet port 402B through fluid channel 412B to outlet port 410B. As shown in FIG. 27B, if input fluid 2606 has a low pressure (e.g., a pressure lower than that of preload pressure 2604) and input fluid 2608 has a sufficiently high pressure (e.g., a pressure equal to preload pressure 2604), then pistons 416A and 416B may be in the positions shown and the high pressure of input fluid 2608 may be routed from inlet port 402B through fluid channel 412B to outlet port 410B. As shown in FIG. 28A, if input fluid 2606 has a sufficiently high pressure (e.g., a pressure equal to preload pressure 2604) and input fluid 2608 has a low pressure (e.g., a pressure lower than that of preload pressure 2604), then pistons 416A and 416B may be in the positions shown and high pressure 2600 may be routed from inlet port 402A through fluid channels 412A, 2502, and 414B to outlet port 410B. As shown in FIG. 28B, if input fluid 2606 and input fluid 2608 both have a sufficiently high pressure (e.g., a pressure equal to preload pressure 2604), then pistons 416A and 416B may be in the positions shown and low pressure 2602 may be routed from inlet port 404A through fluid channels 414A, 2502, and 414B to outlet port 410B. FIG. 9 illustrates an XOR truth table 900 that may represent the functionality of fluidic logic gate 2500 when configured as shown in FIG. 26.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 2900 in FIG. 29. Other artificial reality systems may include a NED that also provides visibility into the real world (e.g., augmented-reality system 3000 in FIG. 30) or that visually immerses a user in an artificial reality (e.g., virtual-reality system 3100 in FIG. 31). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 29:
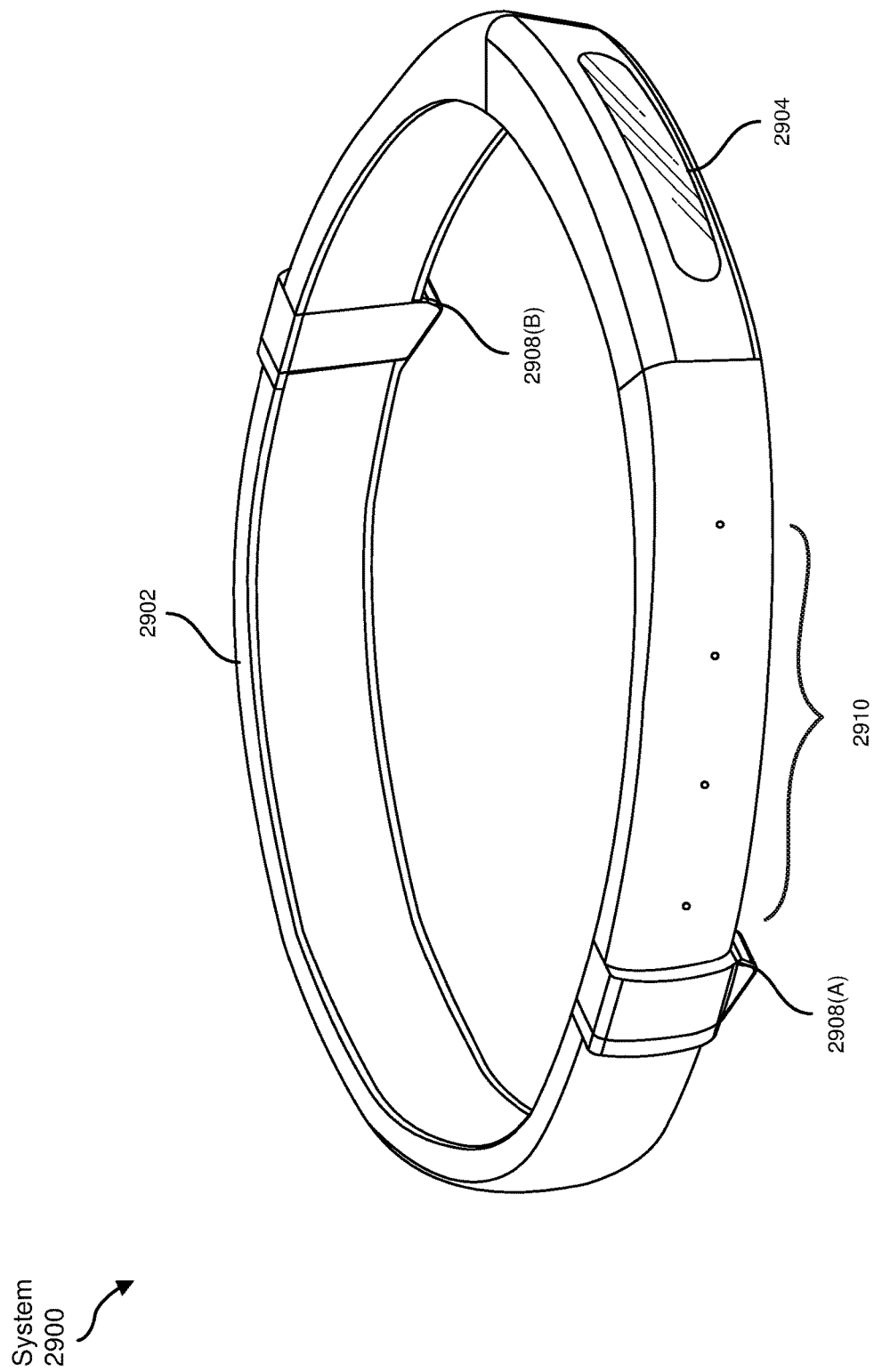
FIG. 29 is an illustration of an exemplary artificial-reality headband that may be used in connection with embodiments of this disclosure.

Turning to FIG. 29, augmented-reality system 2900 generally represents a wearable device dimensioned to fit about a body part (e.g., a head) of a user. As shown in FIG. 29, system 2900 may include a frame 2902 and a camera assembly 2904 that is coupled to frame 2902 and configured to gather information about a local environment by observing the local environment. Augmented-reality system 2900 may also include one or more audio devices, such as output audio transducers 2908(A) and 2908(B) and input audio transducers 2910. Output audio transducers 2908(A) and 2908(B) may provide audio feedback and/or content to a user, and input audio transducers 2910 may capture audio in a user's environment.

As shown, augmented-reality system 2900 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 2900 may not include a NED, augmented-reality system 2900 may include other types of screens or visual feedback devices (e.g., a display screen integrated into a side of frame 2902).

Figure 30:
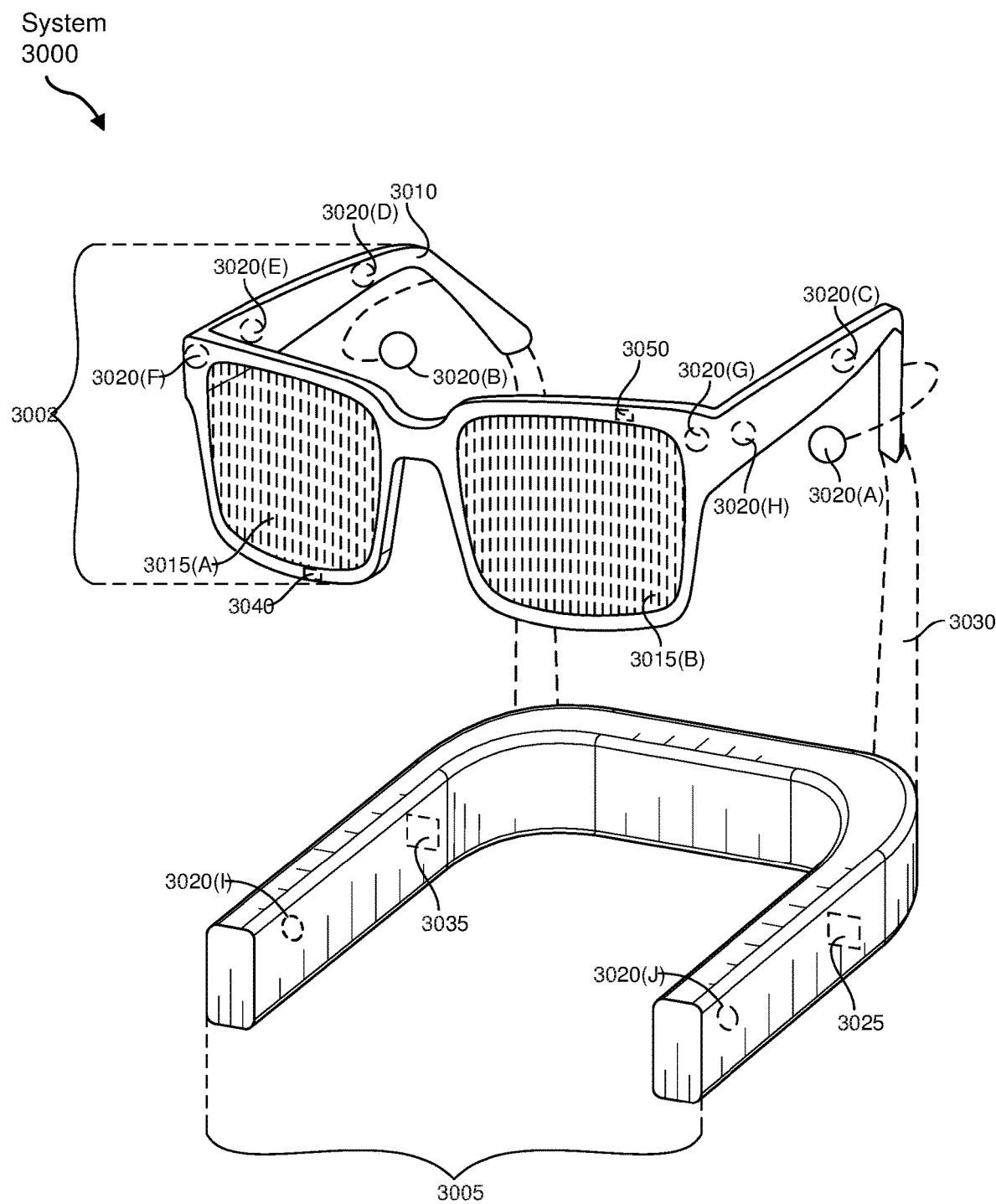
FIG. 30 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 30, augmented-reality system 3000 may include an eyewear device 3002 with a frame 3010 configured to hold a left display device 3015(A) and a right display device 3015(B) in front of a user's eyes. Display devices 3015(A) and 3015(B) may act together or independently to present an image or series of images to a user. While augmented-reality system 3000 includes two displays, embodiments of this disclosure may be implemented in augmented-reality systems with a single NED or more than two NEDs.

In some embodiments, augmented-reality system 3000 may include one or more sensors, such as sensor 3040. Sensor 3040 may generate measurement signals in response to motion of augmented-reality system 3000 and may be located on substantially any portion of frame 3010. Sensor 3040 may represent a position sensor, an inertial measurement unit (IMU), a depth camera assembly, or any combination thereof. In some embodiments, augmented-reality system 3000 may or may not include sensor 3040 or may include more than one sensor. In embodiments in which sensor 3040 includes an IMU, the IMU may generate calibration data based on measurement signals from sensor 3040. Examples of sensor 3040 may include, without limitation, accelerometers, gyroscopes, magnetometers, other suitable types of sensors that detect motion, sensors used for error correction of the IMU, or some combination thereof.

Augmented-reality system 3000 may also include a microphone array with a plurality of acoustic transducers 3020(A)-3020(J), referred to collectively as acoustic transducers 3020. Acoustic transducers 3020 may be transducers that detect air pressure variations induced by sound waves. Each acoustic transducer 3020 may be configured to detect sound and convert the detected sound into an electronic format (e.g., an analog or digital format). The microphone array in FIG. 2 may include, for example, ten acoustic transducers: 3020(A) and 3020(B), which may be designed to be placed inside a corresponding ear of the user, acoustic transducers 3020(C), 3020(D), 3020(E), 3020(F), 3020(G), and 3020(H), which may be positioned at various locations on frame 3010, and/or acoustic transducers 3020(I) and 3020(J), which may be positioned on a corresponding neckband 3005.

In some embodiments, one or more of acoustic transducers 3020(A)-(F) may be used as output transducers (e.g., speakers). For example, acoustic transducers 3020(A) and/or 3020(B) may be earbuds or any other suitable type of headphone or speaker.

The configuration of acoustic transducers 3020 of the microphone array may vary. While augmented-reality system 3000 is shown in FIG. 30 as having ten acoustic transducers 3020, the number of acoustic transducers 3020 may be greater or less than ten. In some embodiments, using higher numbers of acoustic transducers 3020 may increase the amount of audio information collected and/or the sensitivity and accuracy of the audio information. In contrast, using a lower number of acoustic transducers 3020 may decrease the computing power required by the controller 3050 to process the collected audio information. In addition, the position of each acoustic transducer 3020 of the microphone array may vary. For example, the position of an acoustic transducer 3020 may include a defined position on the user, a defined coordinate on frame 3010, an orientation associated with each acoustic transducer, or some combination thereof.

Acoustic transducers 3020(A) and 3020(B) may be positioned on different parts of the user's ear, such as behind the pinna or within the auricle or fossa. Or, there may be additional acoustic transducers on or surrounding the ear in addition to acoustic transducers 3020 inside the ear canal. Having an acoustic transducer positioned next to an ear canal of a user may enable the microphone array to collect information on how sounds arrive at the ear canal. By positioning at least two of acoustic transducers 3020 on either side of a user's head (e.g., as binaural microphones), augmented-reality device 3000 may simulate binaural hearing and capture a 3D stereo sound field around about a user's head. In some embodiments, acoustic transducers 3020(A) and 3020(B) may be connected to augmented-reality system 3000 via a wired connection 3030, and in other embodiments, acoustic transducers 3020(A) and 3020(B) may be connected to augmented-reality system 3000 via a wireless connection (e.g., a Bluetooth connection). In still other embodiments, acoustic transducers 3020(A) and 3020(B) may not be used at all in conjunction with augmented-reality system 3000.

Acoustic transducers 3020 on frame 3010 may be positioned along the length of the temples, across the bridge, above or below display devices 3015(A) and 3015(B), or some combination thereof. Acoustic transducers 3020 may be oriented such that the microphone array is able to detect sounds in a wide range of directions surrounding the user wearing the augmented-reality system 3000. In some embodiments, an optimization process may be performed during manufacturing of augmented-reality system 3000 to determine relative positioning of each acoustic transducer 3020 in the microphone array.

In some examples, augmented-reality system 3000 may include or be connected to an external device (e.g., a paired device), such as neckband 3005. Neckband 3005 generally represents any type or form of paired device. Thus, the following discussion of neckband 3005 may also apply to various other paired devices, such as charging cases, smart watches, smart phones, wrist bands, other wearable devices, hand-held controllers, tablet computers, laptop computers and other external compute devices, etc.

As shown, neckband 3005 may be coupled to eyewear device 3002 via one or more connectors. The connectors may be wired or wireless and may include electrical and/or non-electrical (e.g., structural) components. In some cases, eyewear device 3002 and neckband 3005 may operate independently without any wired or wireless connection between them. While FIG. 30 illustrates the components of eyewear device 3002 and neckband 3005 in example locations on eyewear device 3002 and neckband 3005, the components may be located elsewhere and/or distributed differently on eyewear device 3002 and/or neckband 3005. In some embodiments, the components of eyewear device 3002 and neckband 3005 may be located on one or more additional peripheral devices paired with eyewear device 3002, neckband 3005, or some combination thereof. Furthermore, Pairing external devices, such as neckband 3005, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 3000 may be provided by a paired device or shared between a paired device and an eyewear device, thus reducing the weight, heat profile, and form factor of the eyewear device overall while still retaining desired functionality. For example, neckband 3005 may allow components that would otherwise be included on an eyewear device to be included in neckband 3005 since users may tolerate a heavier weight load on their shoulders than they would tolerate on their heads. Neckband 3005 may also have a larger surface area over which to diffuse and disperse heat to the ambient environment. Thus, neckband 3005 may allow for greater battery and computation capacity than might otherwise have been possible on a stand-alone eyewear device. Since weight carried in neckband 3005 may be less invasive to a user than weight carried in eyewear device 3002, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 3005 may be communicatively coupled with eyewear device 3002 and/or to other devices. These other devices may provide certain functions (e.g., tracking, localizing, depth mapping, processing, storage, etc.) to augmented-reality system 3000. In the embodiment of FIG. 30, neckband 3005 may include two acoustic transducers (e.g., 3020(I) and 3020(J)) that are part of the microphone array (or potentially form their own microphone subarray). Neckband 3005 may also include a controller 3025 and a power source 3035.

Acoustic transducers 3020(I) and 3020(J) of neckband 3005 may be configured to detect sound and convert the detected sound into an electronic format (analog or digital). In the embodiment of FIG. 30, acoustic transducers 3020(I) and 3020(J) may be positioned on neckband 3005, thereby increasing the distance between the neckband acoustic transducers 3020(I) and 3020(J) and other acoustic transducers 3020 positioned on eyewear device 3002. In some cases, increasing the distance between acoustic transducers 3020 of the microphone array may improve the accuracy of beamforming performed via the microphone array. For example, if a sound is detected by acoustic transducers 3020(C) and 3020(D) and the distance between acoustic transducers 3020(C) and 3020(D) is greater than, e.g., the distance between acoustic transducers 3020(D) and 3020(E), the determined source location of the detected sound may be more accurate than if the sound had been detected by acoustic transducers 3020(D) and 3020(E).

Controller 3025 of neckband 3005 may process information generated by the sensors on 3005 and/or augmented-reality system 3000. For example, controller 3025 may process information from the microphone array that describes sounds detected by the microphone array. For each detected sound, controller 3025 may perform a direction-of-arrival (DOA) estimation to estimate a direction from which the detected sound arrived at the microphone array. As the microphone array detects sounds, controller 3025 may populate an audio data set with the information. In embodiments in which augmented-reality system 3000 includes an inertial measurement unit, controller 3025 may compute all inertial and spatial calculations from the IMU located on eyewear device 3002. A connector may convey information between augmented-reality system 3000 and neckband 3005 and between augmented-reality system 3000 and controller 3025. The information may be in the form of optical data, electrical data, wireless data, or any other transmittable data form. Moving the processing of information generated by augmented-reality system 3000 to neckband 3005 may reduce weight and heat in eyewear device 3002, making it more comfortable to the user.

Power source 3035 in neckband 3005 may provide power to eyewear device 3002 and/or to neckband 3005. Power source 3035 may include, without limitation, lithium ion batteries, lithium-polymer batteries, primary lithium batteries, alkaline batteries, or any other form of power storage. In some cases, power source 3035 may be a wired power source. Including power source 3035 on neckband 3005 instead of on eyewear device 3002 may help better distribute the weight and heat generated by power source 3035.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 3100 in FIG. 31, that mostly or completely covers a user's field of view. Virtual-reality system 3100 may include a front rigid body 3102 and a band 3104 shaped to fit around a user's head. Virtual-reality system 3100 may also include output audio transducers 3106(A) and 3106(B). Furthermore, while not shown in FIG. 31, front rigid body 3102 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 3100 and/or virtual-reality system 3100 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 3000 and/or virtual-reality system 3100 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 2900, augmented-reality system 3000, and/or virtual-reality system 3100 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 29 and 31, output audio transducers 2908(A), 2908(B), 3106(A), and 3106(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 2910 may include condenser microphones, dynamic microphones, ribbon microphones, and/or any other type or form of input transducer. In some embodiments, a single transducer may be used for both audio input and audio output.

Figure 31:
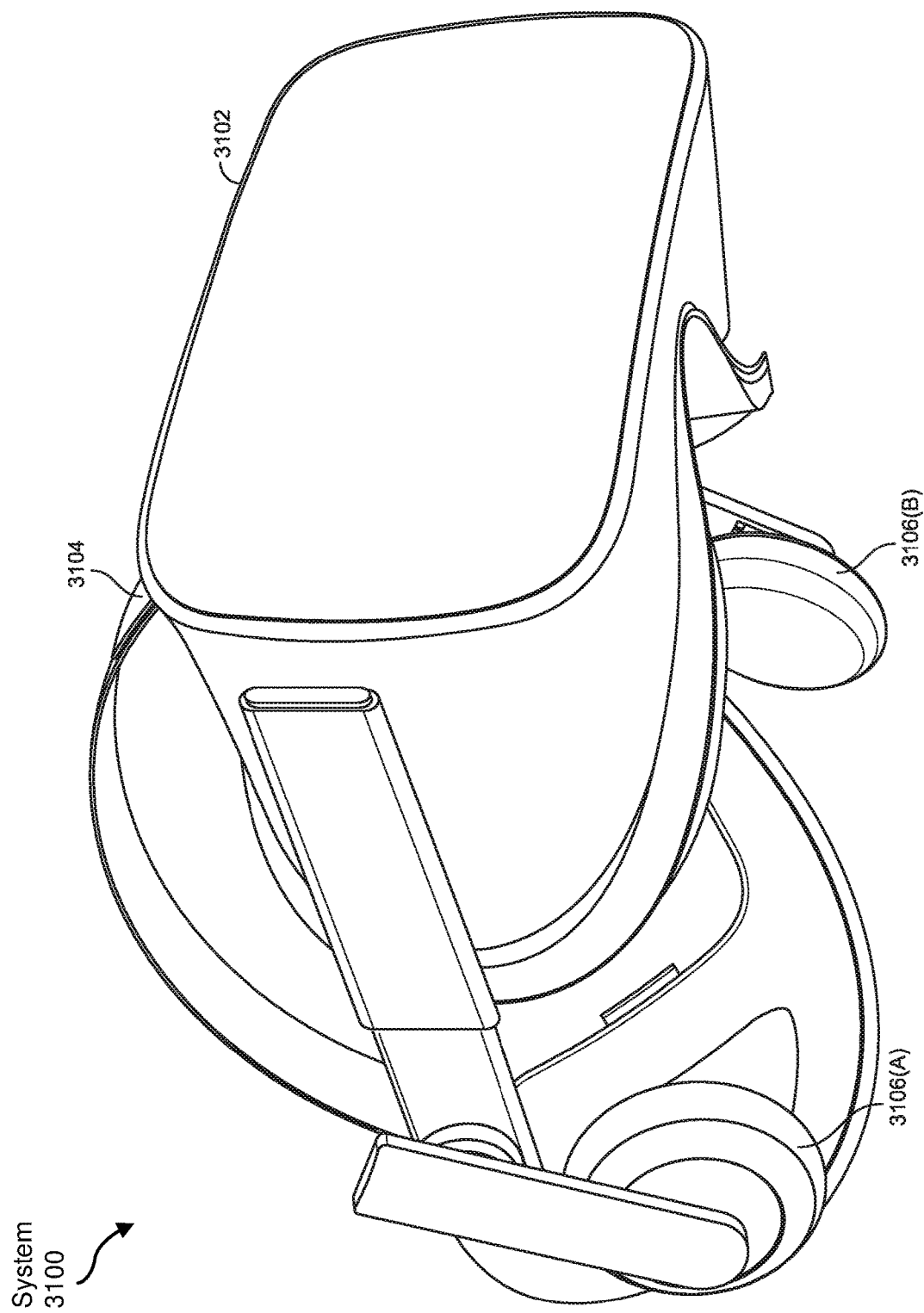
FIG. 31 is an illustration of an exemplary virtual-reality headset that may be used in connection with embodiments of this disclosure.

While not shown in FIGS. 29-31, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 2900, 3000, and 3100 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 32:
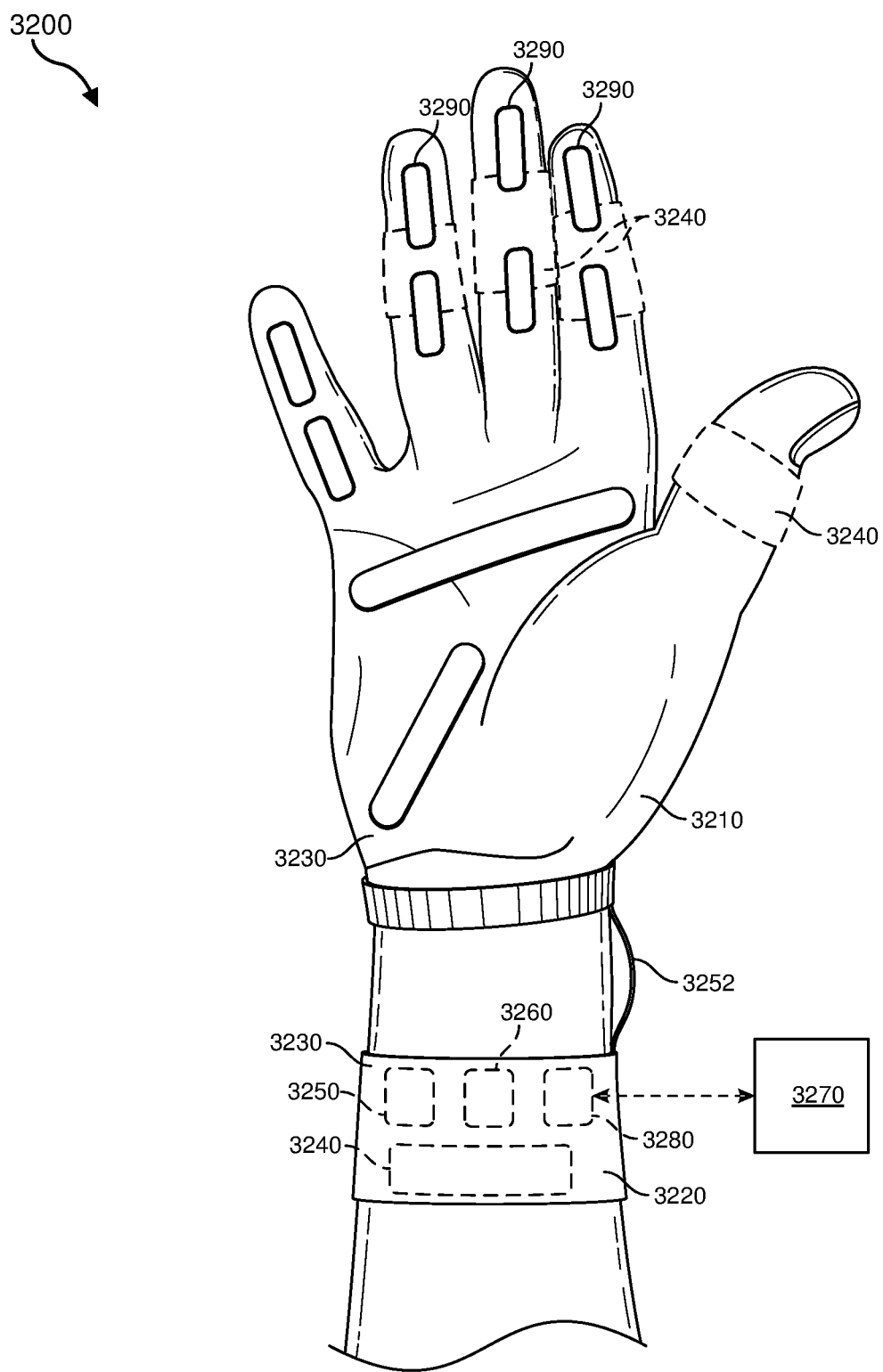
FIG. 32 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 32 illustrates a vibrotactile system 3200 in the form of a wearable glove (haptic device 3210) and wristband (haptic device 3220). Haptic device 3210 and haptic device 3220 are shown as examples of wearable devices that include a flexible, wearable textile material 3230 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 3240 may be positioned at least partially within one or more corresponding pockets formed in textile material 3230 of vibrotactile system 3200. Vibrotactile devices 3240 may be positioned in locations to provide a vibrating sensation (e.g., haptic feedback) to a user of vibrotactile system 3200. For example, vibrotactile devices 3240 may be positioned to be against the user's finger(s), thumb, or wrist, as shown in FIG. 32. Vibrotactile devices 3240 may, in some examples, be sufficiently flexible to conform to or bend with the user's corresponding body part(s).

A power source 3250 (e.g., a battery) for applying a voltage to the vibrotactile devices 3240 for activation thereof may be electrically coupled to vibrotactile devices 3240, such as via conductive wiring 3252. In some examples, each of vibrotactile devices 3240 may be independently electrically coupled to power source 3250 for individual activation. In some embodiments, a processor 3260 may be operatively coupled to power source 3250 and configured (e.g., programmed) to control activation of vibrotactile devices 3240.

Vibrotactile system 3200 may be implemented in a variety of ways. In some examples, vibrotactile system 3200 may be a standalone system with integral subsystems and components for operation independent of other devices and systems. As another example, vibrotactile system 3200 may be configured for interaction with another device or system 3270. For example, vibrotactile system 3200 may, in some examples, include a communications interface 3280 for receiving and/or sending signals to the other device or system 3270. The other device or system 3270 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 3280 may enable communications between vibrotactile system 3200 and the other device or system 3270 via a wireless (e.g., Wi-Fi, Bluetooth, cellular, radio, etc.) link or a wired link. If present, communications interface 3280 may be in communication with processor 3260, such as to provide a signal to processor 3260 to activate or deactivate one or more of the vibrotactile devices 3240.

Vibrotactile system 3200 may optionally include other subsystems and components, such as touch-sensitive pads 3290, pressure sensors, motion sensors, position sensors, lighting elements, and/or user interface elements (e.g., an on/off button, a vibration control element, etc.). During use, vibrotactile devices 3240 may be configured to be activated for a variety of different reasons, such as in response to the user's interaction with user interface elements, a signal from the motion or position sensors, a signal from the touch-sensitive pads 3290, a signal from the pressure sensors, a signal from the other device or system 3270, etc.

Although power source 3250, processor 3260, and communications interface 3280 are illustrated in FIG. 32 as being positioned in haptic device 3220, the present disclosure is not so limited. For example, one or more of power source 3250, processor 3260, or communications interface 3280 may be positioned within haptic device 3210 or within another wearable textile.

Figure 33:
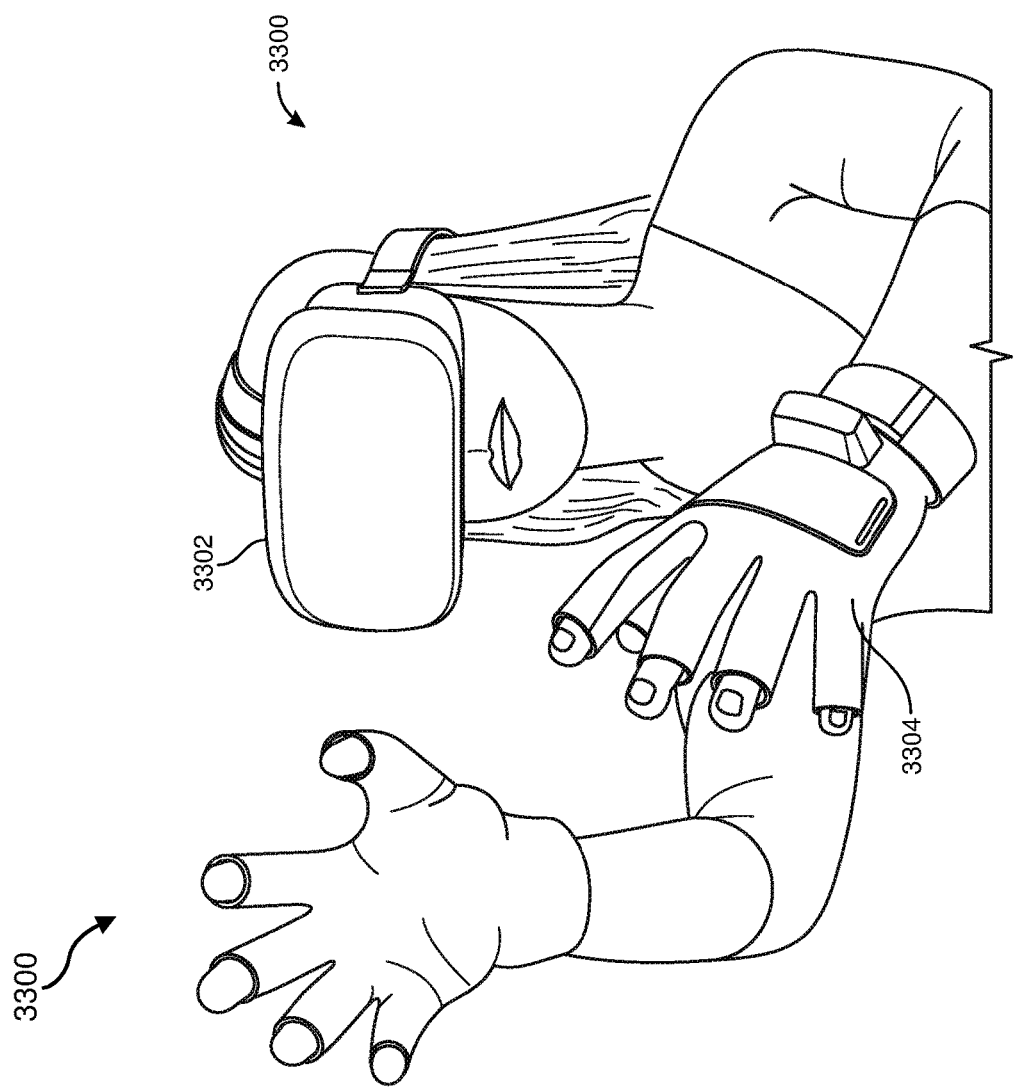
FIG. 33 is an illustration of an exemplary virtual-reality environment according to embodiments of this disclosure.

Haptic wearables, such as those shown in and described in connection with FIG. 32, may be implemented in a variety of types of artificial-reality systems and environments. FIG. 33 shows an example artificial reality environment 3300 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Head-mounted display 3302 generally represents any type or form of virtual-reality system, such as virtual-reality system 3100 in FIG. 31. Haptic device 3304 generally represents any type or form of wearable device, worn by a use of an artificial reality system, that provides haptic feedback to the user to give the user the perception that he or she is physically engaging with a virtual object. In some embodiments, haptic device 3304 may provide haptic feedback by applying vibration, motion, and/or force to the user. For example, haptic device 3304 may limit or augment a user's movement. To give a specific example, haptic device 3304 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 3304 to send action requests to a console. Examples of action requests include, without limitation, requests to start an application and/or end the application and/or requests to perform a particular action within the application.

Figure 34:
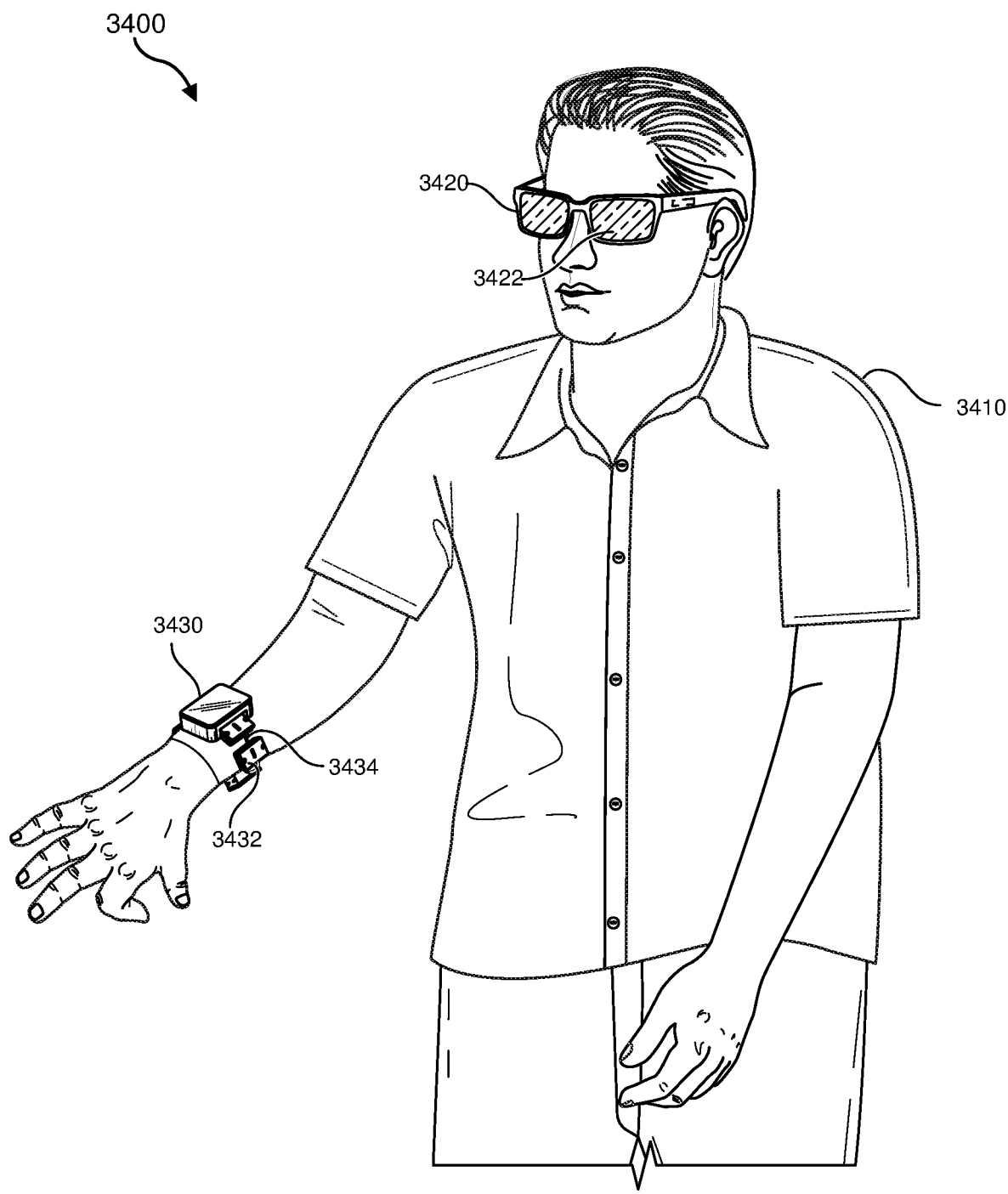
FIG. 34 is an illustration of an exemplary augmented-reality environment according to embodiments of this disclosure.

While haptic interfaces may be used with virtual-reality systems, as shown in FIG. 33, haptic interfaces may also be used with augmented-reality systems, as shown in FIG. 34.

FIG. 34 is a perspective view a user 3410 interacting with an augmented-reality system 3400. In this example, user 3410 may wear a pair of augmented-reality glasses 3420 that have one or more displays 3422 and that are paired with a haptic device 3430. Haptic device 3430 may be a wristband that includes a plurality of band elements 3432 and a tensioning mechanism 3434 that connects band elements 3432 to one another.

One or more of band elements 3432 may include any type or form of actuator suitable for providing haptic feedback. For example, one or more of band elements 3432 may be configured to provide one or more of various types of cutaneous feedback, including vibration, force, traction, texture, and/or temperature. To provide such feedback, band elements 3432 may include one or more of various types of actuators. In one example, each of band elements 3432 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 3210, 3220, 3304, and 3430 may include any suitable number and/or type of haptic transducer, sensor, and/or feedback mechanism. For example, haptic devices 3210, 3220, 3304, and 3430 may include one or more mechanical transducers, piezoelectric transducers, and/or fluidic transducers. Haptic devices 3210, 3220, 3304, and 3430 may also include various combinations of different types and forms of transducers that work together or independently to enhance a user's artificial-reality experience. In one example, each of band elements 3432 of haptic device 3430 may include a vibrotactor (e.g., a vibrotactile actuator) configured to vibrate in unison or independently to provide one or more of various types of haptic sensations to a user.

Embodiments of the instant disclosure may include or be implemented in conjunction with an artificial reality system. Artificial reality is a form of reality that has been adjusted in some manner before presentation to a user, which may include, e.g., a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A fluidic logic-gate device comprising:
    a plurality of inlet ports, a plurality of input ports, and an output port;
    a plurality of fluid channels each configured to route fluid from one of the plurality of inlet ports to the output port;
    a plurality of pistons each comprising:
        a restricting gate transmission element configured to block, when the piston is in a first blocking position, and unblock, when the piston is in a second blocking position, one of the plurality of fluid channels;
        a first controlling gate transmission element configured to interface with a first control pressure that, when applied to the first controlling gate transmission element, forces the piston towards the first blocking position; and
        a second controlling gate transmission element configured to interface with a second control pressure that, when applied to the second controlling gate transmission element, forces the piston towards the second blocking position.

2. The fluidic logic-gate device of claim 1, wherein the plurality of pistons comprises a first piston, a second piston, a third piston, and a fourth piston.

3. The fluidic logic-gate device of claim 2, wherein:
    the plurality of inlet ports comprises a first one or more inlet ports and a second one or more inlet ports;
    the plurality of input ports comprises a first input port and a second input port;
    the plurality of fluid channels comprises:
        a first fluid channel configured to route fluid from the first one or more inlet ports to the output port;
        a second fluid channel configured to route fluid from the first one or more inlet ports to the output port;
        a third fluid channel configured to route fluid from the second one or more inlet ports to the output port;
        a fourth fluid channel configured to route fluid from the second one or more inlet ports to the output port;
    the first piston comprises:
        a first restricting gate transmission element configured to block, when the first piston is in a first position, the first fluid channel;

a second restricting gate transmission element configured to block, when the first piston is in a second position, the third fluid channel;
a first controlling gate transmission element configured to interface with a first pressure, wherein the first pressure places the first piston in the first position; and
a second controlling gate transmission element configured to interface with a second pressure, wherein the second pressure places the first piston in the second position;

the second piston comprises:
a third restricting gate transmission element configured to block, when the second piston is in a third position, the first fluid channel;
a fourth restricting gate transmission element configured to block, when the second piston is in a fourth position, the fourth fluid channel;
a third controlling gate transmission element configured to interface with a third pressure, wherein the third pressure places the second piston in the third position; and
a fourth controlling gate transmission element configured to interface with a fourth pressure, wherein the fourth pressure places the second piston in the fourth position;

the third piston comprises:
a fifth restricting gate transmission element configured to block, when the third piston is in a fifth position, the second fluid channel;
a sixth restricting gate transmission element configured to block, when the third piston is in a sixth position, the fourth fluid channel;
a fifth controlling gate transmission element configured to interface with a fifth pressure, wherein the fifth pressure places the third piston in the fifth position; and
a sixth controlling gate transmission element configured to interface with a sixth pressure, wherein the sixth pressure places the third piston in the sixth position; and the fourth piston comprises:
a seventh restricting gate transmission element configured to block, when the fourth piston is in a seventh position, the second fluid channel;
an eighth restricting gate transmission element configured to block, when the fourth piston is in an eighth position, the third fluid channel;
a seventh controlling gate transmission element configured to interface with a seventh pressure, wherein the seventh pressure places the fourth piston in the seventh position; and
an eighth controlling gate transmission element configured to interface with an eighth pressure, wherein the eighth pressure places the fourth piston in the eighth position.

4. The fluidic logic-gate device of claim 3, wherein:
a surface area of the second controlling gate transmission element is less than a surface area of the first controlling gate transmission element;
a surface area of the third controlling gate transmission element is less than a surface area of the fourth controlling gate transmission element;
a surface area of the fifth controlling gate transmission element is less than a surface area of the sixth controlling gate transmission element; and
a surface area of the eighth controlling gate transmission element is less than a surface area of the seventh controlling gate transmission element.

5. The fluidic logic-gate device of claim 4, wherein:
the fluidic logic-gate device performs a XOR operation on a first input source connected to the first input port and a second input source connected to the second input port;
the first one or more inlet ports are one or more source ports configured to connect to a high-pressure source;
the second one or more inlet ports are one or more drain ports configured to connect to a low-pressure source;
the first input source applies the first pressure to the first controlling gate transmission element and the sixth pressure to the sixth controlling gate transmission element; and
the second input source applies the fourth pressure to the fourth controlling gate transmission element and the seventh pressure to the seventh controlling gate transmission element.

6. The fluidic logic-gate device of claim 5, wherein the high-pressure source applies the second pressure to the second controlling gate transmission element, the third pressure to the third controlling gate transmission element, the fifth pressure to the fifth controlling gate transmission element, and the eighth pressure to the eighth controlling gate transmission element.

7. The fluidic logic-gate device of claim 4, wherein:
the fluidic logic-gate device performs a XNOR operation on a first input source connected to the first input port and a second input source connected to the second input port;
the first one or more inlet ports are one or more drain ports configured to connect to a low-pressure source;
the second one or more inlet ports are one or more source ports configured to connect to a high-pressure source;
the first input source applies the first pressure to the first controlling gate transmission element and the sixth pressure to the sixth controlling gate transmission element; and
the second input source applies the fourth pressure to the fourth controlling gate transmission element and the seventh pressure to the seventh controlling gate transmission element.

8. The fluidic logic-gate device of claim 7, wherein the high-pressure source applies the second pressure to the second controlling gate transmission element, the third pressure to the third controlling gate transmission element, the fifth pressure to the fifth controlling gate transmission element, and the eighth pressure to the eighth controlling gate transmission element.

9. The fluidic logic-gate device of claim 1, wherein:
the plurality of inlet ports comprises a first inlet port and a second inlet port;
the plurality of input ports comprises a first input port and a second input port;
the plurality of fluid channels comprises:
a first fluid channel configured to route fluid from the first inlet port to the output port; and
a second fluid channel configured to route fluid from the second inlet port to the output port;
the plurality of pistons comprises a first piston and a second piston;
the first piston comprises:
a first restricting gate transmission element configured to:

block, when the first piston is in a first blocking position, the first fluid channel; and
unblock, when the first piston is in a second blocking position or a first unblocking position, the first fluid channel;
a second restricting gate transmission element configured to:
block, when the first piston is in the second blocking position, the first fluid channel; and
unblock, when the first piston is in the first blocking position or the first unblocking position, the first fluid channel;
a first controlling gate transmission element configured to interface with a first pressure from the first input port, wherein the first pressure, when applied to the first controlling gate transmission element, forces the first piston towards the first blocking position; and
a second controlling gate transmission element configured to interface with a second pressure from the second input port, wherein the second pressure, when applied to the second controlling gate transmission element, forces the first piston towards the second blocking position; and
the second piston comprises:
a third restricting gate transmission element configured to:
block, when the second piston is in a third blocking position, the second fluid channel; and
unblock, when the second piston is in a fourth blocking position or a second unblocking position, the second fluid channel;
a fourth restricting gate transmission element configured to:
block, when the second piston is in the fourth blocking position, the second fluid channel; and
unblock, when the second piston is in the third blocking position or the second unblocking position, the second fluid channel;
a third controlling gate transmission element configured to interface with a preload pressure, wherein the preload pressure, when applied to the third controlling gate transmission element, forces the second piston towards the third blocking position;
a fourth controlling gate transmission element configured to interface with the first pressure from the first input port, wherein the first pressure, when applied to the fourth controlling gate transmission element, forces the second piston towards the fourth blocking position; and
a fifth controlling gate transmission element configured to interface with the second pressure from the second input port, wherein the second pressure, when applied to the fifth controlling gate transmission element, forces the second piston towards the fourth blocking position.

10. The fluidic logic-gate device of claim 1, wherein:
the plurality of input ports comprises a first input port and a second input port;
the fluidic logic-gate device performs an XOR operation on a first input source connected to the first input port and a second input source connected to the second input port;
the plurality of inlet ports comprises:
a first inlet port configured to connect to a low-pressure source; and
a second inlet port configured to connect to a high-pressure source;
the plurality of fluid channels comprises:
a first fluid channel configured to route fluid from the first inlet port to the output port;
a second fluid channel configured to route fluid from the second inlet port to the output port; and
a third fluid channel configured to route fluid from the second input port to the output port;
the plurality of pistons comprises a first piston and a second piston;
the first piston comprises:
a first restricting gate transmission element configured to:
block, when the first piston is in a first blocking position, the first fluid channel; and
unblock, when the first piston is in a second blocking position, the first fluid channel;
a second restricting gate transmission element configured to:
block, when the first piston is in the second blocking position, the second fluid channel; and
unblock, when the first piston is in the first blocking position, the second fluid channel;
a first controlling gate transmission element configured to interface with a first preload pressure, wherein the first preload pressure forces, when applied to the first controlling gate transmission element, the first piston towards the first blocking position; and
a second controlling gate transmission element configured to interface with a pressure from the second input port, wherein the pressure from the second input port, when applied to the second controlling gate transmission element, forces the first piston towards the second blocking position; and
the second piston comprises:
a third restricting gate transmission element configured to:
block, when the second piston is in a third blocking position, the first and second fluid channels; and
unblock, when the second piston is in a fourth blocking position, the first and second fluid channels;
a fourth restricting gate transmission element configured to:
block, when the second piston is in the fourth blocking position, the third fluid channel; and
unblock, when the second piston is in the third blocking position, the third fluid channel;
a third controlling gate transmission element configured to interface with a second preload pressure, wherein the second preload pressure, when applied to the third controlling gate transmission element, forces the second piston towards the third blocking position; and
a fourth controlling gate transmission element configured to interface with a pressure from the first input port, wherein the pressure from the first input port, when applied to the fourth controlling gate transmission element, forces the second piston towards the fourth blocking position.

11. The fluidic logic-gate device of claim 1, wherein:
the plurality of input ports comprises a first input port and a second input port;
the fluidic logic-gate device performs an XNOR operation on a first input source connected to the first input port and a second input source connected to the second input port;

the plurality of inlet ports comprises:
  a first inlet port configured to connect to a low-pressure source; and
  a second inlet port configured to connect to a high-pressure source;
the plurality of fluid channels comprises:
  a first fluid channel configured to route fluid from the first inlet port to the output port;
  a second fluid channel configured to route fluid from the second inlet port to the output port; and
  a third fluid channel configured to route fluid from the second input port to the output port;
the plurality of pistons comprises a first piston and a second piston;
the first piston comprises:
  a first restricting gate transmission element configured to:
    block, when the first piston is in a first blocking position, the first fluid channel; and
    unblock, when the first piston is in a second blocking position, the first fluid channel;
  a second restricting gate transmission element configured to:
    block, when the first piston is in the second blocking position, the second fluid channel; and
    unblock, when the first piston is in the first blocking position, the second fluid channel;
  a first controlling gate transmission element configured to interface with a first preload pressure, wherein the first preload pressure forces, when applied to the first controlling gate transmission element, the first piston towards the first blocking position; and
  a second controlling gate transmission element configured to interface with a pressure from the second input port, wherein the pressure from the second input port, when applied to the second controlling gate transmission element, forces the first piston towards the second blocking position; and
the second piston comprises:
  a third restricting gate transmission element configured to:
    block, when the second piston is in a third blocking position, the third fluid channel; and
    unblock, when the second piston is in a fourth blocking position, the third fluid channel;
  a fourth restricting gate transmission element configured to:
    block, when the second piston is in the fourth blocking position, the first and second fluid channels; and
    unblock, when the second piston is in the third blocking position, the first and second fluid channels;
  a third controlling gate transmission element configured to interface with a second preload pressure, wherein the second preload pressure, when applied to the third controlling gate transmission element, forces the second piston towards the third blocking position; and
  a fourth controlling gate transmission element configured to interface with a pressure from the first input port, wherein the pressure from the first input port, when applied to the fourth controlling gate transmission element, forces the second piston towards the fourth blocking position.

12. A fluidic logic-gate system comprising:
  a plurality of inlet ports, a first input port and a second input port, and an output port;
  a high-pressure source;
  a low-pressure source;
  a first input source connected to the first input port;
  a second input source connected to the second input port;
  a plurality of fluid channels each configured to route fluid from one of the plurality of inlet ports to the output port;
  two or more pistons each comprising:
    opposing restricting gate transmission elements each configured to block a different one of the plurality of fluid channels;
    a first controlling gate transmission element configured to interface with a first control pressure that, when applied to the first controlling gate transmission element, forces the piston towards a first position; and
    a second controlling gate transmission element configured to interface with a second control pressure that, when applied to the second controlling gate transmission element, forces the piston towards a second position.

13. The fluidic logic-gate system of claim 12, wherein the fluidic logic-gate system performs an XOR operation using two or fewer pistons.

14. The fluidic logic-gate system of claim 12, wherein the fluidic logic-gate system performs an XNOR operation using two or fewer pistons.

15. The fluidic logic-gate system of claim 12, wherein the two or more pistons, the high-pressure source, and the low-pressure source are configured to perform an XNOR operation.

16. The fluidic logic-gate system of claim 12, wherein the two or more pistons, the high-pressure source, and the low-pressure source are configured to perform an XOR operation.

17. A fluidic valve comprising:
  an inlet port, an additional inlet port, a control port, an additional control port, a third control port, and an outlet port;
  a fluid channel configured to convey fluid from the inlet port to the outlet port;
  an additional fluid channel configured to convey fluid from the additional inlet port to the outlet port; and
  a piston comprising:
    a restricting gate transmission element configured to:
      block, when the piston is in a blocking position, the fluid channel; and
      unblock, when the piston is in an additional blocking position or an unblocking position, the fluid channel;
    an additional restricting gate transmission element configured to:
      block, when the piston is in the additional blocking position, the additional fluid channel; and
      unblock, when the piston is in the blocking position or the unblocking position, the additional fluid channel;
    a controlling gate transmission element configured to interface with a control pressure from the control port, wherein the control pressure, when applied to the controlling gate transmission element, forces the piston towards the blocking position;
    an additional controlling gate transmission element configured to interface with an additional control pressure from the additional control port, wherein the additional control pressure, when applied to the additional controlling gate transmission element, forces the piston towards the additional blocking position; and a third controlling gate transmission element configured to interface with a third control pressure from the third control port, wherein the third control pressure, when applied to the third controlling gate transmission element, forces the piston towards the additional blocking position.

18. The fluidic valve of claim 17, wherein the controlling gate transmission element, the additional controlling gate transmission element, and the third controlling gate transmission element have substantially equal surface areas.

19. The fluidic valve of claim 17, further comprising a flexible membrane separating the restricting gate transmission element from the fluid channel, the flexible membrane being configured to provide a restoring force to the piston that forces the piston towards the unblocking position.

20. The fluidic valve of claim 17, further comprising at least one positioning element configured to provide a restoring force to the piston that forces the piston towards the unblocking position.

* * * * *

UNITED STATES PATENT AND TRADEMARK OFFICE
CERTIFICATE OF CORRECTION

| | | |
|---|---|---|
| PATENT NO. | : 11,143,218 B1 | Page 1 of 1 |
| APPLICATION NO. | : 16/408412 | |
| DATED | : October 12, 2021 | |
| INVENTOR(S) | : Glick et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 111 days.

Signed and Sealed this
Eighteenth Day of February, 2025

Coke Morgan Stewart
*Acting Director of the United States Patent and Trademark Office*